(12) United States Patent
Ho et al.

(10) Patent No.: US 11,905,164 B2
(45) Date of Patent: Feb. 20, 2024

(54) MICRO-ELECTRO-MECHANICAL SYSTEM ACOUSTIC SENSOR, MICRO-ELECTRO-MECHANICAL SYSTEM PACKAGE STRUCTURE AND METHOD FOR MANUFACTURING THE SAME

(71) Applicant: UPBEAT TECHNOLOGY Co., Ltd, New Taipei (TW)

(72) Inventors: Hsien-Lung Ho, New Taipei (TW); Da-Ming Chiang, New Taipei (TW); Chung-Chieh Chen, New Taipei (TW)

(73) Assignee: UPBEAT TECHNOLOGY CO., LTD, New Taipei (TW)

( * ) Notice: Subject to any disclaimer, the term of this patent is extended or adjusted under 35 U.S.C. 154(b) by 416 days.

(21) Appl. No.: 17/468,423

(22) Filed: Sep. 7, 2021

(65) Prior Publication Data

US 2022/0073342 A1      Mar. 10, 2022

Related U.S. Application Data

(60) Provisional application No. 63/075,339, filed on Sep. 8, 2020.

(30) Foreign Application Priority Data

May 10, 2021   (TW) .................................. 110116773

(51) Int. Cl.
*B81B 3/00*      (2006.01)

(52) U.S. Cl.
CPC .... *B81B 3/0021* (2013.01); *B81B 2201/0264* (2013.01); *B81B 2203/0118* (2013.01); *B81B 2203/0127* (2013.01)

(58) Field of Classification Search
CPC .......... B81B 3/0021; B81B 2203/0118; B81B 2203/0127

See application file for complete search history.

(56) References Cited

U.S. PATENT DOCUMENTS 9,661,411 B1    5/2017  Han et al.

FOREIGN PATENT DOCUMENTS

CN          110546965 A        12/2019

OTHER PUBLICATIONS

Communication corresponding to Taiwan Application No. 110116773 and issued by the Taiwan Intellectual Property Office dated Nov. 11, 2021, 6 pages.

*Primary Examiner* — Samuel A Gebremariam
(74) *Attorney, Agent, or Firm* — Innovation Counsel LLP

(57) ABSTRACT

A micro-electro-mechanical system acoustic sensor, a micro-electro-mechanical system package structure and a method for manufacturing the same are provided. The micro-electro-mechanical system acoustic sensor comprises a substrate, a cantilever structure and a diaphragm sensor. The cantilever structure is formed on the substrate, and comprises a fixed end and a free cantilever portion extended from the fixed end. The free cantilever portion comprises a free end. The free end and the fixed end are respectively at opposing sides of the free cantilever portion. The free cantilever portion is capable of generating a vibration wave in an empty space. The diaphragm sensor is formed on the substrate, and comprises a diaphragm film, a back plate, and at least one electrical contact point. The back plate and the diaphragm film have a first empty gap there between. The empty space and the first empty gap communicate to each other.

20 Claims, 87 Drawing Sheets

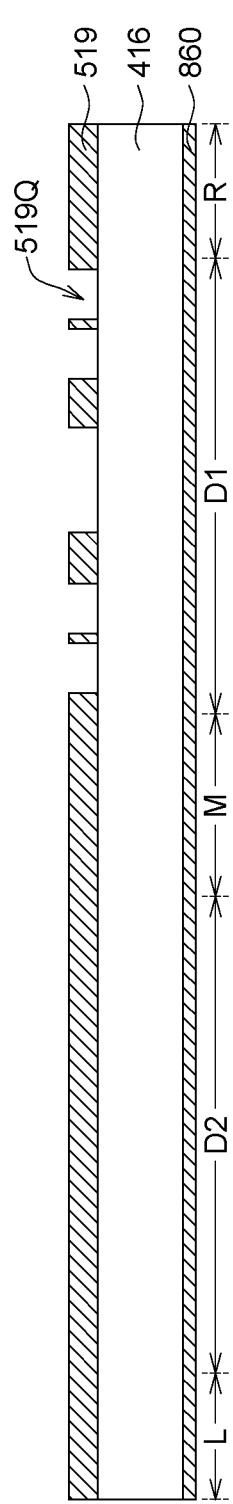
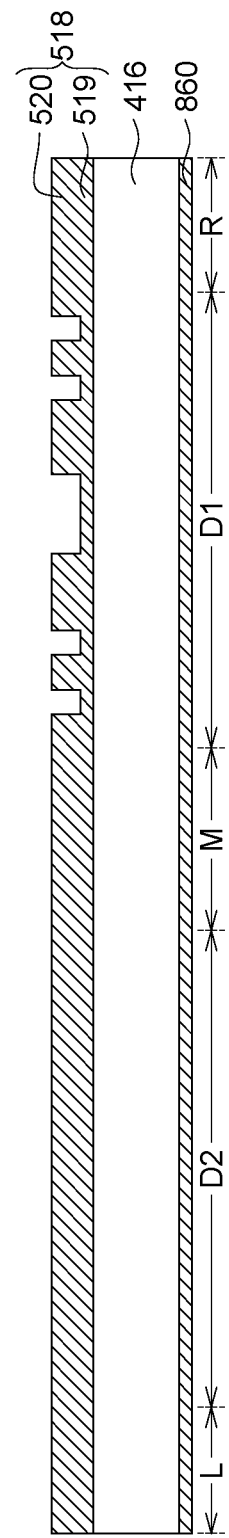
FIG. 22A
FIG. 22B

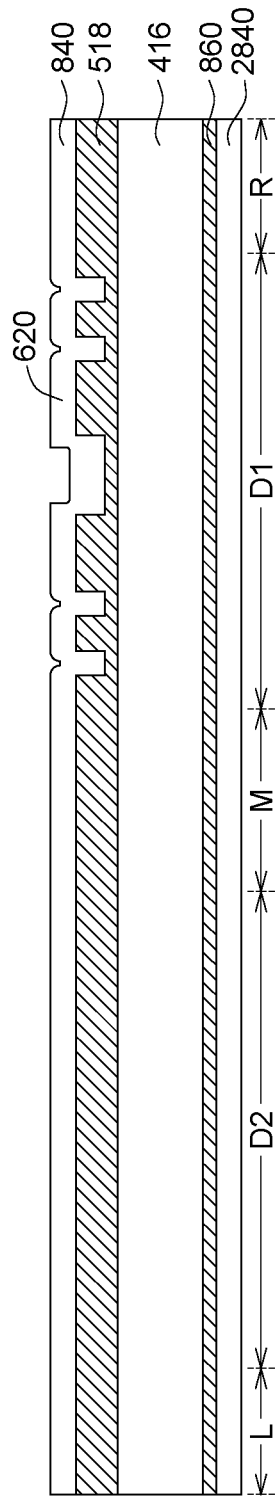
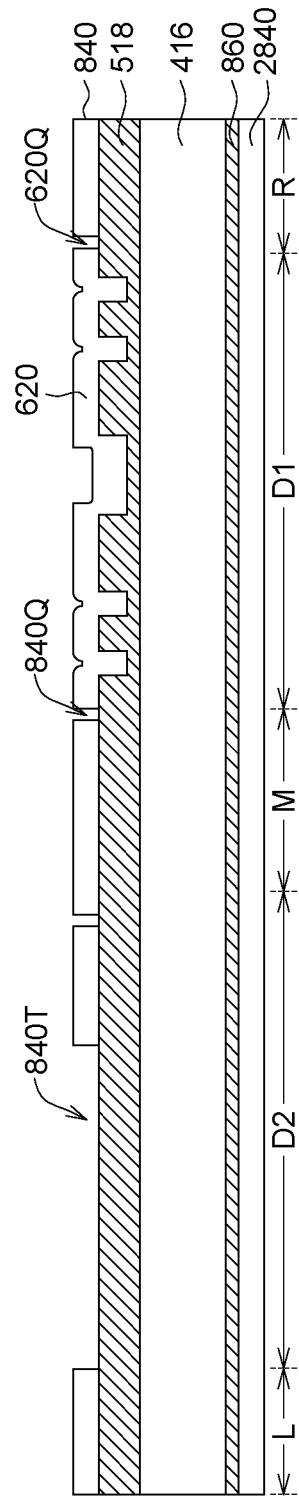
FIG. 22C
FIG. 22D

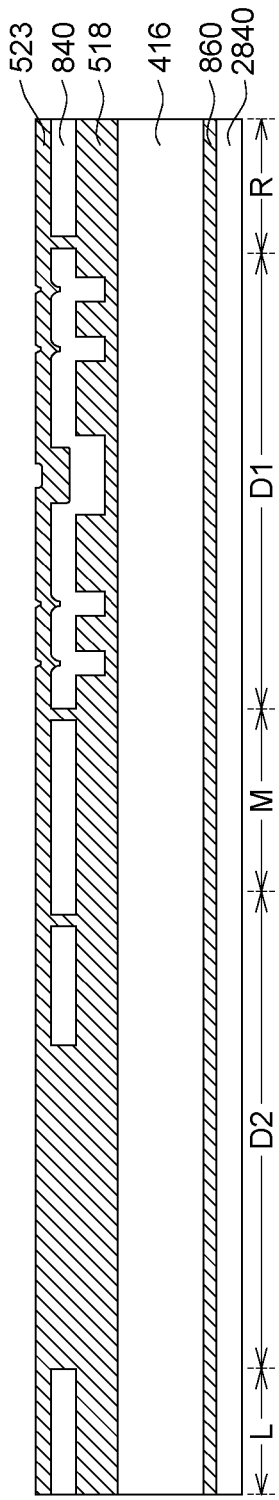
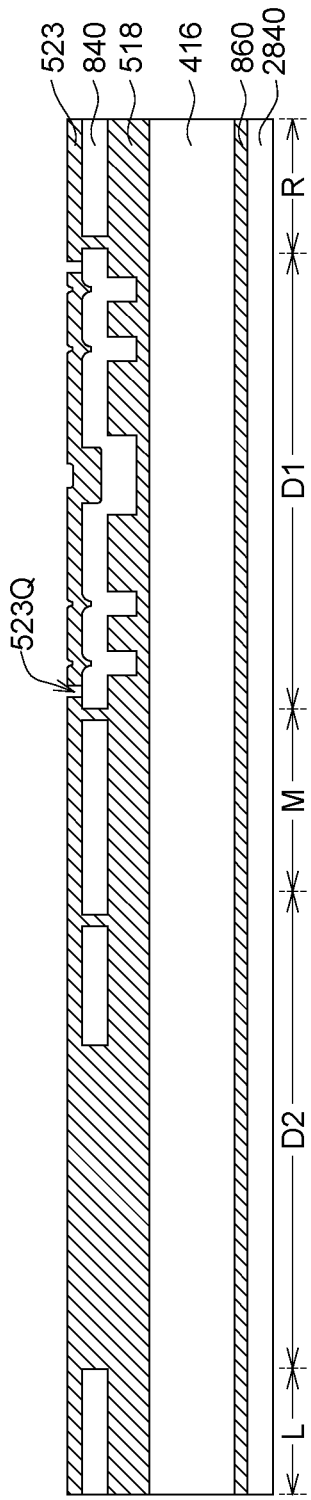
FIG. 22E
FIG. 22F

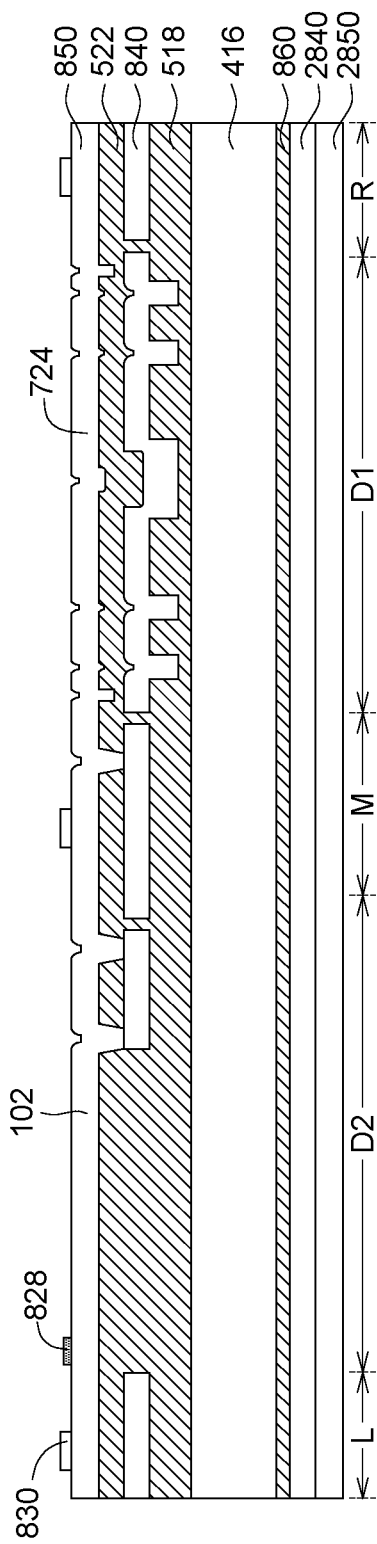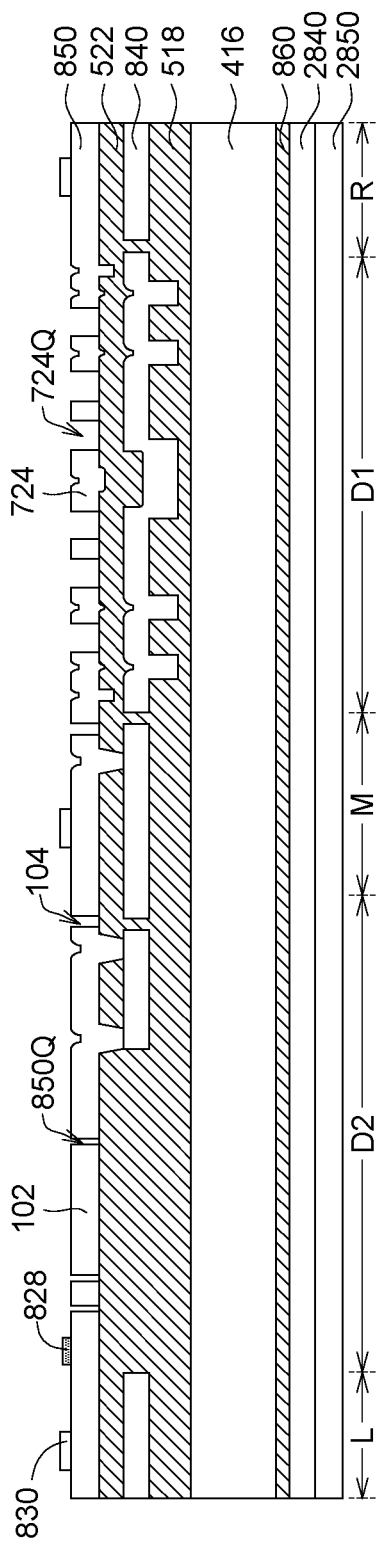
FIG. 22I
FIG. 22J

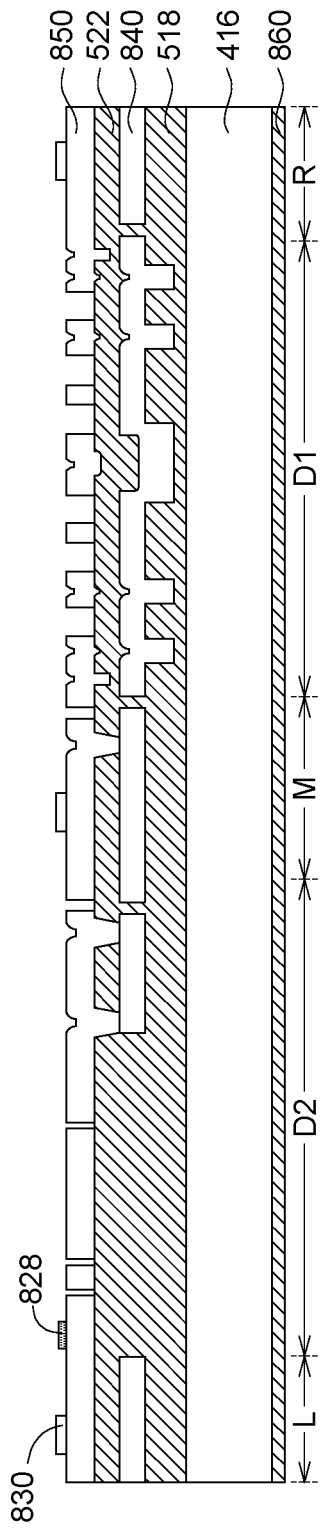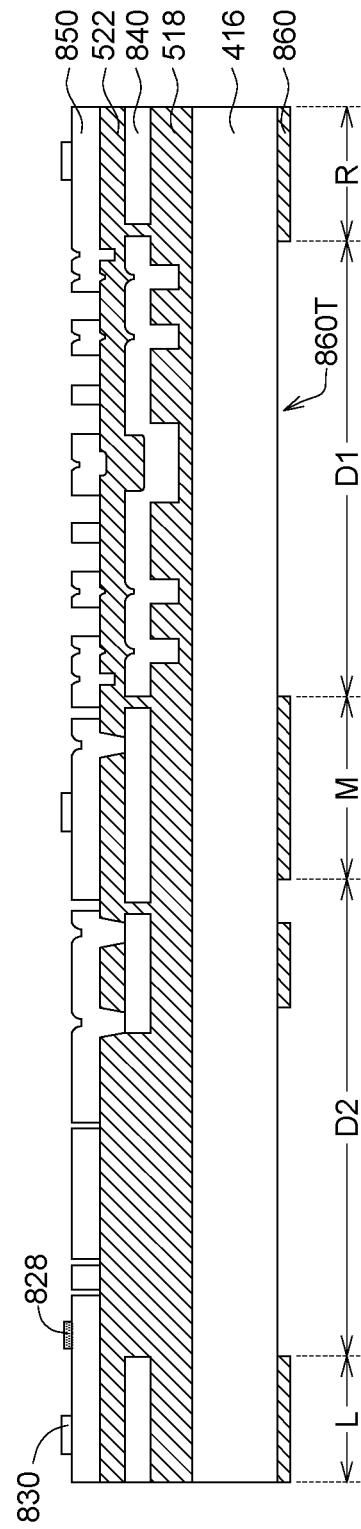

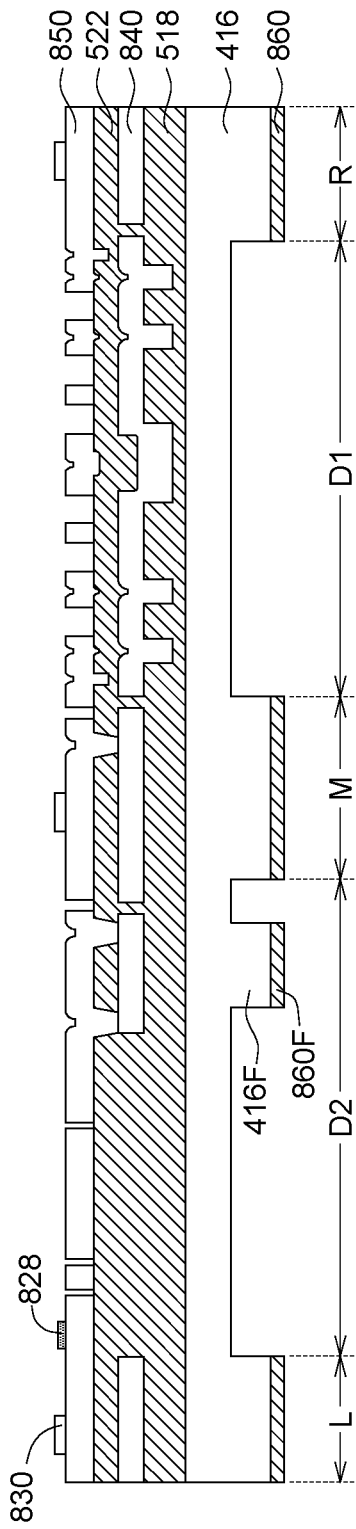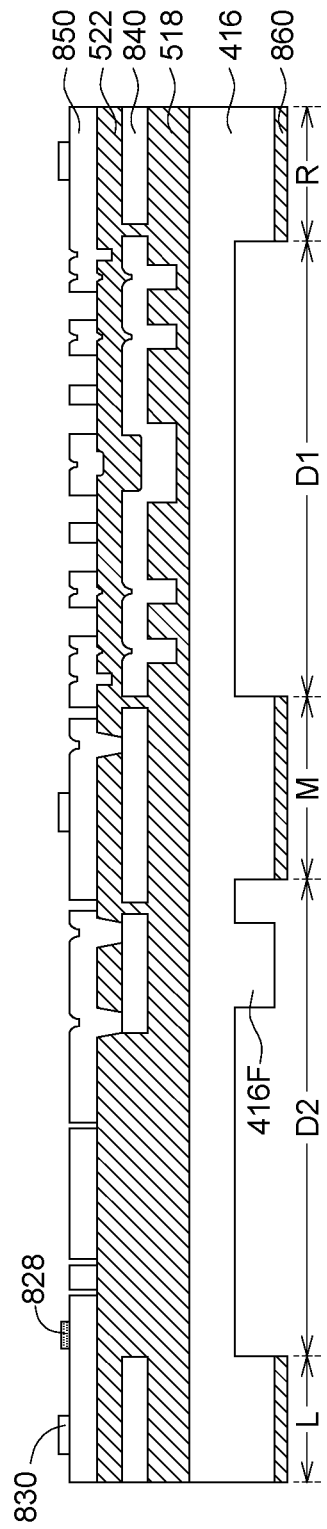

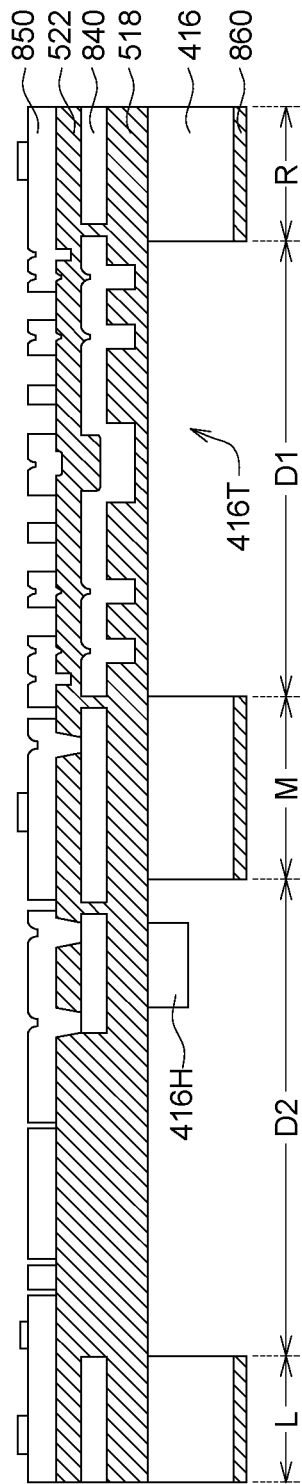
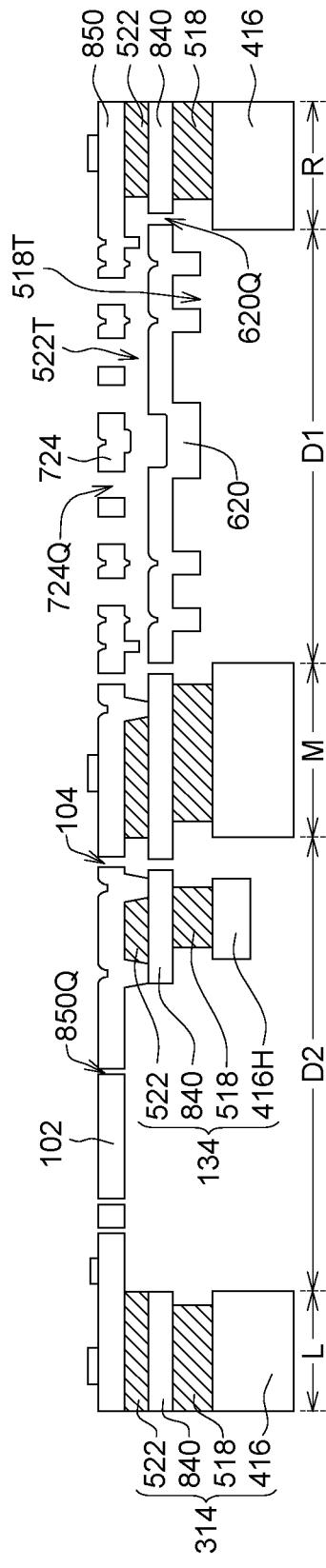
FIG. 22O
FIG. 22P

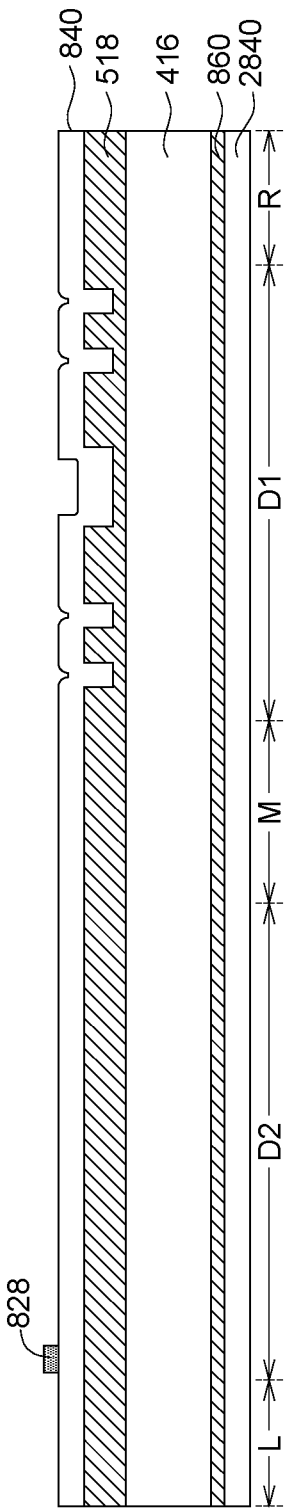
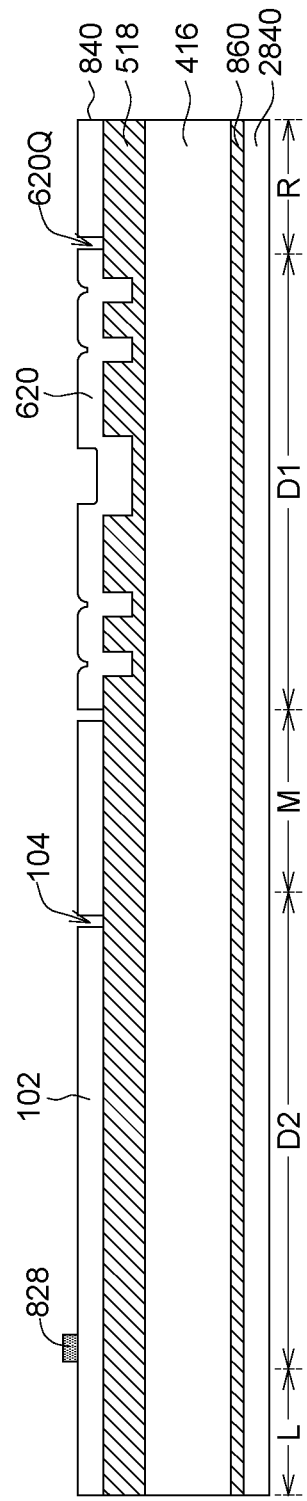
FIG. 25A
FIG. 25B

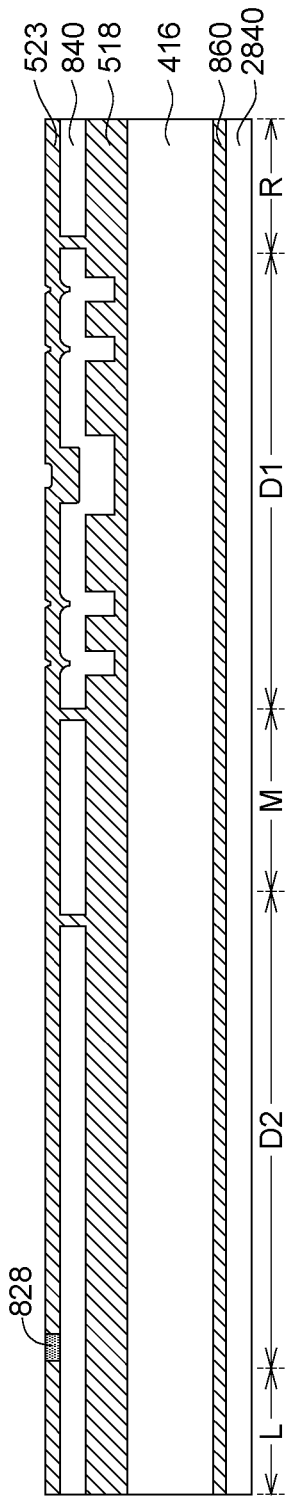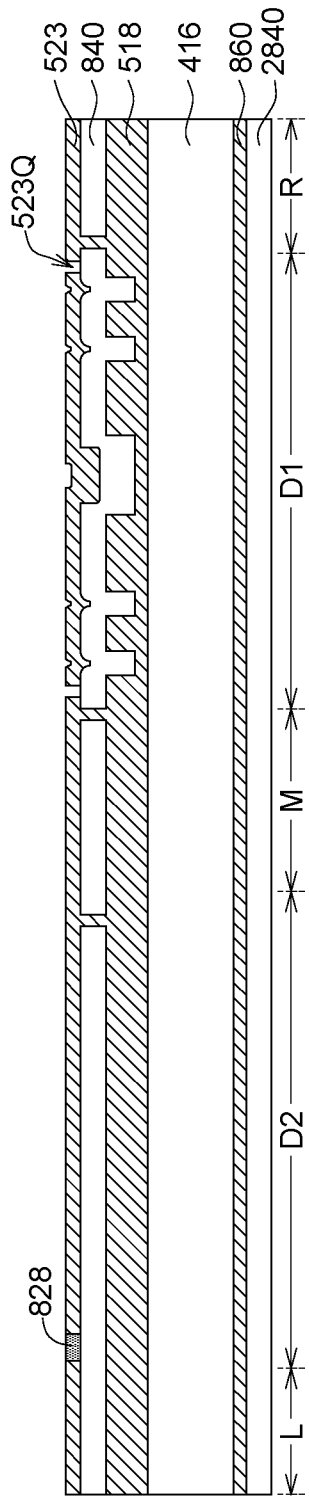

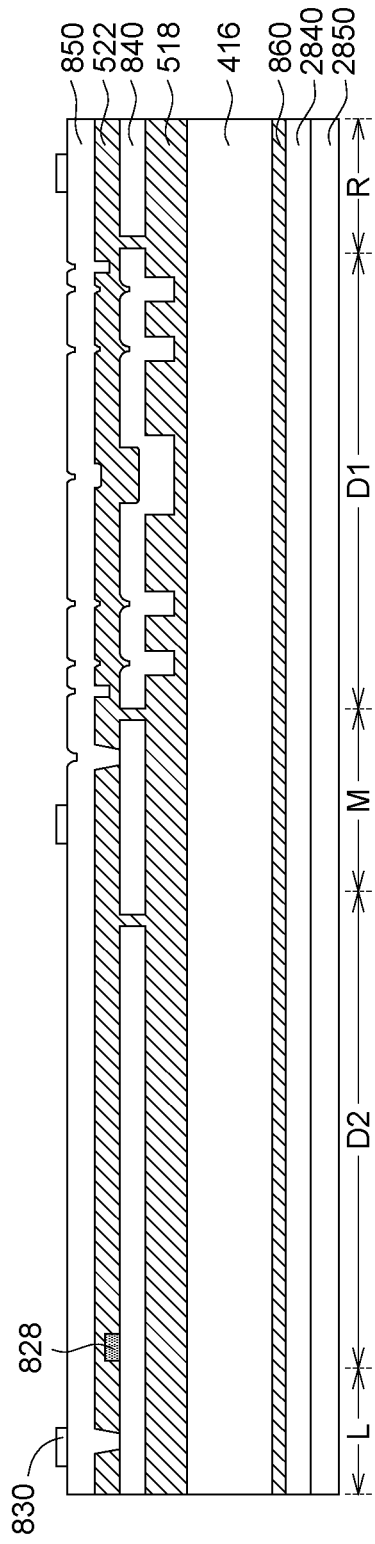
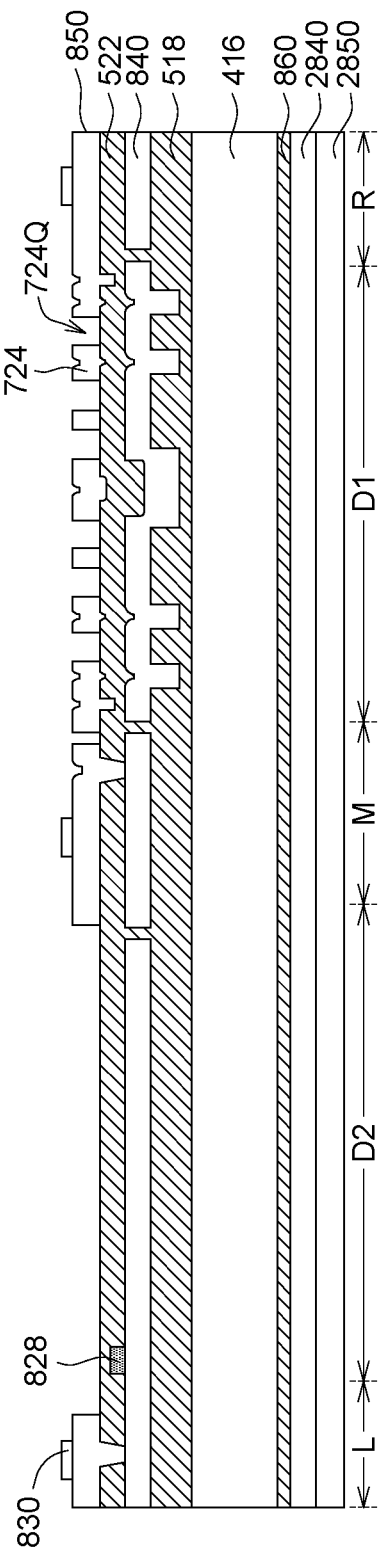

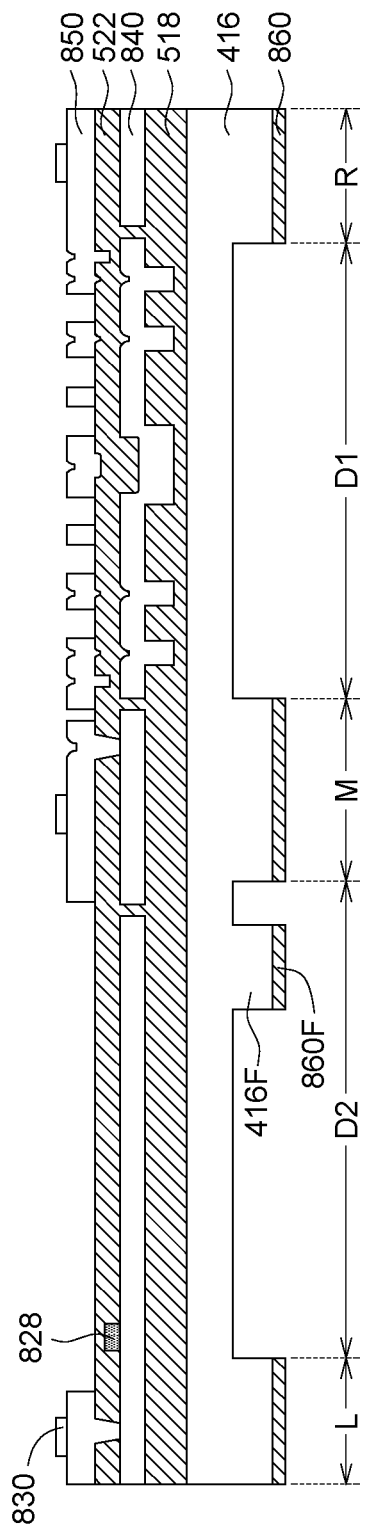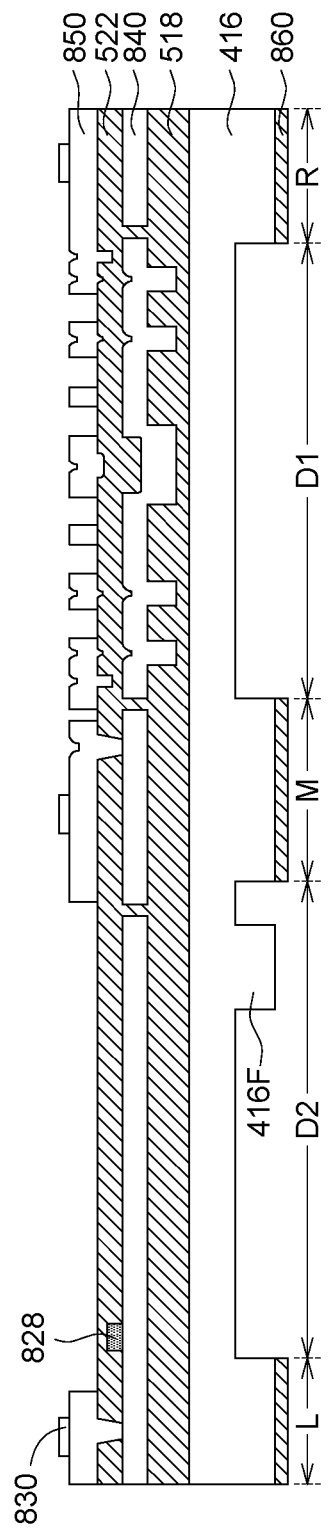

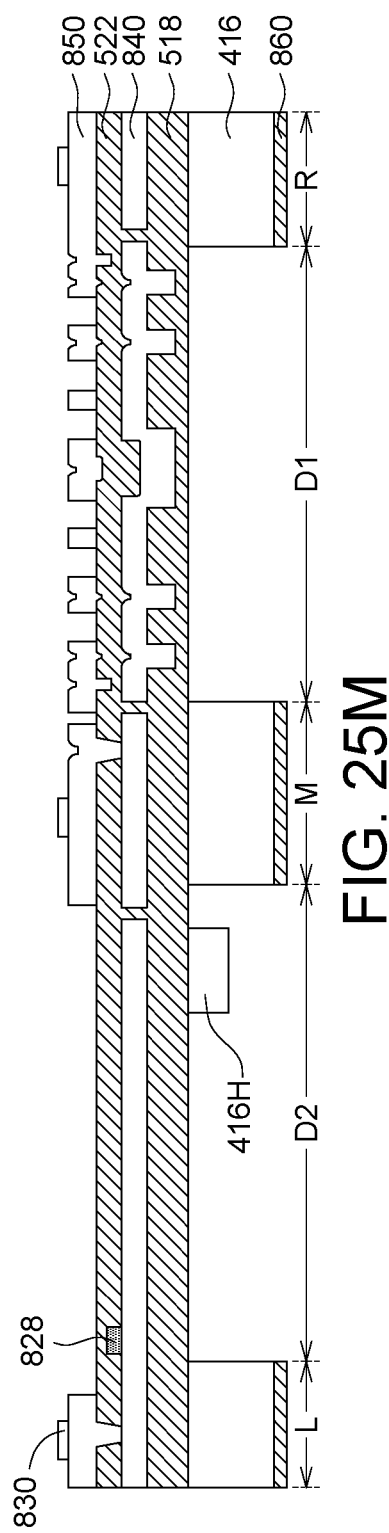
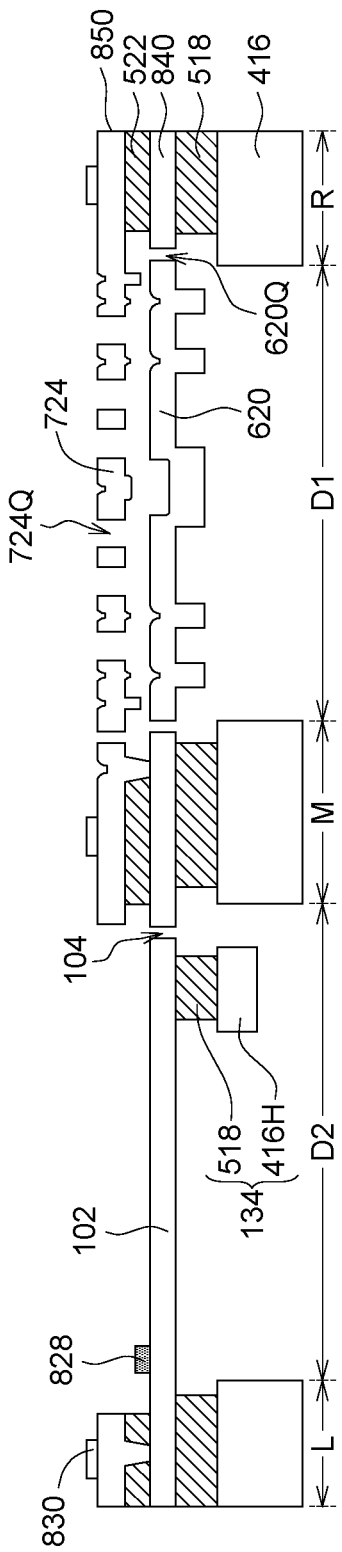
FIG. 25M
FIG. 25N

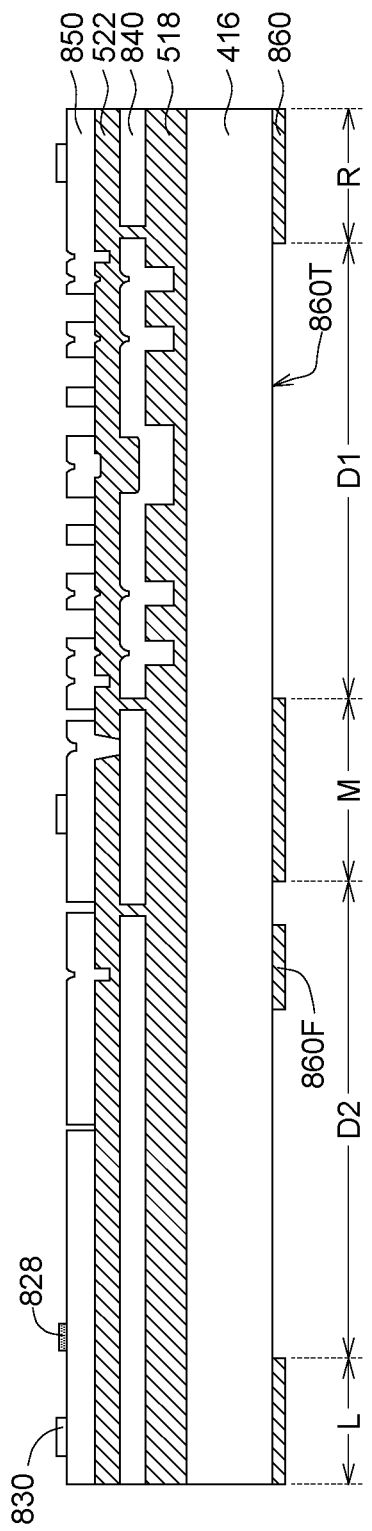
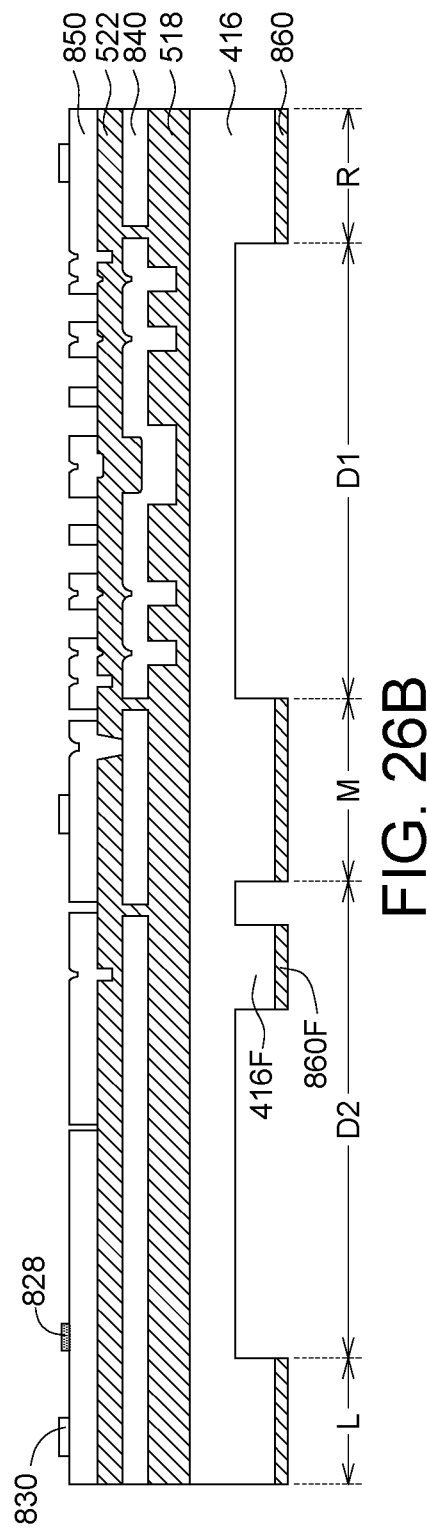
FIG. 26A
FIG. 26B

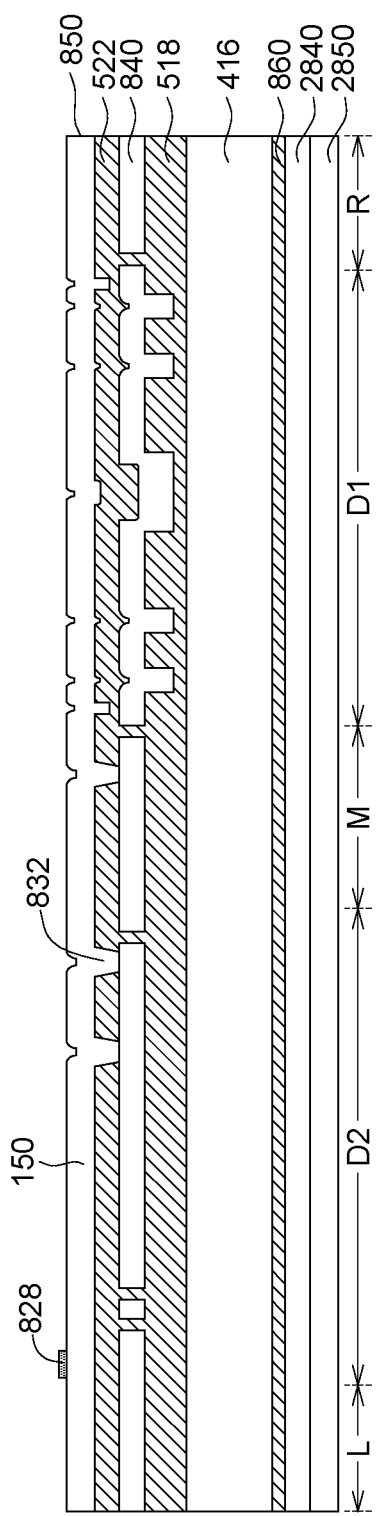
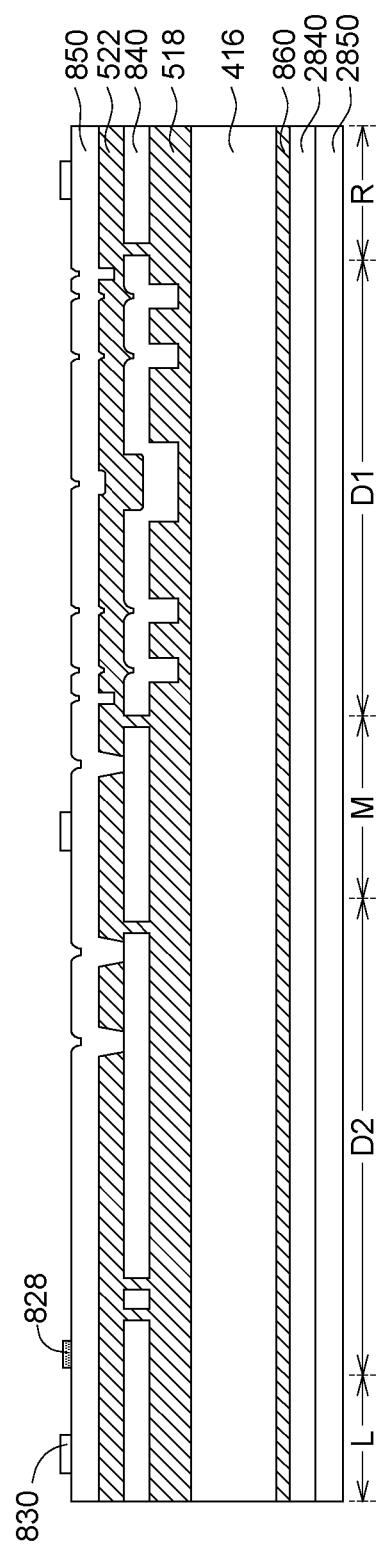
FIG. 27E
FIG. 27F

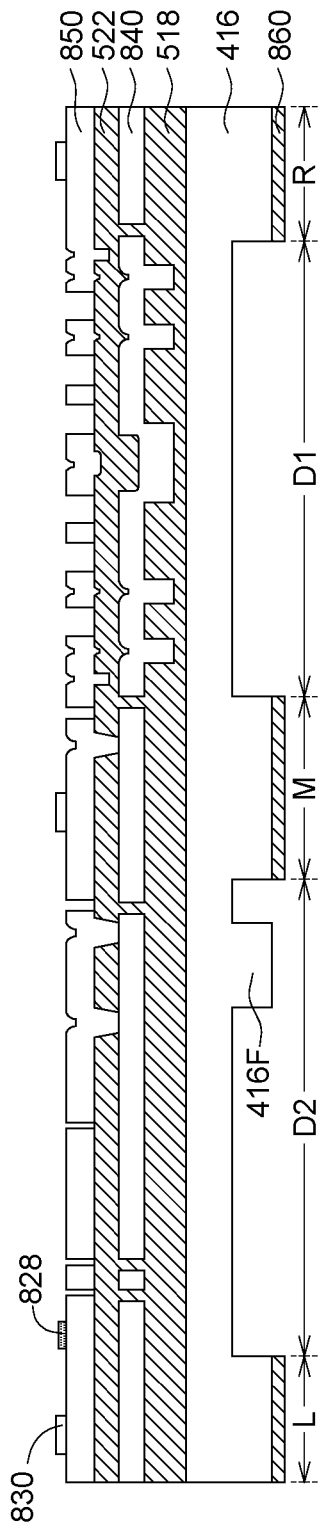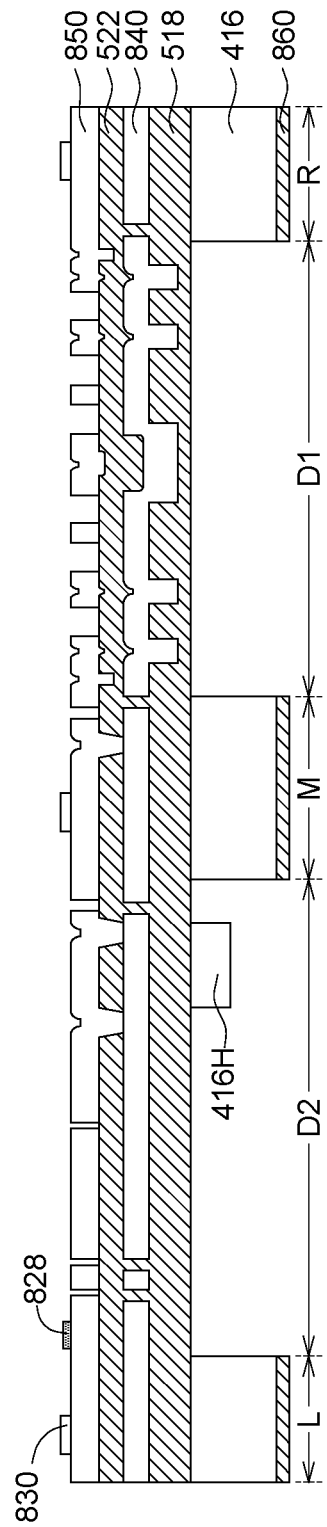

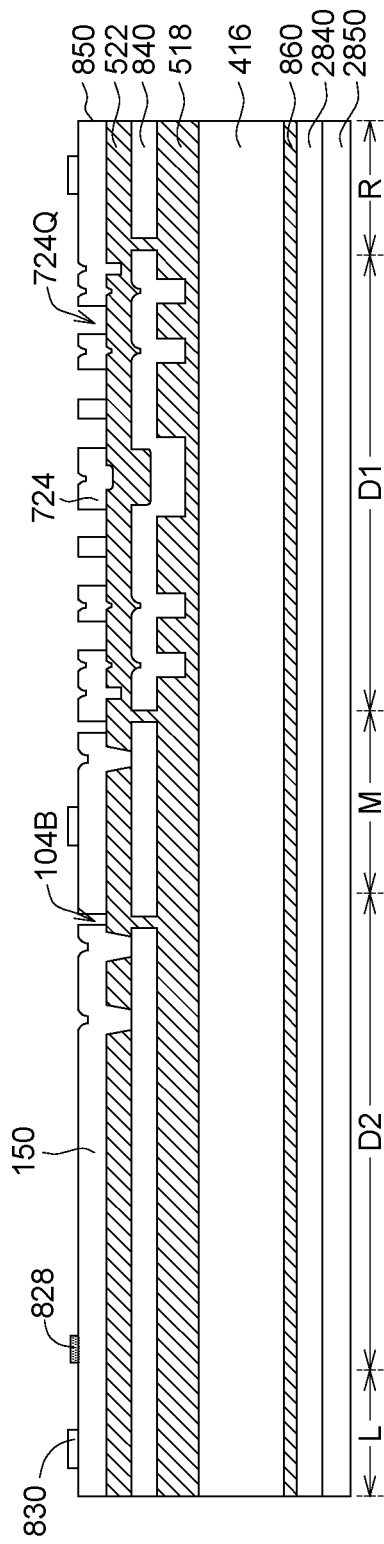
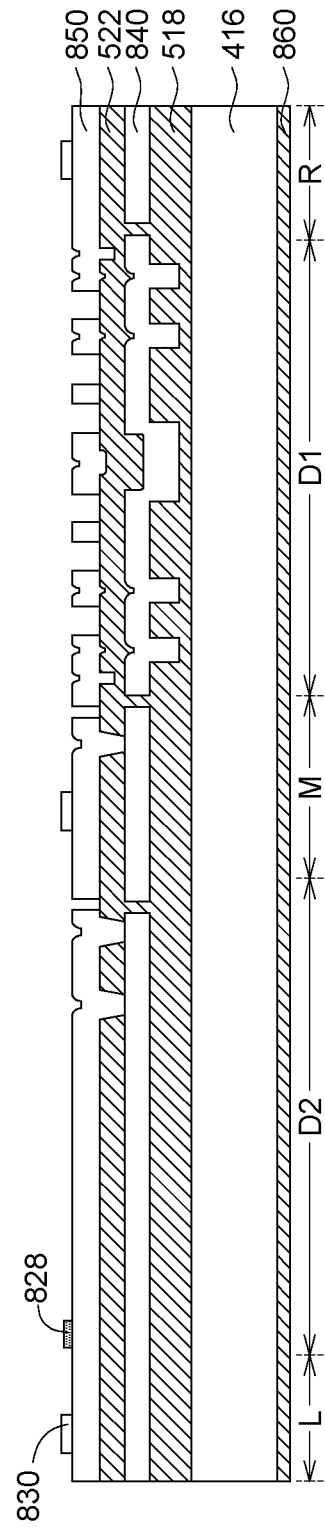
FIG. 28E
FIG. 28F

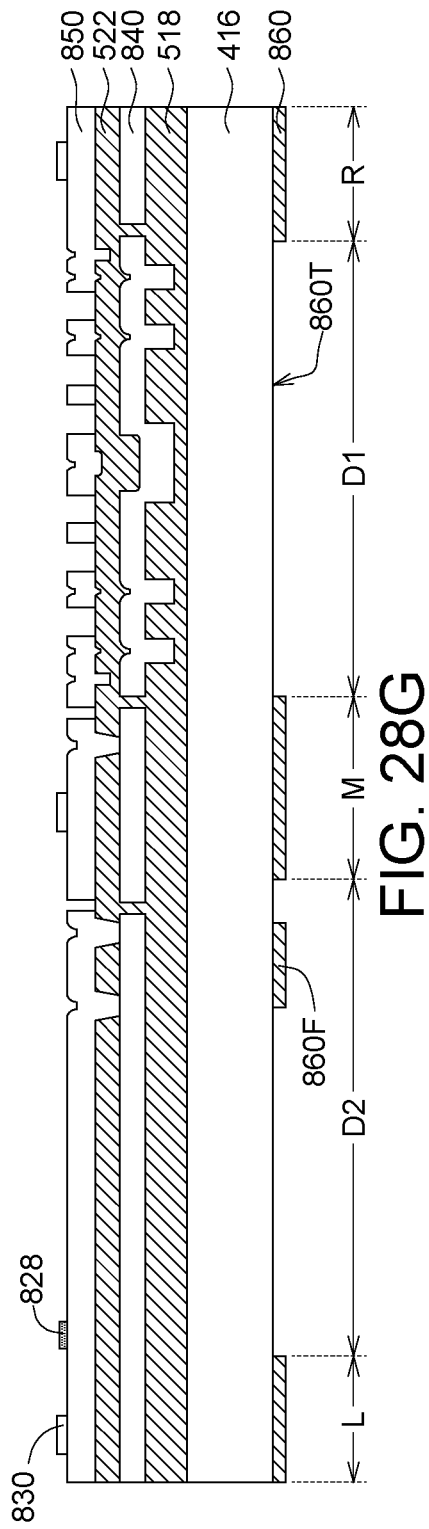
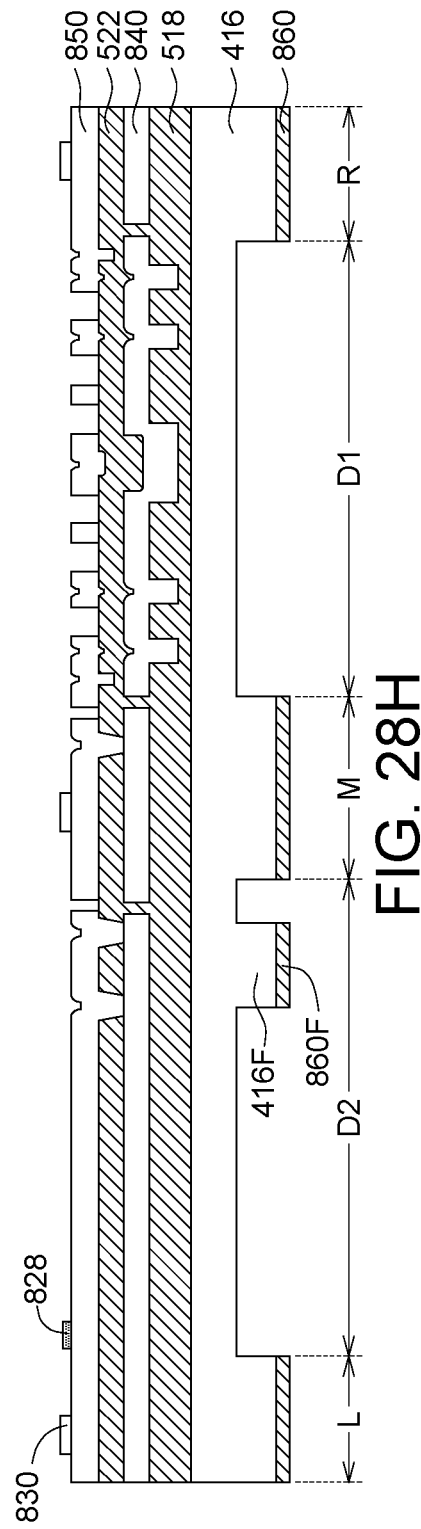
FIG. 28G
FIG. 28H

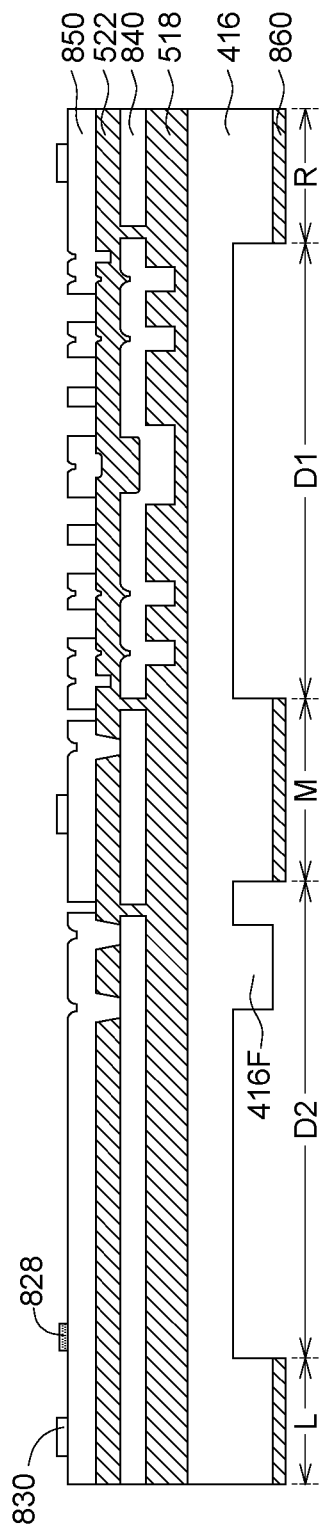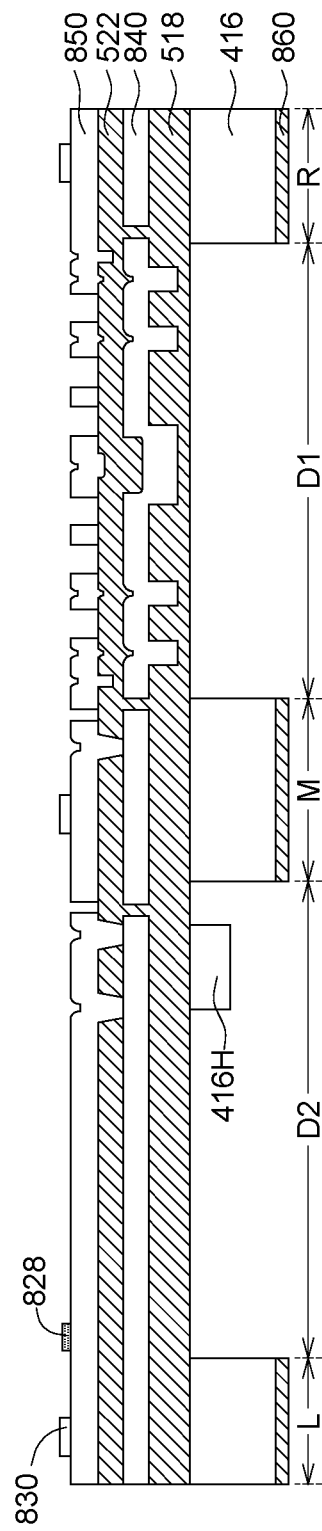

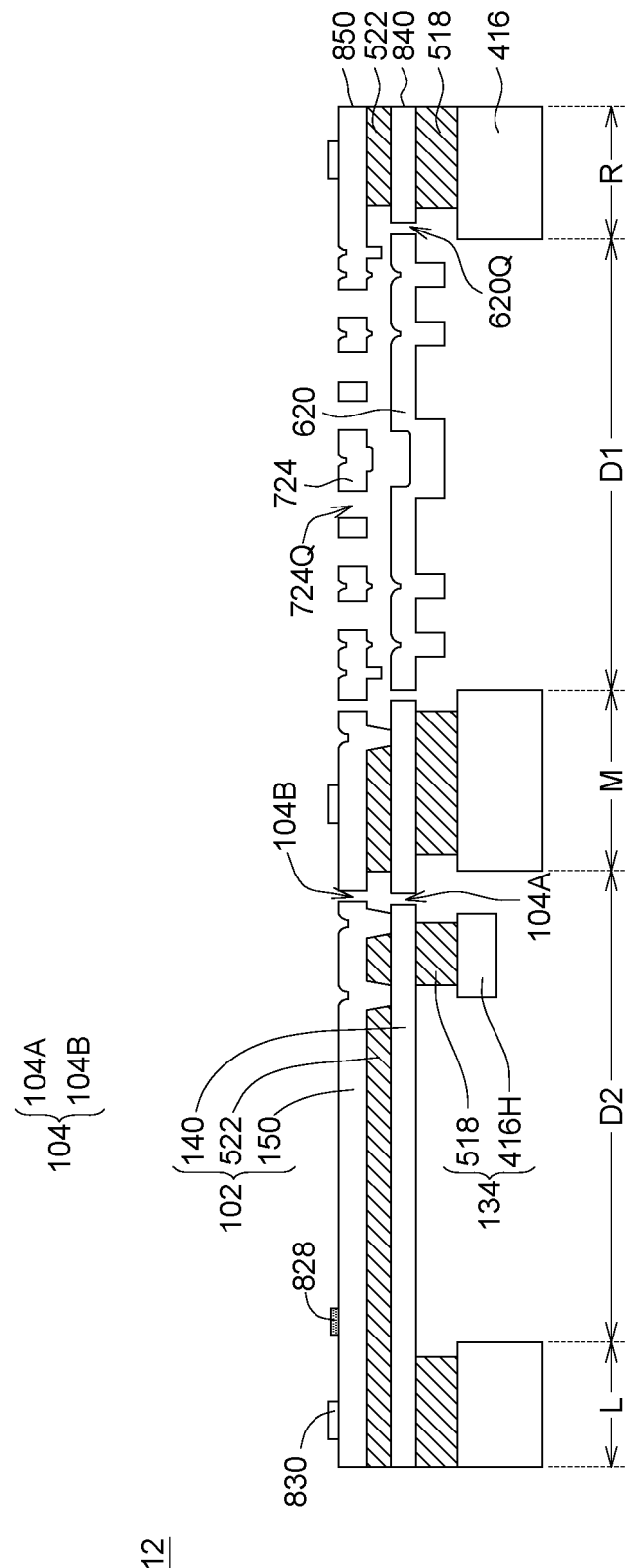

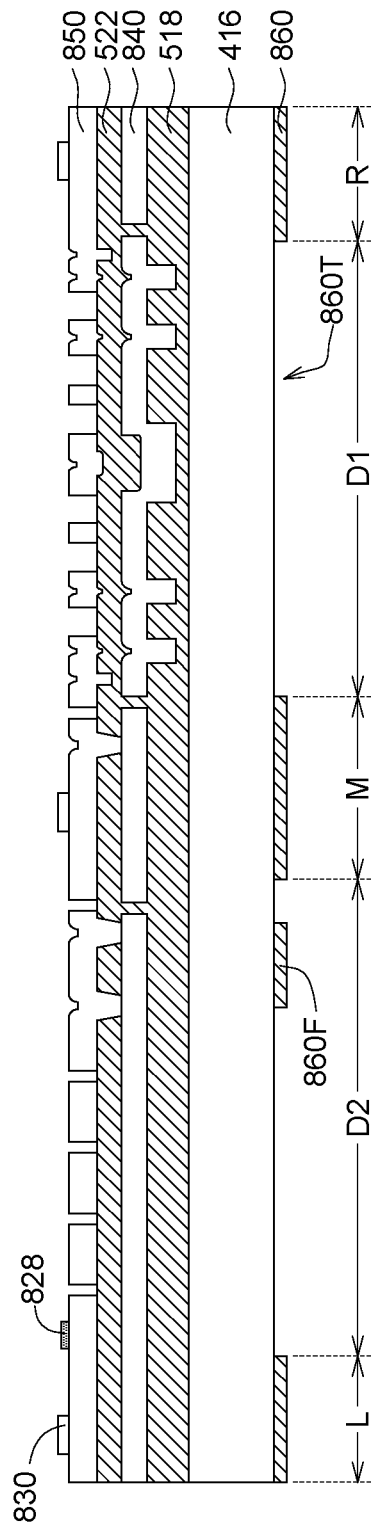
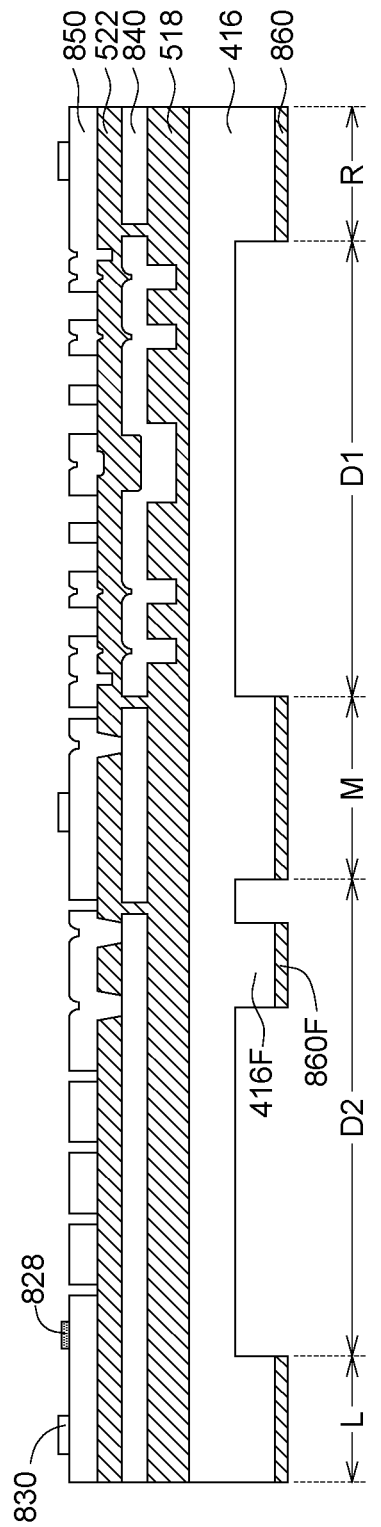
FIG. 29C
FIG. 29D

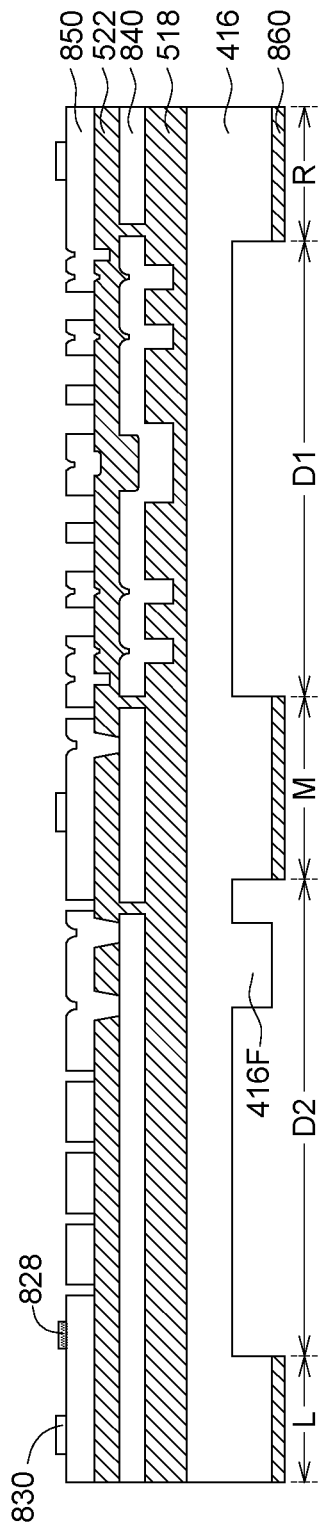
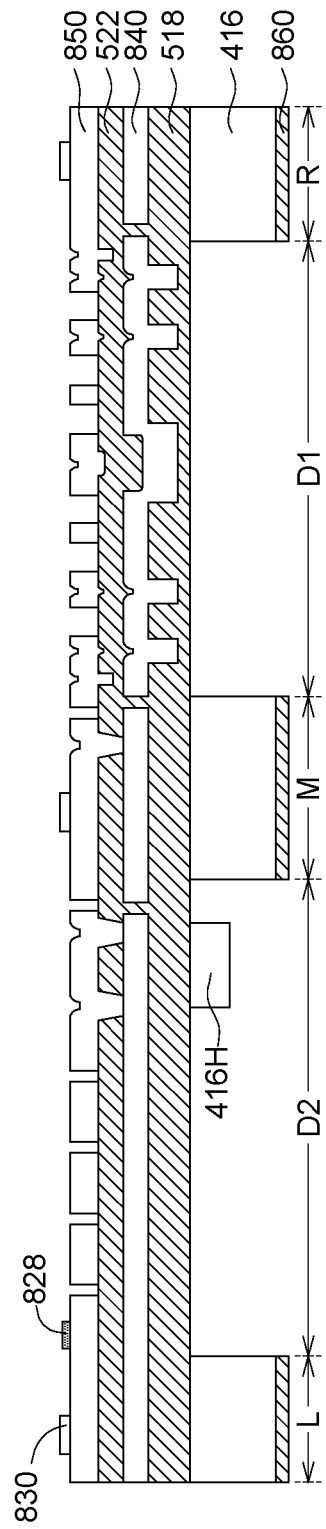

MICRO-ELECTRO-MECHANICAL SYSTEM ACOUSTIC SENSOR, MICRO-ELECTRO-MECHANICAL SYSTEM PACKAGE STRUCTURE AND METHOD FOR MANUFACTURING THE SAME

This application claims the benefit of U.S. provisional application Ser. No. 63/075,339, filed Sep. 8, 2020, and Taiwan application Ser. No. 110116773, filed May 10, 2021, the subject matters of which are incorporated herein by references.

BACKGROUND

Technical Field

The present disclosure relates to a micro-electro-mechanical system acoustic sensor, a micro-electro-mechanical system package structure, and a manufacturing method for which.

Description of the Related Art

Voice communication systems and speech recognition systems typically use acoustic microphones to pickup a user's speech via the sound waves produced by the user talking. An in-the-ear microphone system of the current technology still simultaneously uses both a bone and tissue vibration sensing transducer (to respond to bone-conducted lower speech frequency voice sounds) and a band limited acoustical microphone (to detect the weaker airborne higher speech frequency sounds) within the ear canal. The vibration sensing transducer can be an accelerometer, which can be mounted firmly to the inside wall of the housing of an earphone by an appropriate cement or glue, or by a friction fit.

SUMMARY

The present disclosure provides a micro-electro-mechanical system acoustic sensor, a micro-electro-mechanical system package structure and a manufacturing method for the same.

According to a concept of the present disclosure, a micro-electro-mechanical system acoustic sensor is provided. The micro-electro-mechanical system acoustic sensor comprises a substrate, a cantilever structure, and a diaphragm sensor. The cantilever structure is formed on the substrate. The cantilever structure comprises a fixed end and a free cantilever portion extended from the fixed end. The free cantilever portion comprises a free end. The free end and the fixed end are at opposing sides of the free cantilever portion. The free cantilever portion is capable of generating a vibration wave in an empty space. The diaphragm sensor is formed on the substrate. The diaphragm sensor comprises a diaphragm film, a back plate and at least one electrical contact point. The back plate and the diaphragm film have a first empty gap therebetween. The empty space and the first empty gap are communicated to each other. The diaphragm film is adapted to receive the vibration wave generated by the free cantilever portion. The at least one electrical contact point is electrically connected to the back plate.

According to another concept of the present disclosure, a micro-electro-mechanical system package structure is provided. The micro-electro-mechanical system package structure comprises a carrier plate, an acoustic sensor control chip, and the micro-electro-mechanical system acoustic sensor described above. The carrier plate comprises first electrical contact points and second electrical contact points electrically connected to the first electrical contact points. The acoustic sensor control chip is electrically connected to the first electrical contact points. The micro-electro-mechanical system acoustic sensor is disposed on the carrier plate. The micro-electro-mechanical system acoustic sensor is electrically connected to the acoustic sensor control chip.

According to yet another concept of the present disclosure, A cantilever structure is formed on a substrate. The cantilever structure comprises a fixed end and a free cantilever portion extended from the fixed end. The free cantilever portion comprises a free end. The free end and the fixed end are at opposing sides of the free cantilever portion. The free cantilever portion is capable of generating a vibration wave in an empty space. A diaphragm sensor is formed on the substrate. The diaphragm sensor comprises a diaphragm film, a back plate, and at least one electrical contact point. The back plate and the diaphragm film have a first empty gap therebetween. The empty space and the first empty gap are communicated to each other. The diaphragm film is adapted to receive the vibration wave generated by the free cantilever portion. The at least one electrical contact point is electrically connected to the back plate.

The above and other embodiments of the disclosure will become better understood with regard to the following detailed description of the non-limiting embodiment(s). The following description is made with reference to the accompanying drawings.

BRIEF DESCRIPTION OF THE DRAWINGS

FIG. 18Y-1 illustrates a micro-electro-mechanical system acoustic sensor according to another embodiment.

FIG. 18Y-2 illustrates a micro-electro-mechanical system acoustic sensor according to yet another embodiment.

FIG. 18Y-3 illustrates a cross-section view of a micro-electro-mechanical system package structure according to an embodiment.

FIG. 21T-1 illustrates a micro-electro-mechanical system acoustic sensor according to another embodiment.

FIG. 21T-2 illustrates a cross-section view of a micro-electro-mechanical system package structure according to an embodiment.

FIG. 22P-1 illustrates a micro-electro-mechanical system acoustic sensor according to another embodiment.

FIG. 22P-2 illustrates a cross-section view of a micro-electro-mechanical system package structure according to an embodiment.

FIG. 26A to FIG. 26E illustrate a manufacturing process flow for a micro-electro-mechanical system acoustic sensor according to an embodiment.

FIG. 27A to FIG. 27M illustrate a manufacturing process flow for a micro-electro-mechanical system acoustic sensor according to an embodiment.

FIG. 28A to FIG. 28K illustrate a manufacturing process flow for a micro-electro-mechanical system acoustic sensor according to an embodiment.

FIG. 29A to FIG. 29G illustrate a manufacturing process flow for a micro-electro-mechanical system acoustic sensor according to an embodiment.

DETAILED DESCRIPTION

Figure 1:
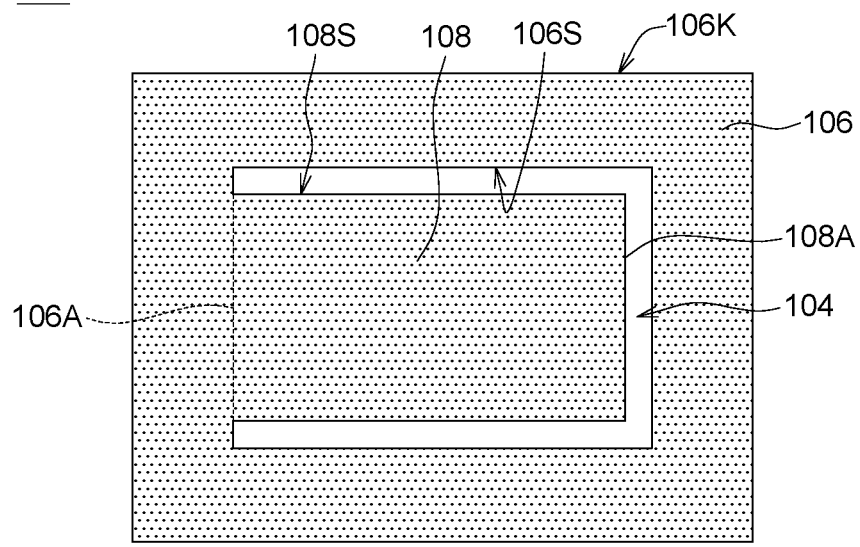
FIG. 1 illustrates a top view of a cantilever structure according to an embodiment is illustrated.

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

Referring to FIG. 1, a top view of a cantilever structure 102 according to an embodiment is illustrated.

The cantilever structure 102 has a slit 104 by which a fixed portion 106 and a free cantilever portion 108 connected with each other can be defined. The fixed portion 106 surrounds the free cantilever portion 108. The free cantilever portion 108 is extended from a fixed end 106A. The free cantilever portion 108 (or vibratile portion) comprises a free end 108A. The free end 108A and the fixed end 106A are at opposing sides of the free cantilever portion 108. The slit 104 exposes an outer sidewall surface 108S of the free cantilever portion 108, and exposes an inner sidewall surface 106S of the fixed portion 106. In this embodiment, the slit 104 has a ⊓ shape. The outer sidewall surface 108S of the free cantilever portion 108 has a ⊓ shape. The inner sidewall surface 106S of the fixed portion 106 has a ⊓ shape. An outer sidewall surface 106K of the fixed portion 106 has a rectangular shape. However, the present disclosure is not limited thereto. In other embodiments, the outer sidewall surface 106K of the fixed portion 106 may have closed ring shape, such as an elliptical shape or a circular shape, or other shapes. The fixed portion 106 may be referred to as anchor.

Figure 2:
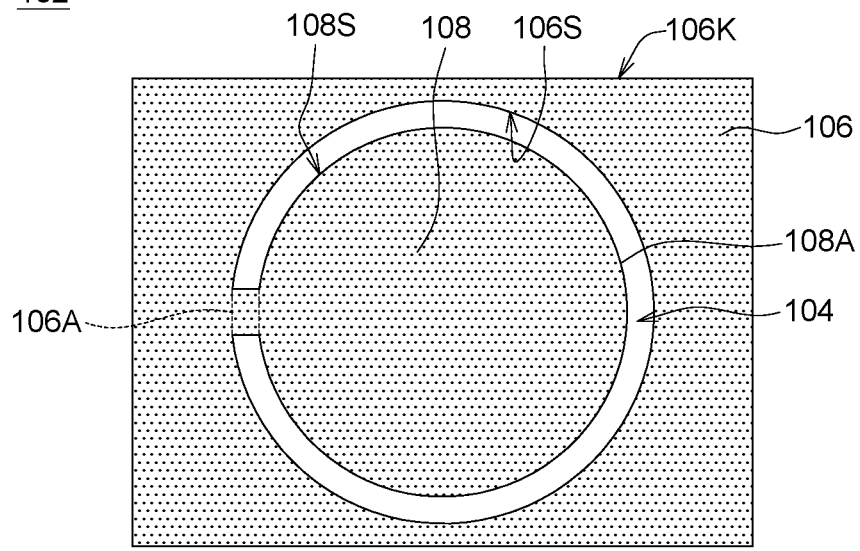
FIG. 2 illustrates a top view of a cantilever structure according to an embodiment is illustrated.

FIG. 2 illustrates a top view of a cantilever structure 102 according to an embodiment, which is different from the cantilever structure 102 shown in FIG. 1 with the following description. In this embodiment, the slit 104 has an arc shape. The outer sidewall surface 108S of the free cantilever portion 108 has an arc shape. The inner sidewall surface 106S of the fixed portion 106 has an arc shape.

Figure 3:
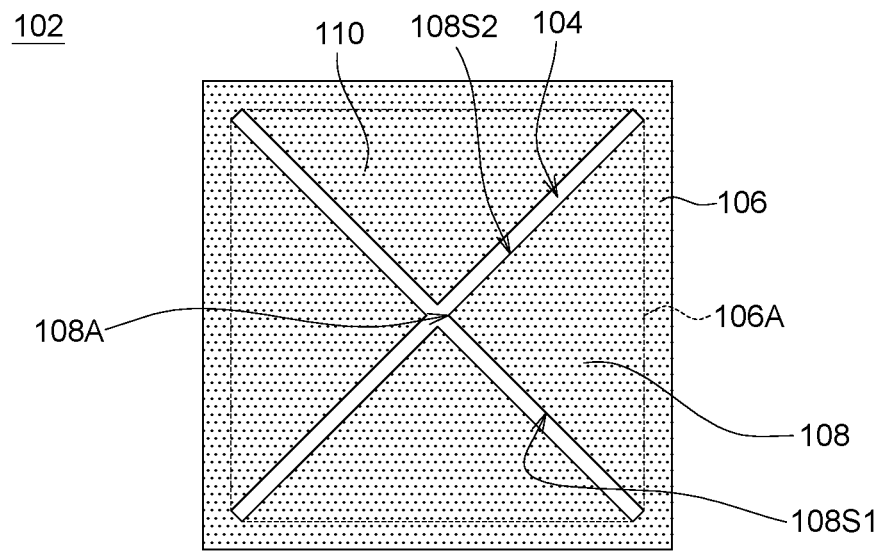
FIG. 3 illustrates a top view of a cantilever structure according to an embodiment is illustrated.

FIG. 3 illustrates a top view of a cantilever structure 102 according to an embodiment, which is different from the cantilever structure 102 shown in FIG. 1 with the following description. In this embodiment, the slit 104 has a cross shape, and therefore the four free cantilever portions 108 are defined. Each of the four free cantilever portions 108 has the outer sidewall surface 108S1 and the outer sidewall surface 108S2, both adjacent to each other. The fixed end 106A has a profile of four straight lines.

Figure 4:
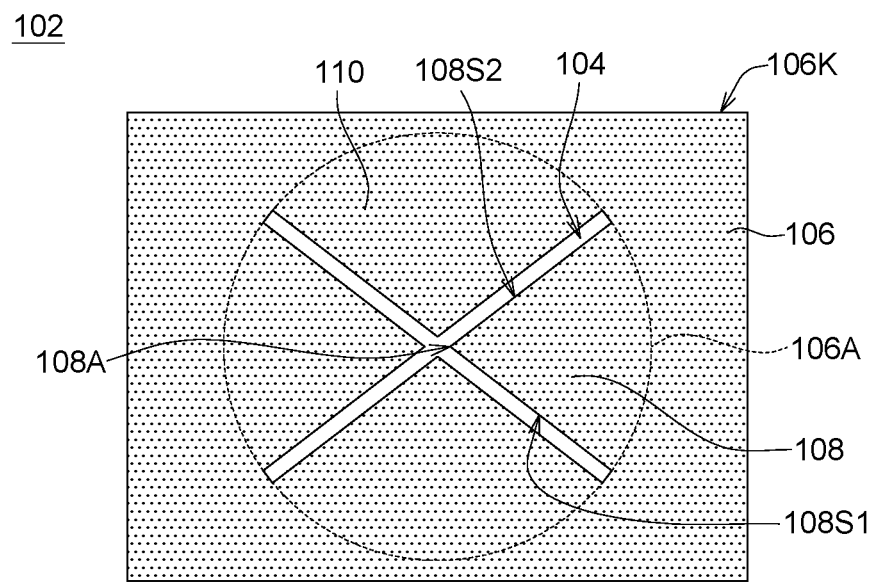
FIG. 4 illustrates a top view of a cantilever structure according to an embodiment is illustrated.

FIG. 4 illustrates a top view of a cantilever structure 102 according to an embodiment, which is different from the cantilever structure 102 shown in FIG. 3 with the following description. In this embodiment, the fixed end 106A has a profile of four arc lines.

The present disclosure is not limited thereto the cantilever structure described above. The cantilever structure 102 may comprise one or more cantilever layers. In other embodiments, the cantilever structure 102 and/or the slit 104 of the cantilever layer of which may have other shapes, such as a minor arc shape, a U shape, a geometric shape, other polygon shapes, or other irregular shapes, etc. The shapes of the fixed portion 106 and the free cantilever portion 108 may be defined by the slit 104. In embodiments, the cantilever structure 102 may be applied to a micro-electro-mechanical system acoustic sensor, such as a bone conduction micro-electro-mechanical system acoustic sensor (BCM acoustic sensor), wherein the cantilever structure 102 may be used as a vibrator for a vibration sensing transducer. The sensing transducer may be an accelerometer or a microphone.

Figure 5:
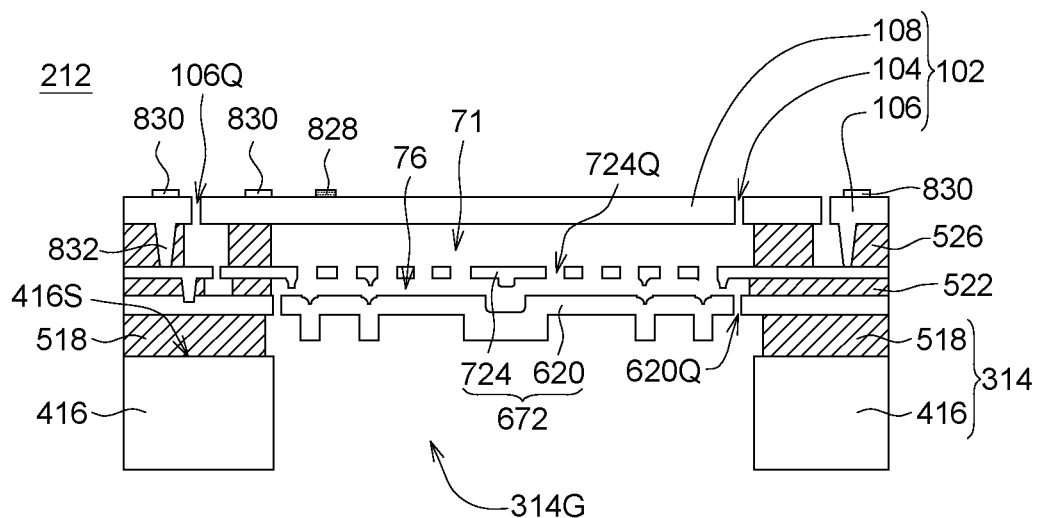
FIG. 5 illustrates a cross-section view of a micro-electro-mechanical system acoustic sensor according to an embodiment.

FIG. 5 illustrates a cross-section view of a micro-electromechanical system acoustic sensor 212 according to an embodiment. A support structure 314 may comprise a substrate 416 and a dielectric layer 518, which may define a cavity 314G. The cavity 314G comprises through openings of the substrate 416 and the dielectric layer 518. The dielectric layer 518 may comprise an oxide such as silicon oxide, silicon dioxide, tetraethoxysilane (TEOS) silicon oxide. The dielectric layer 518 may be disposed on the substrate 416. The diaphragm film 620 may be disposed on the dielectric layer 518. A dielectric layer 522 may be disposed on the diaphragm film 620. A back plate 724 may be disposed on the dielectric layer 522. The dielectric layer 522 may comprise an oxide such as silicon oxide, silicon dioxide, tetraethoxysilane (TEOS) silicon oxide. A dielectric layer 526 may be disposed on the back plate 724. The fixed portion 106 of the cantilever structure 102 may be disposed on the dielectric layer 526. The cantilever structure 102, the diaphragm film 620 and the back plate 724 may be overlapped with each other in a vertical direction, and separated from each other by the dielectric layer 522 and the dielectric layer 526. Each of the substrate 416, the dielectric layer 518, the dielectric layer 522 and the dielectric layer 526 may define a through opening. The back plate 724 and the diaphragm film 620 may have a first empty gap 76 therebetween. The first empty gap 76 may comprise a through opening defined by an inner sidewall surface of the dielectric layer 522, and may be defined by an upper surface of the diaphragm film 620 and a lower surface of the back plate 724. The back plate 724 and the free cantilever portion 108 of the cantilever structure 102 have an empty gap 71 therebetween. The empty gap 71 may comprise a through opening defined by an inner sidewall surface of the dielectric layer 526, and may be defined by an upper surface of the back plate 724 and a lower surface of the cantilever structure 102. The dielectric layer 526 may comprise an oxide such as silicon oxide, silicon dioxide, tetraethoxysilane (TEOS) silicon oxide. The free cantilever portion 108 of the cantilever structure 102 is over the empty gap 71. A vibration of the free cantilever portion 108 of the cantilever structure 102 may be generated in an empty space by an external vibration source. The vibration of the free cantilever portion 108 of the cantilever structure 102 creates a vibration wave. The empty space may comprise the empty gap 71 under the free cantilever portion 108, and an empty space without disposing a material layer over the free cantilever portion 108. The diaphragm film 620 may have a patterned slit 620Q. In a top view, the patterned slit 620Q may have any arbitrary required pattern of a line, a circular shape, a void, etc., which may be used to define a pattern design of the diaphragm film 620, for example, for forming a spring structure, or an air leaking hole pattern, or define an outside pattern of the diaphragm film 620. The back plate 724 may have an acoustic hole 724Q. The cantilever structure 102 may have a through hole 106Q. The cantilever structure 102 may comprise a stiffness adjusting structure. The stiffness adjusting structure may comprise the through hole 106Q. The through hole 106Q may comprise a void, a patterned slit, or a combination thereof. The cavity 314G, the empty gap 71, the first empty gap 76, the patterned slit 620Q, the acoustic hole 724Q and the slit 104 of the cantilever structure 102 may be communicated to each other. The through hole 106Q of the cantilever structure 102 may be used for a pad isolation, isolating an electrical connection from the back plate 724. In embodiments, the cantilever structure 102, the diaphragm film 620 and the back plate 724 may individually comprise a conductive material, a semiconductor material, a dielectric material or a combination thereof. In an embodiment, the cantilever structure 102 may comprise a semiconductor material of polysilicon, silicon carbide (SiC), and so on, and may be treated by an ion implantation or doping process so as to make the material having a conductive property. The diaphragm film 620 may comprise a semiconductor material of polysilicon, single crystal silicon, silicon carbide, and so on. The back plate 724 may comprise a semiconductor material of polysilicon, silicon carbide and so on, and may be treated by an ion implantation or doping process so as to make the material having a conductive property. However, the present disclosure is not limited thereto. A piezoelectric material layer 828 may be disposed on the free cantilever portion 108 of the cantilever structure 102. An electrode layer 830 may be disposed on the cantilever structure 102. A via 832 (alternatively referred to as conductive via) may be disposed to pass through the dielectric layer 522 and the dielectric layer 526. Two or more of the cantilever structure 102, the diaphragm film 620, the back plate 724, the electrode layer 830, and the piezoelectric material layer 828 may be electrically connected to each other by a conductive element such as the via 832 and/or a conductive wiring (not shown), etc. The electrode layer 830 may comprise electrical contact points electrically connected to the back plate 724.

The micro-electro-mechanical system acoustic sensor 212 may comprise the diaphragm sensor 672 and a vibration sensor. The diaphragm sensor 672 comprises the diaphragm film 620 and the back plate 724. The vibration sensor comprises the cantilever structure 102. In the embodiment shown in FIG. 5, the diaphragm sensor 672 and the cantilever structure 102 are vertically stacked on a substrate surface 416S of the substrate 416. The micro-electro-mechanical system acoustic sensor 212 may be a micro-electromechanical system microphone and a vibration sensor, and comprise a micro-electro-mechanical system microphone sensor and a vibration sensor, integrated in the same one chip, wherein the micro-electro-mechanical system microphone sensor comprises the diaphragm sensor 672. The diaphragm sensor 672 comprises the diaphragm film 620 and the back plate 724. The vibration sensor comprises the cantilever structure 102. The diaphragm film 620 is adapted to receive a vibration generated by the free cantilever portion 108 of the cantilever structure 102, and this vibration creates a vibration wave. In an embodiment, the bone conduction micro-electro-mechanical system acoustic sensor performs a sensing with using an operation principle sensing a capacitance formed by the two electrodes of the diaphragm film 620 and the back plate 724. In another embodiment, the bone conduction micro-electro-mechanical system acoustic sensor performs a sensing with using an operation principle sensing a differential capacitance of the three electrodes formed by the diaphragm film 620, the back plate 724 and the cantilever structure 102, and a signal-to-noise ratio (SNR) can be increased by 3 dB.

The cantilever structure 102 may be used as a vibrator used to receive an external vibration, creating a vibrating provided to the diaphragm film. The vibrating of the diaphragm film forms a displacement of the diaphragm film, resulting in a variation of a gap distance between the diaphragm film and the back plate, which changes a capacitance value, such that the bone conduction micro-electromechanical system acoustic sensor can sense a solid conduction (such as a bone conduction), a vibration or a sound pressure coming from an external. When an external vibration occurs, the piezoelectric material layer of the cantilever structure can activate the sensor by a waking-up function with a low power consumption.

Figure 6:
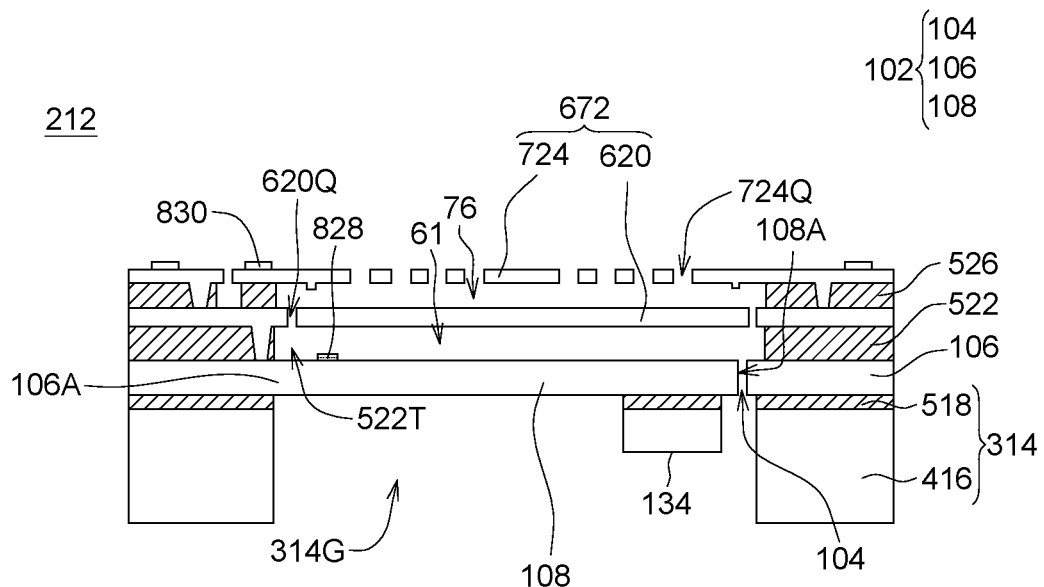
FIG. 6 illustrates a cross-section view of a micro-electro-mechanical system acoustic sensor according to an embodiment.

FIG. 6 illustrates a cross-section view of a micro-electro-mechanical system acoustic sensor 212 according to an embodiment, which is different from the micro-electro-mechanical system acoustic sensor 212 shown in FIG. 5 with the following description. The cantilever structure 102 may further comprise a mass 134 disposed on a lower surface of the free cantilever portion 108, and may be adjacent to the free end 108A and away from the fixed end 106A. The fixed portion 106 of the cantilever structure 102 may be disposed on the dielectric layer 518 of the support structure 314. The dielectric layer 522 may be disposed on the fixed portion 106 of the cantilever structure 102. The diaphragm film 620 may be disposed on the dielectric layer 522. The dielectric layer 526 may be disposed on the diaphragm film 620. The back plate 724 may be disposed on the dielectric layer 526. The free cantilever portion 108 of the cantilever structure 102 and the diaphragm film 620 have an empty gap 61 (which may be also referred to as cavity) therebetween. This empty gap 61 may comprise the through opening defined by the inner sidewall surface of the dielectric layer 522T, and may be defined by an upper surface of the cantilever structure 102 and a lower surface of the diaphragm film 620. The diaphragm film 620 and the back plate 724 have the first empty gap 76 (which may be also referred to as cavity) therebetween. This first empty gap 76 may comprise the through opening defined by the inner sidewall surface of the dielectric layer 526, and may be defined by the upper surface of the diaphragm film 620 and the lower surface of the back plate 724. A vibration of the free cantilever portion 108 of the cantilever structure 102 may be generated in the empty space. The vibration of the free cantilever portion 108 of the cantilever structure 102 creates a vibration wave. The empty space may comprise the cavity 314G under the free cantilever portion 108, and the empty gap 61 over the free cantilever portion 108. The electrode layer 830 may be disposed on the back plate 724. The electrode layer 830 may comprise an electrical contact point electrically connected to the back plate 724. However, the present disclosure is not limited thereto. The electrode layer 830 may comprise an electrical contact point electrically connected to the diaphragm film 620. The electrode layer 830 may comprise an electrical contact point electrically connected to the cantilever structure 102. The cavity 314G, the empty gap 61, the first empty gap 76, the patterned slit 620Q, the acoustic hole 724Q and the slit 104 of the cantilever structure 102 may be communicated to each other. The mass 134 may be also referred to as proof mass.

In embodiments, the micro-electro-mechanical system acoustic sensor 212 as shown in FIG. 5 or FIG. 6 may have an area size of 1 mm*1 mm or smaller. However, the present disclosure is not limited thereto.

Figure 7:
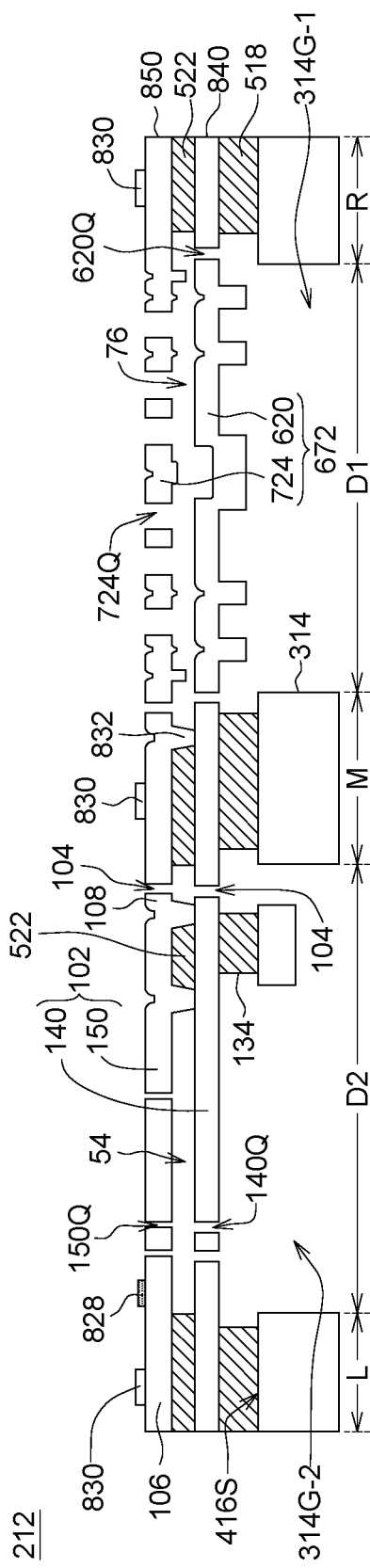
FIG. 7 illustrates a cross-section view of a micro-electro-mechanical system acoustic sensor according to an embodiment.

FIG. 7 illustrates a cross-section view of a micro-electro-mechanical system acoustic sensor 212 according to an embodiment, which is different from the micro-electro-mechanical system acoustic sensor 212 shown in FIG. with the following description. An element layer 840 (first element layer) may be disposed on the dielectric layer 518. The element layer 840 may comprise a semiconductor material of polysilicon, single crystal silicon, silicon carbide, and so on, and may be treated by an ion implantation or doping process so as to make the material having a conductive property. The dielectric layer 522 may be disposed on the element layer 840. An element layer 850 (second element layer) may be disposed on the dielectric layer 522. The element layer 850 may comprise a semiconductor material of polysilicon, silicon carbide and so on, and may be treated by an ion implantation or doping process so as to make the material having a conductive property. In embodiments, the element layer 840 and the element layer 850 may individually comprise a conductive material, a semiconductor material, a dielectric material or a combination thereof. The electrode layer 830 may be disposed on the element layer 850.

The cantilever structure 102 comprises a cantilever layer 140 (first cantilever layer) and a cantilever layer 150 (second cantilever layer). The cantilever layer 150 is on the cantilever layer 140. The dielectric layer 522 may be disposed between the cantilever layer 140 and the cantilever layer 150, and used as a mass. The cantilever layer 140 and the cantilever layer 150 have an empty gap 54 (e.g. second empty gap) therebetween. The mass 134 may be disposed on a lower surface of the cantilever layer 140. The piezoelectric material layer 828 may be disposed on an upper surface of the cantilever layer 150. The element layer 840 may comprise the diaphragm film 620 in a suspension region D1, and the cantilever layer 140 in a suspension region D2. The element layer 850 may comprise the back plate 724 in the suspension region D1, and the cantilever layer 150 in the suspension region D2. The bone conduction micro-electro-mechanical system acoustic sensor comprises an acoustic/pressure sensor in the suspension region D1. The acoustic/pressure sensor comprises the diaphragm film 620 and the back plate 724. The bone conduction micro-electro-mechanical system acoustic sensor comprises a vibration sensor in the suspension region D2. The vibration sensor comprises the cantilever structure 102. The free cantilever portion 108 is defined by the slit 104 of the cantilever structure 102 in the suspension region D2, and is not overlapped with the diaphragm film 620 and the back plate 724 in the suspension region D1 in the vertical direction. The free cantilever portion 108 of the cantilever structure 102 and the diaphragm film 620 and the back plate 724 are on opposing sidewall surfaces of the support structure 314 in the intermediate region M. The fixed portion 106 of the cantilever structure 102 may be in the intermediate region M and a support region L. The suspension region D1 may be between a support region R and the intermediate region M. The suspension region D2 may be between the support region L and the intermediate region M. The intermediate region M may be between the suspension region D1 and the suspension region D2.

A vibration of the free cantilever portion 108 of the cantilever structure 102 may be generated in the empty space. The vibration of the free cantilever portion 108 of the cantilever structure 102 creates a vibration wave. The empty space may comprise the cavity 314G-2 under the free cantilever portion 108, and an empty space without disposing a material layer over the cantilever layer 150 of the free cantilever portion 108. The cantilever layer 140 may have a through hole 140Q and the slit 104. The cantilever layer 150 may have a through hole 150Q and the slit 104. The cantilever structure 102 may comprise a stiffness adjusting structure. The stiffness adjusting structure may comprise the through hole 140Q, the through hole 150Q and the empty gap 54. The through hole 140Q and the through hole 150Q may individually comprise a void, a patterned slit, or a combination thereof. The empty gap 54, the first empty gap 76, the through hole 140Q, the through hole 150Q, the patterned slit 620Q, the acoustic hole 724Q, the slit 104 of the cantilever structure 102, the cavity 314G-2 and the cavity 314G-1 under the diaphragm film 620 may be communicated to each other. The via 832 may be disposed to pass through the dielectric layer 522. Two or more of the cantilever structure 102, the diaphragm film 620, the back plate 724, the electrode layer 830, and the piezoelectric material layer 828 may be electrically connected to each other by a conductive element such as the via 832 and/or a conductive wiring (not shown), etc. The electrode layer 830 may comprise an electrical contact point electrically connected to the back plate 724. However, the present disclosure is not limited thereto. The electrode layer 830 may comprise an electrical contact point electrically connected to the diaphragm film 620. The electrode layer 830 may comprise an electrical contact point electrically connected to the cantilever structure 102.

In an embodiment shown in FIG. 7, the diaphragm sensor 672 and the cantilever structure 102 formed on the substrate surface 416S of the substrate 416 are not overlapped with each other in the vertical direction. The diaphragm film 620 is adapted to receive a vibration generated by the free cantilever portion 108 of the cantilever structure 102. The micro-electro-mechanical system acoustic sensor 212 may be a micro-electro-mechanical system microphone and a vibration sensor, and comprise a micro-electro-mechanical system microphone sensor and a vibration sensor, integrated in the same one chip, wherein the micro-electro-mechanical system microphone sensor comprises the diaphragm film 620 and the back plate 724, the vibration sensor comprises the cantilever structure 102.

Figure 8:
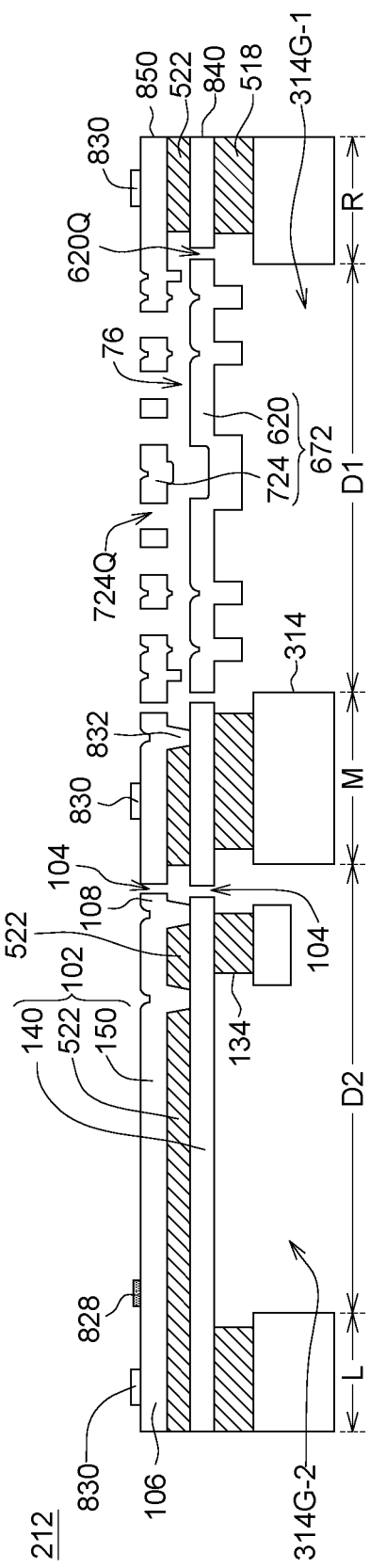
FIG. 8 illustrates a cross-section view of a micro-electro-mechanical system acoustic sensor according to an embodiment.

FIG. 8 illustrates a cross-section view of a micro-electro-mechanical system acoustic sensor 212 according to an embodiment, which is different from the micro-electro-mechanical system acoustic sensor 212 shown in FIG. 7 with the following description. The cantilever structure 102 comprises the dielectric layer 522 between the cantilever layer 140 and the cantilever layer 150 in the suspension region D2. The through hole 140Q of the cantilever layer 140, the through hole 150Q of the cantilever layer 150, and the empty gap 54 shown in FIG. 7 may be omitted.

The present disclosure is not limited to the micro-electro-mechanical system acoustic sensor 212 described above. The micro-electro-mechanical system acoustic sensor 212 may have a structure adjusted according to demands. In embodiments, the micro-electro-mechanical system acoustic sensor 212 may be applied to a micro-electro-mechanical system package structure.

Figure 9:
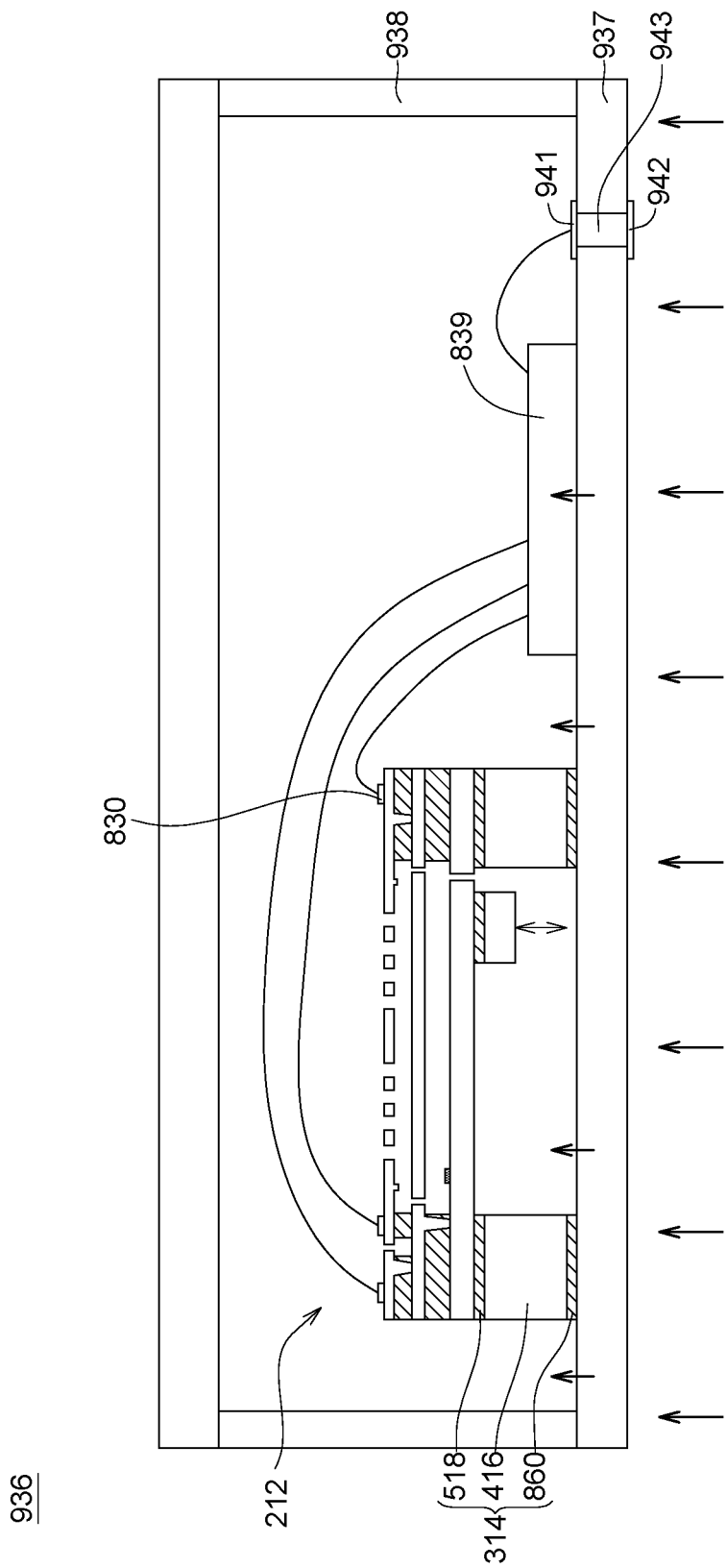
FIG. 9 illustrates a cross-section view of a micro-electro-mechanical system package structure according to an embodiment.

Referring to FIG. 9, a cross-section view of a micro-electro-mechanical system package structure 936 according to an embodiment is illustrated. The micro-electro-mechanical system package structure 936 may comprise a carrier plate 937 and a housing 938. An accommodating space may be defined by the carrier plate 937 and the housing 938. The micro-electro-mechanical system acoustic sensor 212 may be disposed in accommodating space, and on the carrier plate 937. The micro-electro-mechanical system acoustic sensor 212 may be similar to the micro-electro-mechanical system acoustic sensor 212 as shown in FIG. 6, with a difference in that the support structure 314 as shown further comprises an insulating layer 860. The substrate 416 is on the insulating layer 860. An acoustic sensor control chip 839 may be disposed in the accommodating space, and on the carrier plate 937. The micro-electro-mechanical system acoustic sensor 212 and the acoustic sensor control chip 839 may be electrically connected to each other by a wire bonding method. In an embodiment, the carrier plate 937 may comprise a printed circuit board, which may comprise first electrical contact points 941 and second electrical contact points 942, such as metal pads. The first electrical contact point 941 and the second electrical contact point 942 may be electrically connected to each other by a conductive element 943. The accommodating space covers the micro-electro-mechanical system acoustic sensor 212, the acoustic sensor control chip 839 and the first electrical contact points 941, and exposes the second electrical contact points 942. The carrier plate 937 may be electrically connected to the acoustic sensor control chip 839 with the first electrical contact points 941 on the printed circuit board by a wire bonding method. In an embodiment, the acoustic sensor control chip 839 is an application specific integrated circuit (ASIC) chip. The second electrical contact points 942 may be input/output pads (I/O pads). For example, Input signals comprising a driving input electric signal coming from other integrated circuit chips may transmit to the first electrical contact points 941 used for receiving an input signal through the second electrical contact points 942 used for receiving an input signal, and then transmit to the acoustic sensor control chip 839. A sensing output signal coming from the micro-electro-mechanical system acoustic sensor 212 may be processed through the acoustic sensor control chip 839, and then transmitted out to the first electrical contact points 941 used for receiving an output signal, and finally the output signal is transmitted out by the second electrical contact points 942 used for receiving the output signal. In an embodiment, the housing 938 may comprise a conductive material such as a metal. In an embodiment, the housing 938 may comprise a printed circuit board. In an embodiment, the carrier plate 937 is disposed adjacent to a signal source (a signal source direction is indicated by an arrow under the carrier plate 937, but the present disclosure is not limited thereto). The signal source comprises a solid conduction path, such as an ear bone, etc. The cantilever structure (or vibrator) is more adjacent to the signal source (comprising a vibration source, a solid conduction path, or an acoustic source (pressure)), and therefore the signal sensing can be strengthened effectively. In an embodiment, an empty portion without material in the micro-electro-mechanical system package structure may be filled with a gas, such as an air. The manufacturing is single and has a lower cost. In another embodiment, the empty portion without material in the micro-electro-mechanical system package structure may be vacuumed to reduce a damping effect, resulting in a less energy loss or mechanical dissipation.

Figure 10:
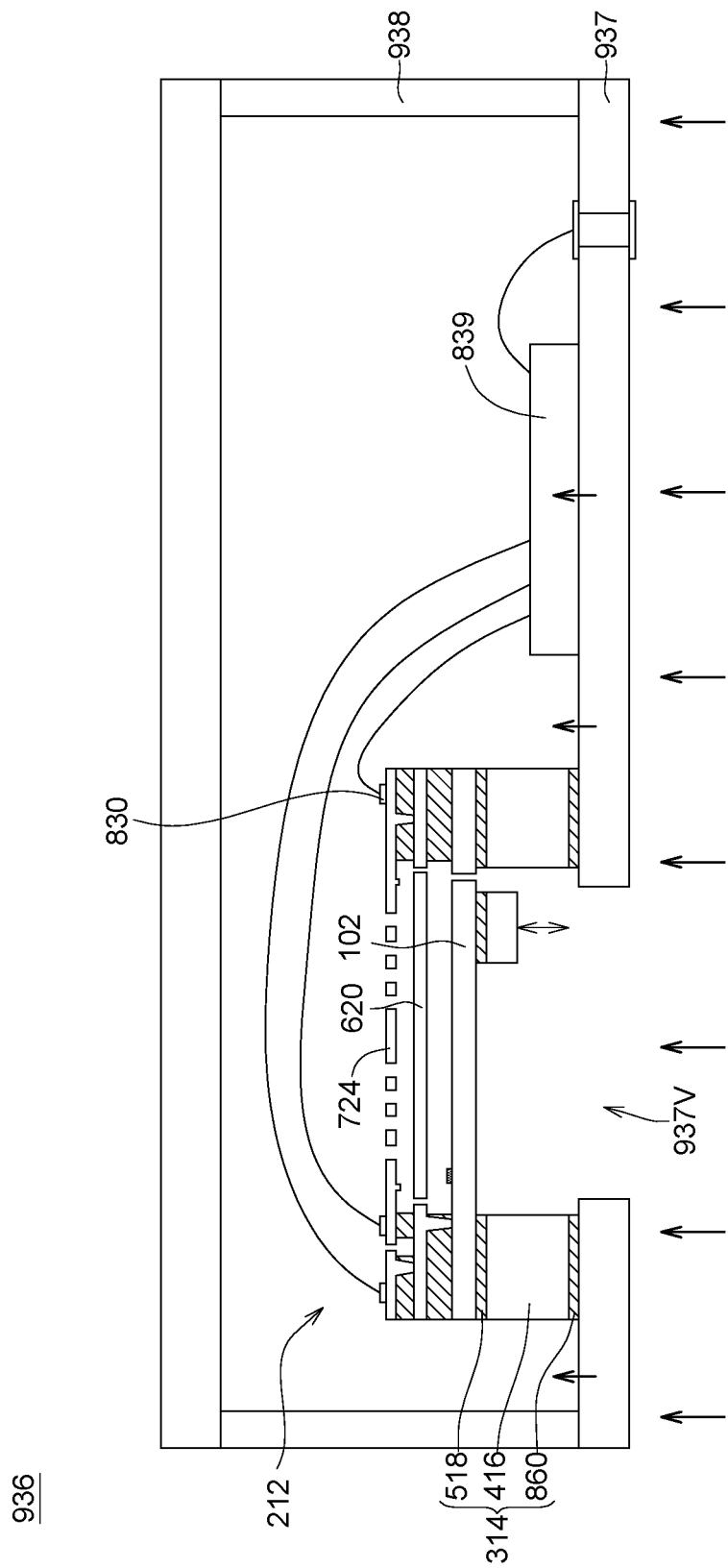
FIG. 10 illustrates a cross-section view of a micro-electro-mechanical system package structure according to an embodiment.

FIG. 10 illustrates a cross-section view of a micro-electro-mechanical system package structure 936 according to an embodiment, which is different from the micro-electro-mechanical system package structure 936 shown in FIG. 9 with the following description. The carrier plate 937 has an opening 937V (for example a bottom opening) under the cantilever structure 102, the diaphragm film 620 and the back plate 724. The opening 937V can provide a path for a sound signal in an external air to get into the micro-electro-mechanical system package structure 936. The present disclosure is not limited thereto. In other embodiments, the opening such as a top opening (not shown) may be disposed in the housing 938.

Figure 11:
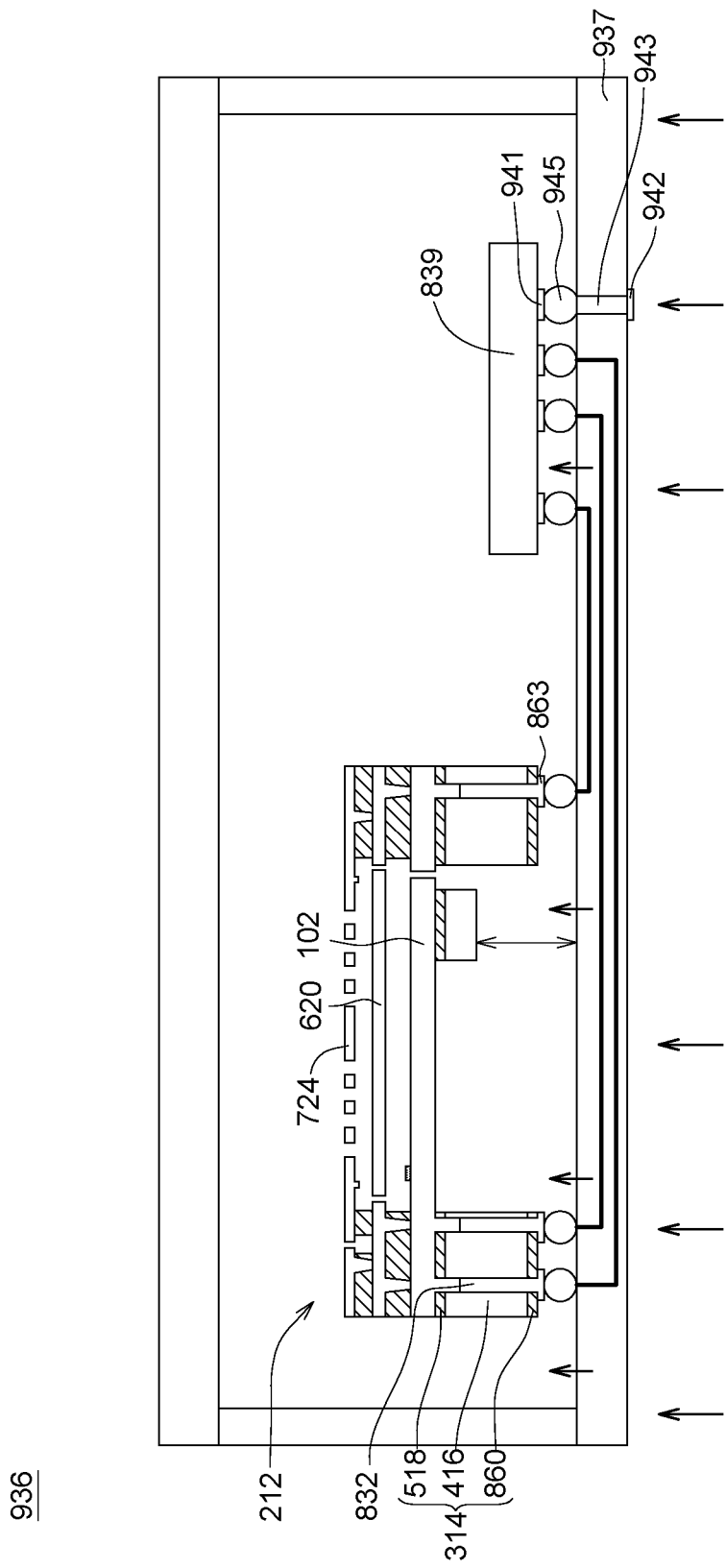
FIG. 11 illustrates a cross-section view of a micro-electro-mechanical system package structure according to an embodiment.

FIG. 11 illustrates a cross-section view of a micro-electro-mechanical system package structure 936 according to an embodiment, which is different from the micro-electro-mechanical system package structure 936 shown in FIG. 9 with the following description. The support structure 314 of the micro-electro-mechanical system acoustic sensor 212 further comprises the insulating layer 860. The substrate 416 is on the insulating layer 860. The support structure 314 comprises the via 832. The via 832 of the support structure 314 comprises a via formed in the insulating layer 860, a via (such as a through silicon via (TSV)) formed in the substrate 416, and a via formed in the dielectric layer 518. The via 832 may be electrically connected to the diaphragm film 620, the back plate 724 and/or the cantilever structure 102. A metal pad 863 may be formed on a lower surface of the insulating layer 860, and electrically connected to the via 832 of the support structure 314. The metal pad 863 may comprise an electrical contact point electrically connected to the back plate 724. However, the present disclosure is not limited thereto. The metal pad 863 may comprise an electrical contact point electrically connected to the diaphragm film 620. The metal pad 863 may comprise an electrical contact point electrically connected to the cantilever structure 102. The acoustic sensor control chip 839 is electrically connected to the micro-electro-mechanical system acoustic sensor 212 through the conductive wirings of the carrier plate 937 (printed circuit board) by a flip chip method. In an embodiment, the carrier plate 937 may comprise the first electrical contact points 941 and the second electrical contact points 942, such as metal pads. The first electrical contact point 941 and the second electrical contact point 942 may be electrically connected to each other by the conductive element 943 and a solder 945. Input signals comprising a driving input electric signal coming from other integrated circuit chips may transmit to the first electrical contact points 941 used for receiving an input signal through the second electrical contact points 942 used for receiving an input signal, and then transmit to the acoustic sensor control chip 839. A sensing output signal coming from the micro-electro-mechanical system acoustic sensor 212 may be processed through the acoustic sensor control chip 839, and then transmitted out to the first electrical contact points 941 used for receiving an output signal, and finally the output signal is transmitted out by the second electrical contact points 942 used for receiving the output signal. The electrode layer 830 as shown in FIG. 9 may be omitted. Compared to the wiring bonding technique having a longer conductive line path, the through silicon via or flip chip technique can provide a shorter conductive path so as to reduce a noise, resulting in a higher signal-to-noise ratio.

Figure 12:
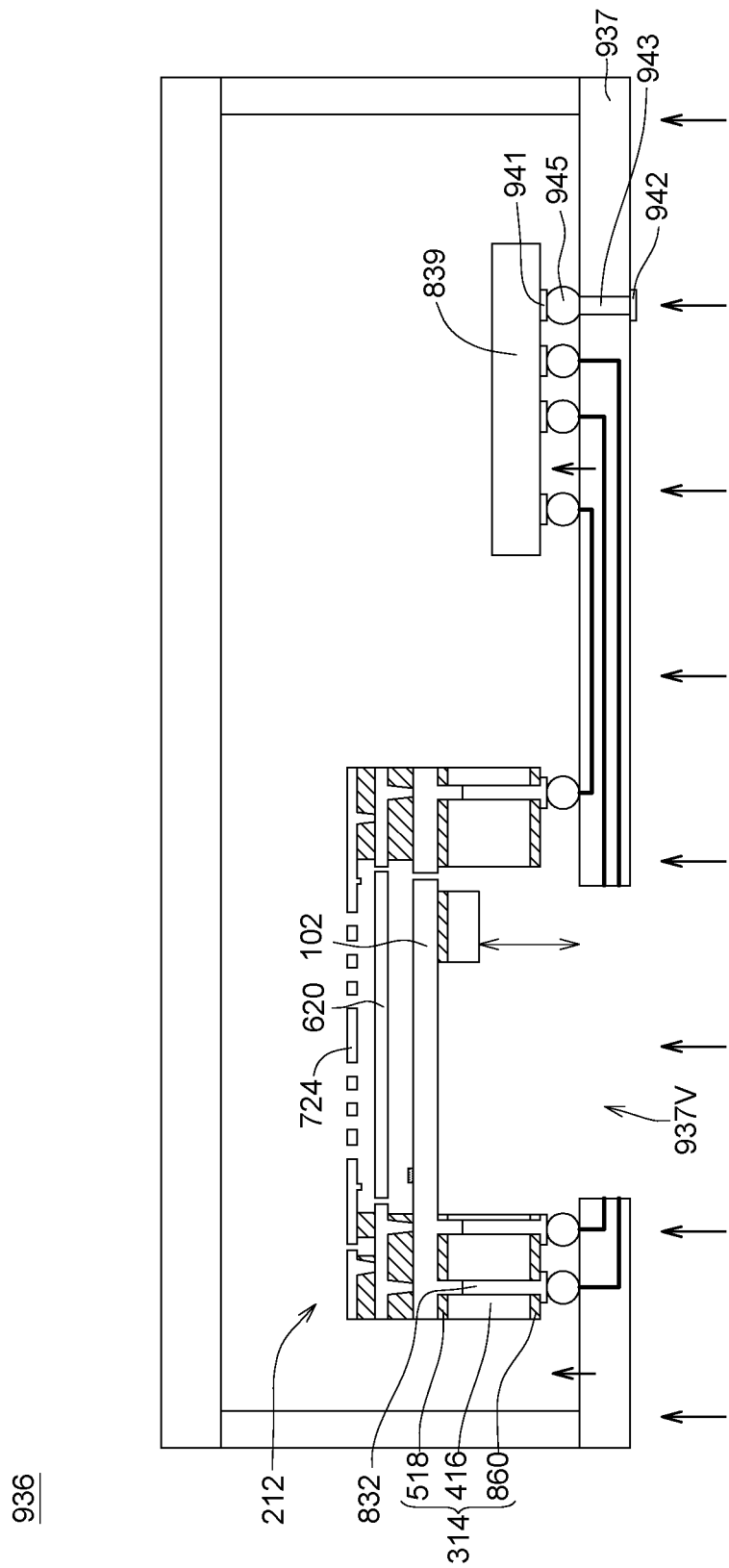
FIG. 12 illustrates a cross-section view of a micro-electro-mechanical system package structure according to an embodiment.

FIG. 12 illustrates a cross-section view of a micro-electro-mechanical system package structure 936 according to an embodiment, which is different from the micro-electro-mechanical system package structure 936 shown in FIG. 11 with the following description. The carrier plate 937 has the opening 937V under the cantilever structure 102, the diaphragm film 620 and the back plate 724.

Figure 13:
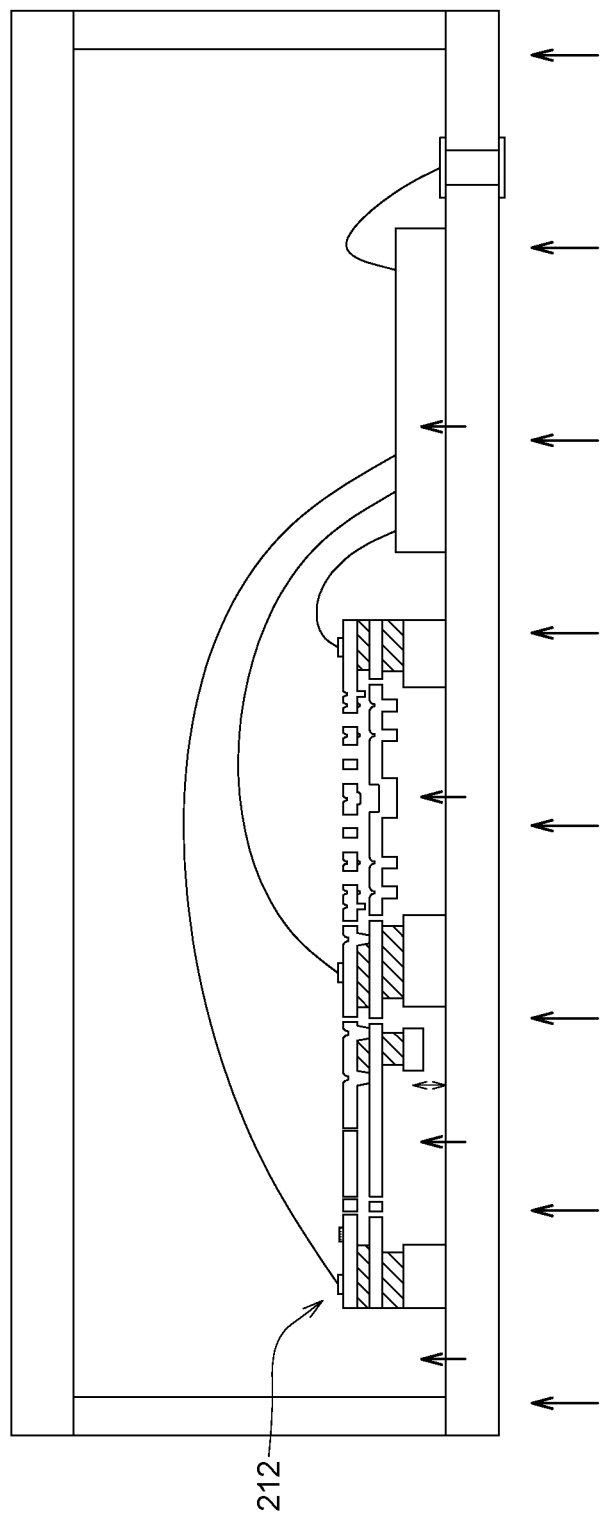
FIG. 13 illustrates a cross-section view of a micro-electro-mechanical system package structure according to an embodiment.

FIG. 13 illustrates a cross-section view of a micro-electro-mechanical system package structure 936 according to an embodiment, which is different from the micro-electro-mechanical system package structure 936 shown in FIG. 9 with the following description. The micro-electro-mechanical system acoustic sensor 212 may be similar to the micro-electro-mechanical system acoustic sensor 212 as shown in FIG. 7.

Figure 14:
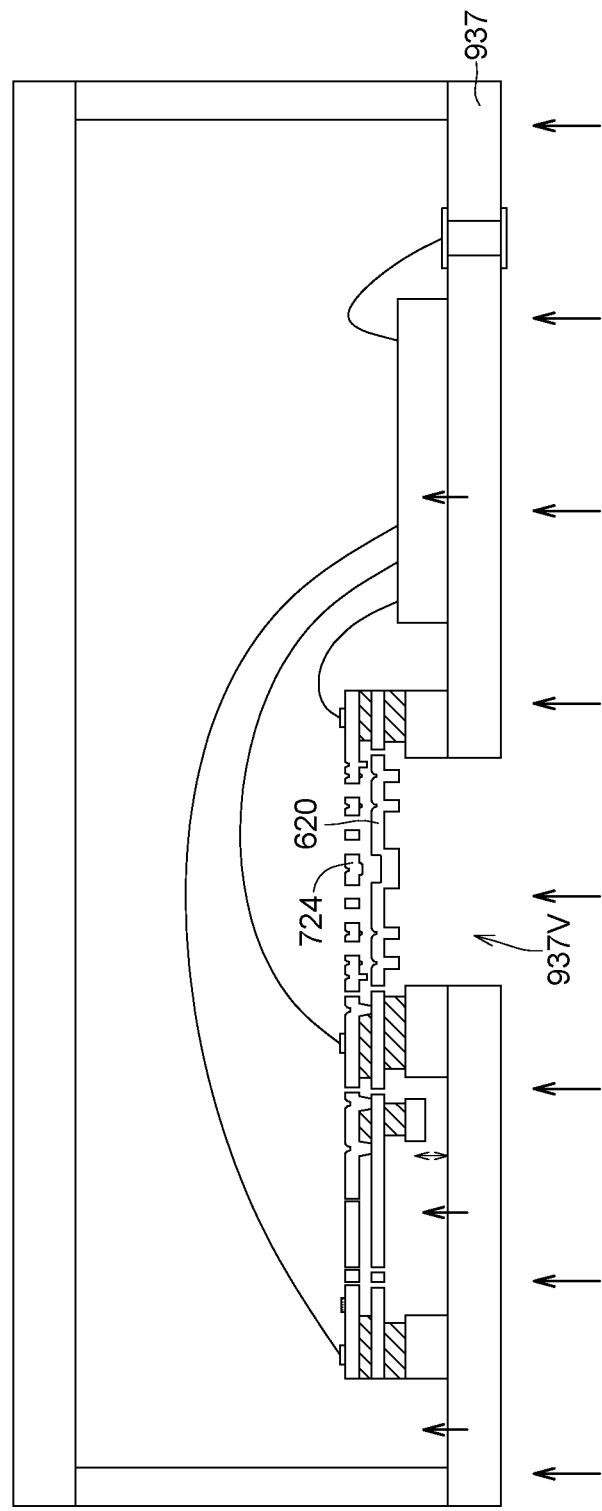
FIG. 14 illustrates a cross-section view of a micro-electro-mechanical system package structure according to an embodiment.

FIG. 14 illustrates a cross-section view of a micro-electro-mechanical system package structure 936 according to an embodiment, which is different from the micro-electro-mechanical system package structure 936 shown in FIG. 13 with the following description. The carrier plate 937 has the opening 937V under the diaphragm film 620 and the back plate 724 of acoustic/pressure sensor.

Figure 15:
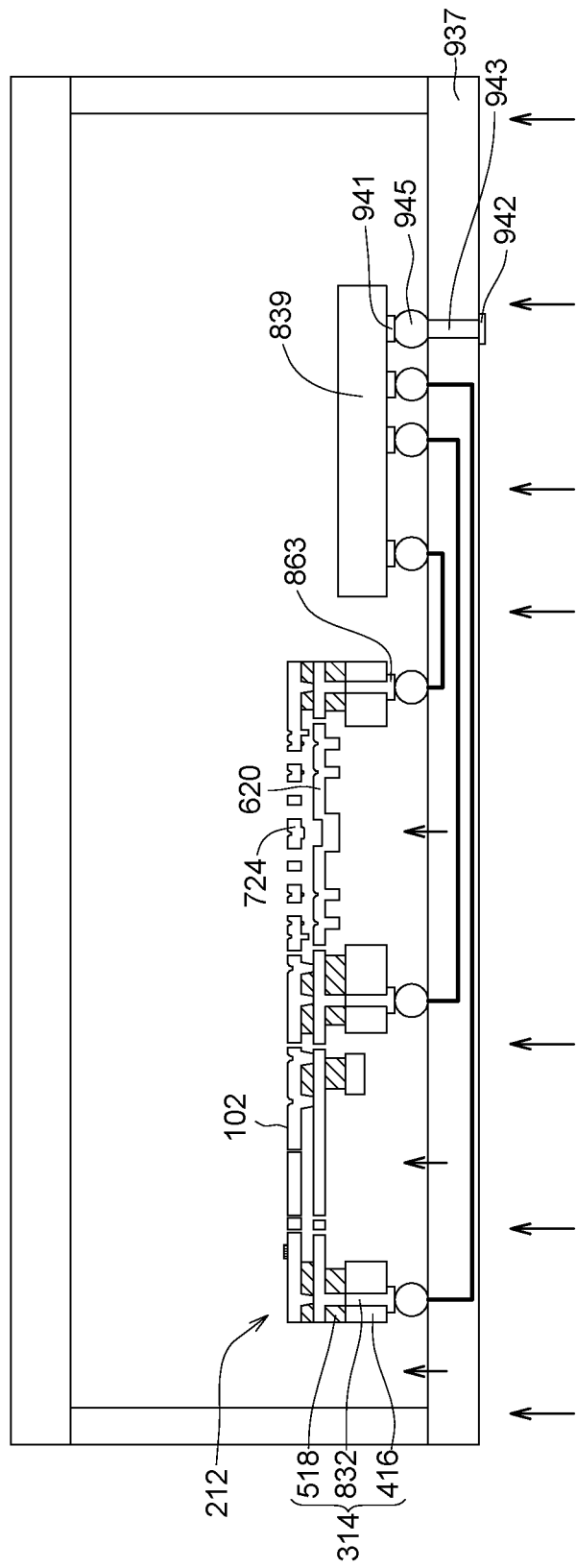
FIG. 15 illustrates a cross-section view of a micro-electro-mechanical system package structure according to an embodiment.

FIG. 15 illustrates a cross-section view of a micro-electro-mechanical system package structure 936 according to an embodiment, which is different from the micro-electro-mechanical system package structure 936 shown in FIG. 13 with the following description. The support structure 314 comprises the via 832. The via 832 of the support structure 314 comprises a via (such as a through silicon via (TSV)) formed in the substrate 416, and a via formed in the dielectric layer 518. The via 832 may be electrically connected to the diaphragm film 620, the back plate 724 and/or the cantilever structure 102. The metal pad 863 may be formed on a lower surface of the substrate 416, and electrically connected to the via 832 of the support structure 314. The acoustic sensor control chip 839 is electrically connected to the micro-electro-mechanical system acoustic sensor 212 through the conductive wirings of the carrier plate 937 (printed circuit board) by a flip chip method.

Figure 16:
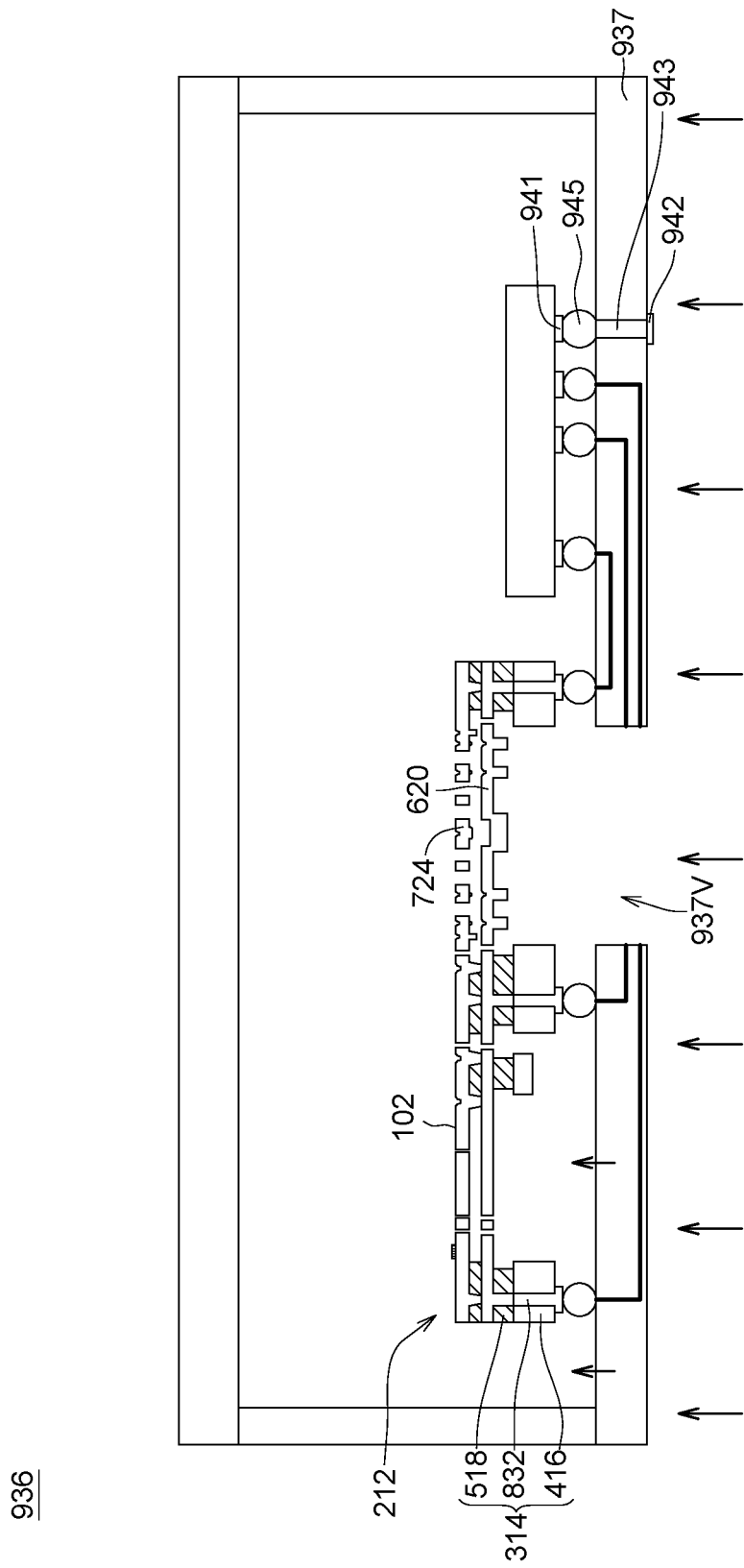
FIG. 16 illustrates a cross-section view of a micro-electro-mechanical system package structure according to an embodiment.

FIG. 16 illustrates a cross-section view of a micro-electro-mechanical system package structure 936 according to an embodiment, which is different from the micro-electro-mechanical system package structure 936 shown in FIG. 15 with the following description. The carrier plate 937 has the opening 937V under the diaphragm film 620 and the back plate 724.

Figure 17A:
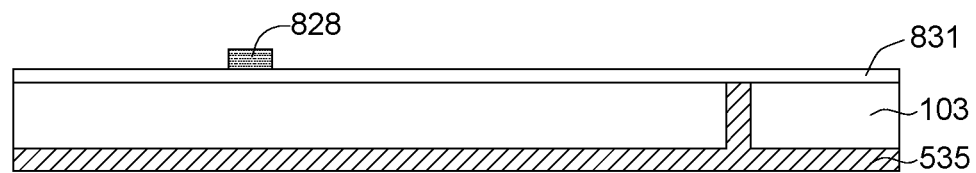
FIG. 17A to FIG. 17C illustrates a manufacturing method for a cantilever structure according to an embodiment.
Figure 17B:
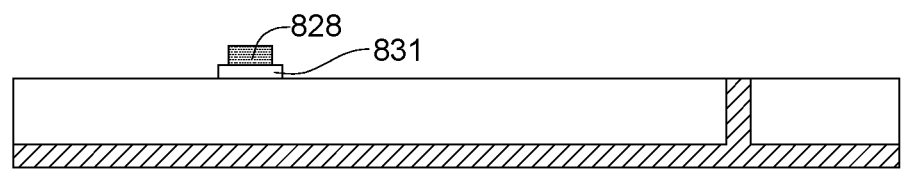
Figure 17C:
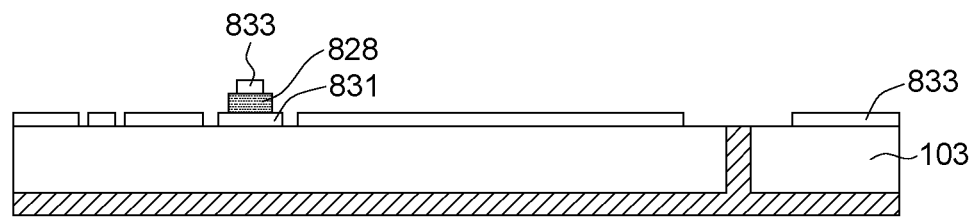

FIG. 17A to FIG. 17C illustrates a manufacturing method for a cantilever structure according to an embodiment.

Referring to FIG. 17A, a cantilever layer 103 is formed on a dielectric layer 535. The cantilever layer 103 may comprise a semiconductor material of polysilicon, single crystal silicon, silicon carbide, and so on, and may be treated by an ion implantation or doping process so as to make the material having a conductive property. The dielectric layer 535 may comprise an oxide such as silicon oxide, silicon dioxide, tetraethoxysilane (TEOS) silicon oxide. An electrode layer 831 (first electrode layer) is formed on the cantilever layer 103. The electrode layer 831 may comprise a metal or an alloy of which, such as Cr/Pt or Ti/Pt. The piezoelectric material layer 828 is formed on the electrode layer 831. The piezoelectric material layer 828 may comprise a piezoelectric material such as aluminum nitride (AlN), lead-zirconate-titanate (PZT), zinc oxide (ZnO), lithium niobate (LiNbO$_3$), polyvinylidene difluoride (PVDF), etc.

Referring to FIG. 17B, the electrode layer 831 is patterned to form a bottom electrode on a lower surface of the piezoelectric material layer 828.

Referring to FIG. 17C, an electrode layer 833 (second electrode layer) is formed on the piezoelectric material layer 828 and the cantilever layer 103. The electrode layer 833 may comprise a metal or an alloy of which, such as Cr/Au, Cr/AlCu, Ti/Au or Ti/AlCu, wherein chromium (Cr), titanium (Ti) are adhesion layers for gold (Au), aluminium copper (AlCu). The electrode layer 833 on an upper surface of the piezoelectric material layer 828 may be used as a top electrode. The electrode layer 833 on the cantilever layer 103 may comprise conductive wirings. The electrode layer 833 may be electrically connected to a bottom electrode metal pad of a bottom electrode through the conductive wiring, and electrically connected to a metal pad top electrode of a top electrode through the conductive wiring.

Figure 18A:
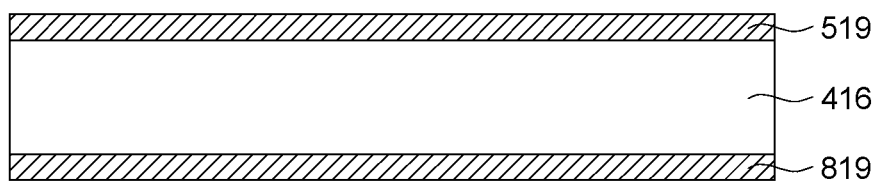
FIG. 18A to FIG. 18Y illustrates a manufacturing method for a micro-electro-mechanical system acoustic sensor according to an embodiment.
Figure 18B:
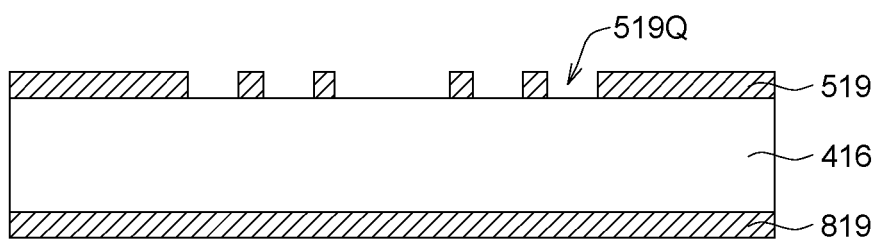
Figure 18C:
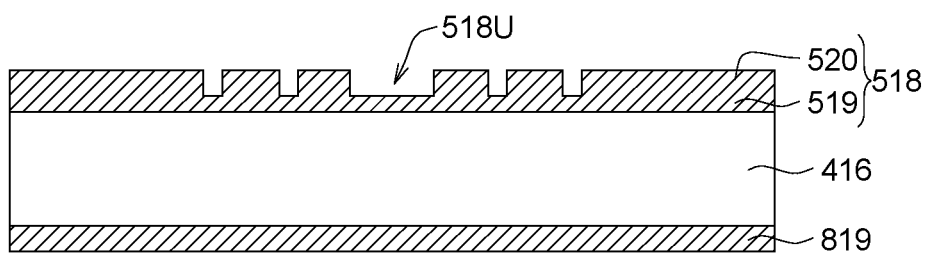
Figure 18D:
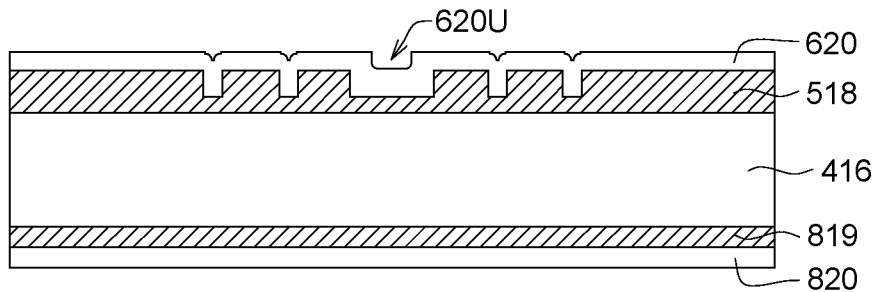
Figure 18E:
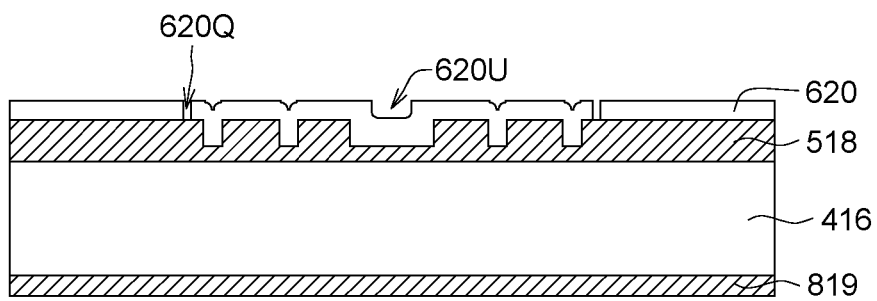
Figure 18F:
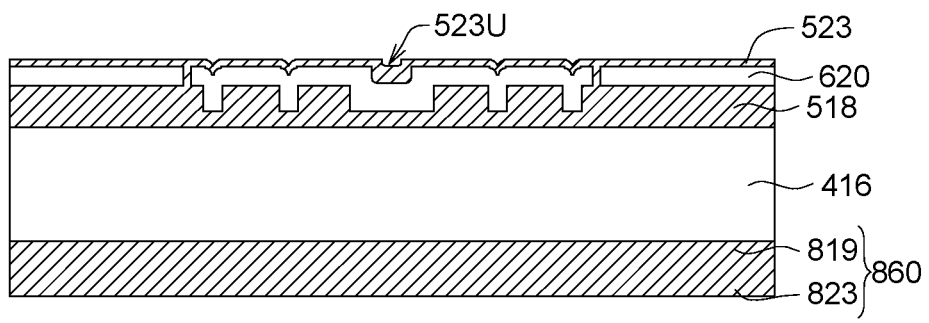
Figure 18G:
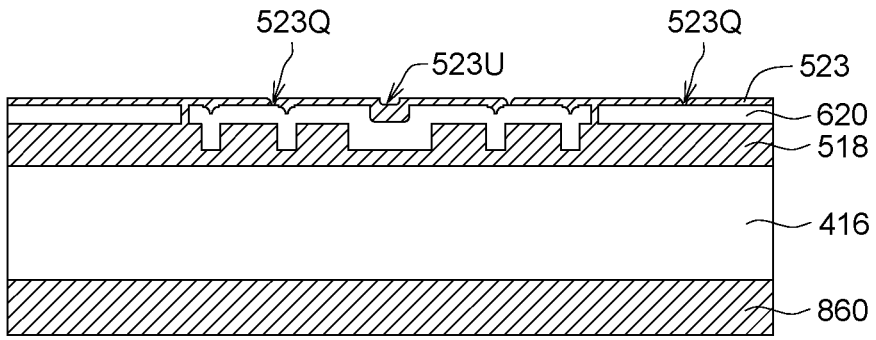
Figure 18H:
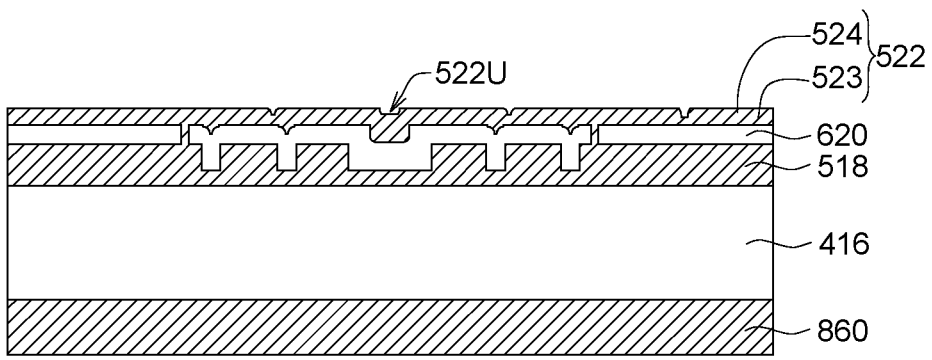
Figure 18I:
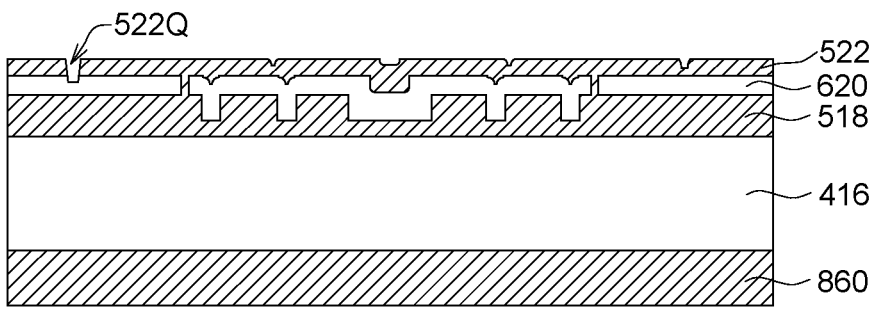
Figure 18J:
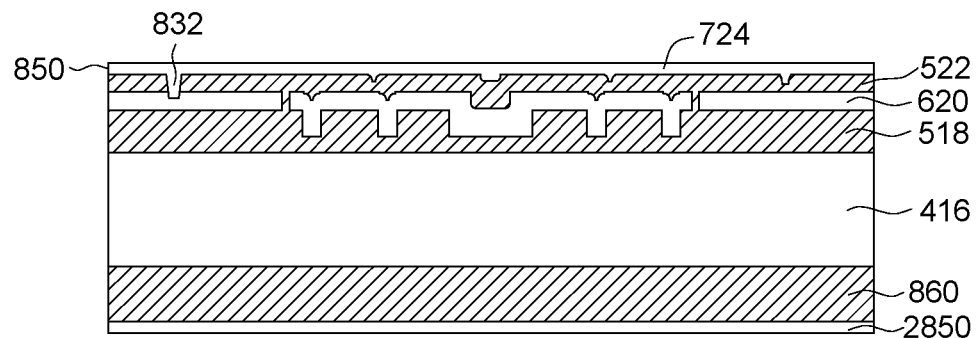
Figure 18K:
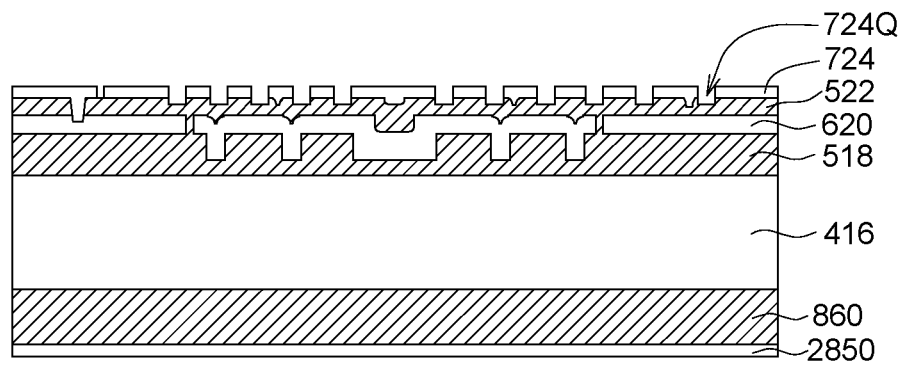
Figure 18L:
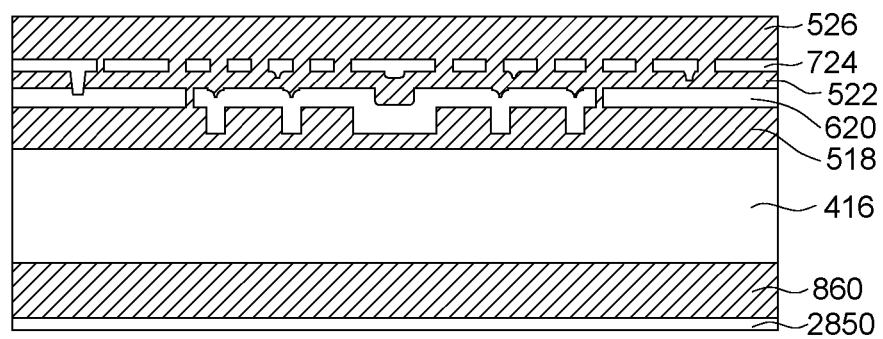
Figure 18M:
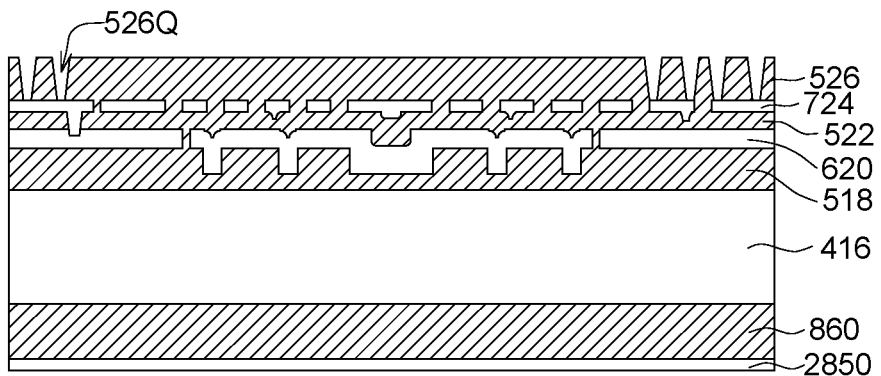
Figure 18N:
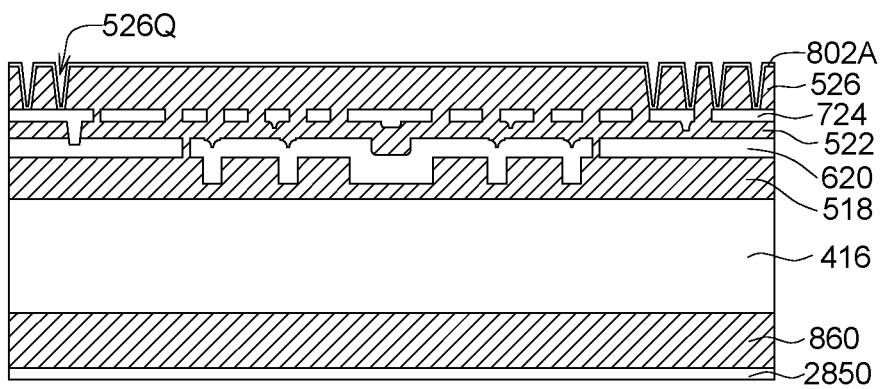
Figure 18O:
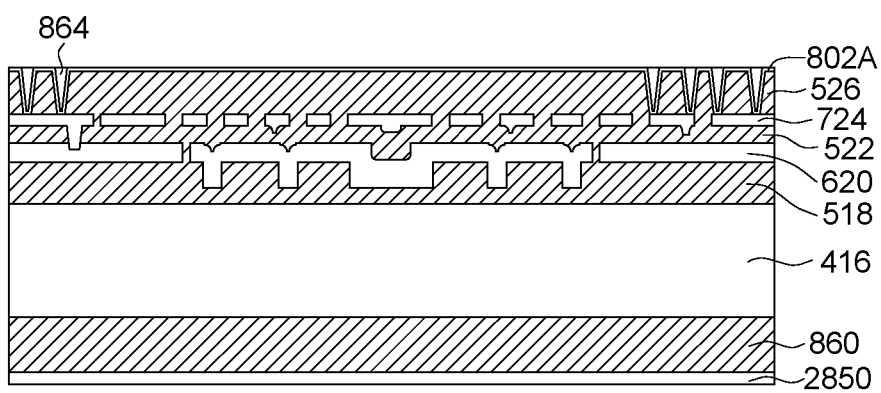
Figure 18P:
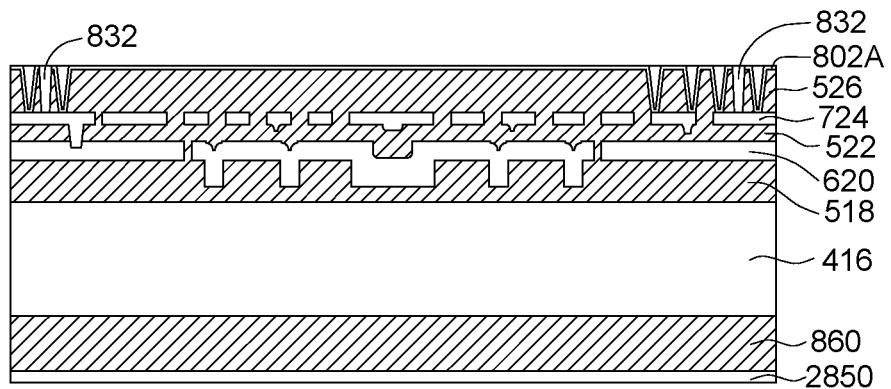
Figure 18Q:
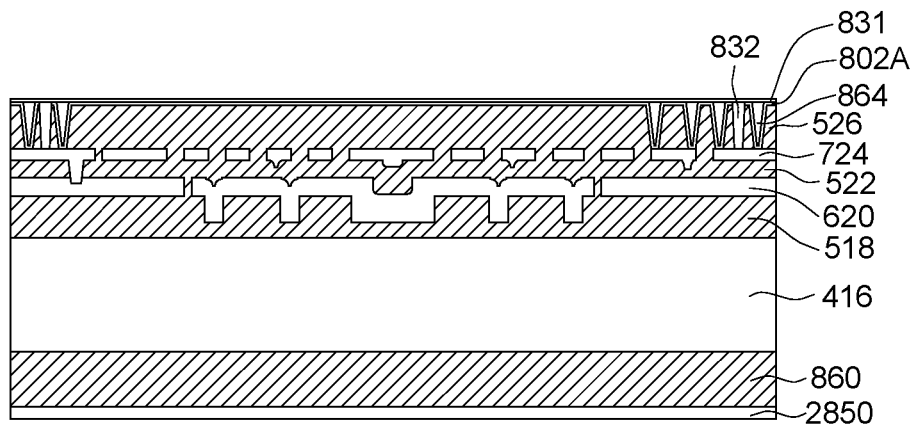
Figure 18R:
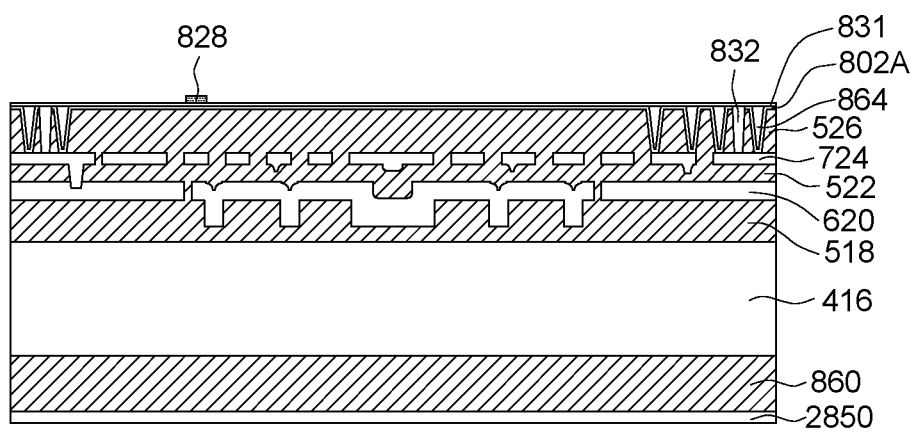
Figure 18S:
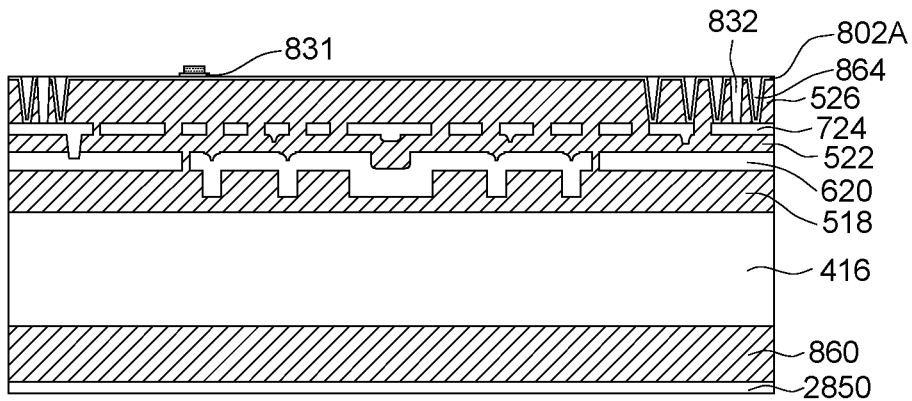
Figure 18T:
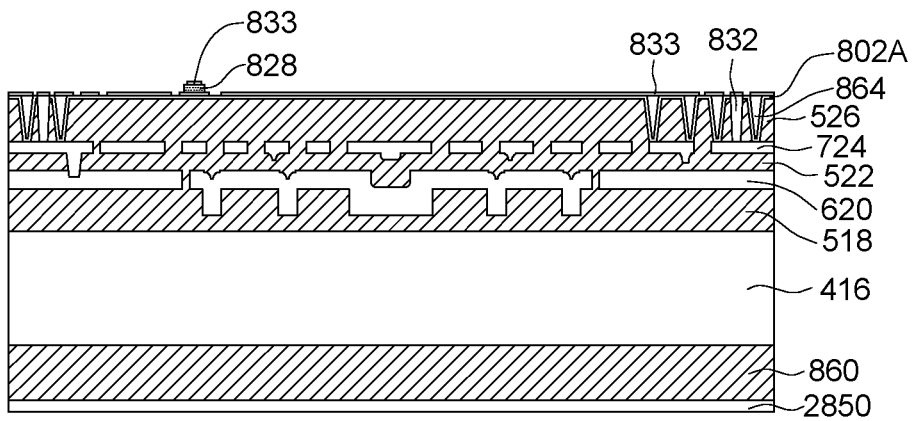
Figure 18U:
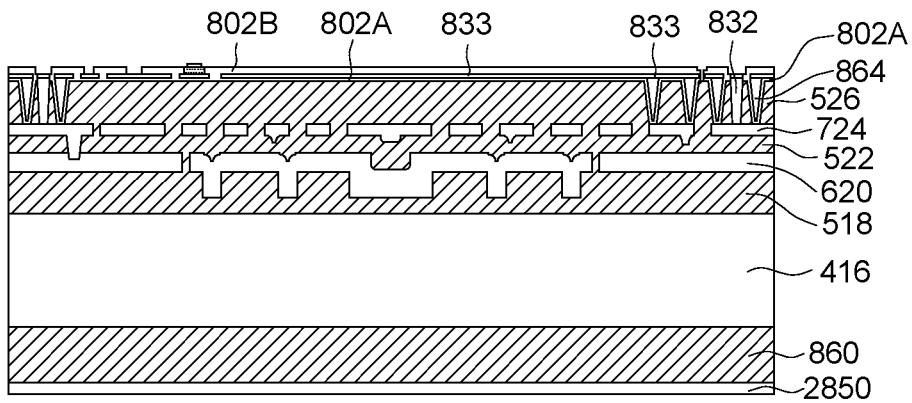
Figure 18V:
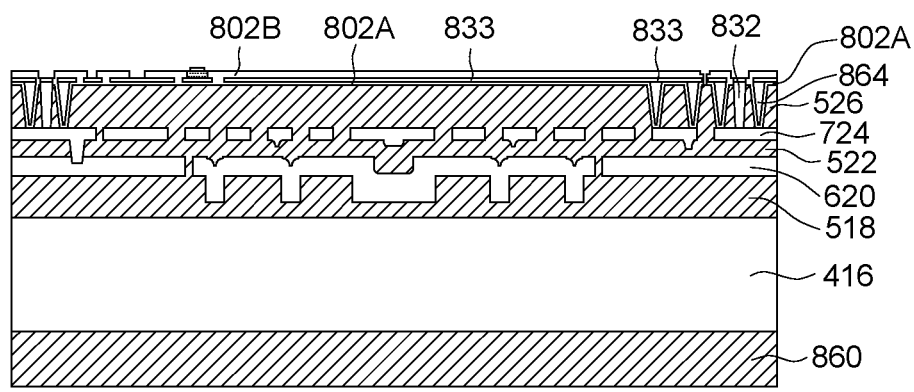
Figure 18W:
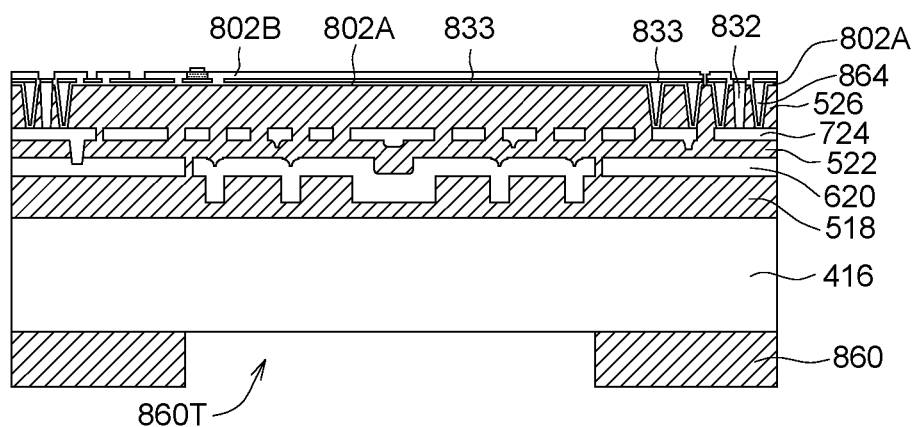
Figure 18X:
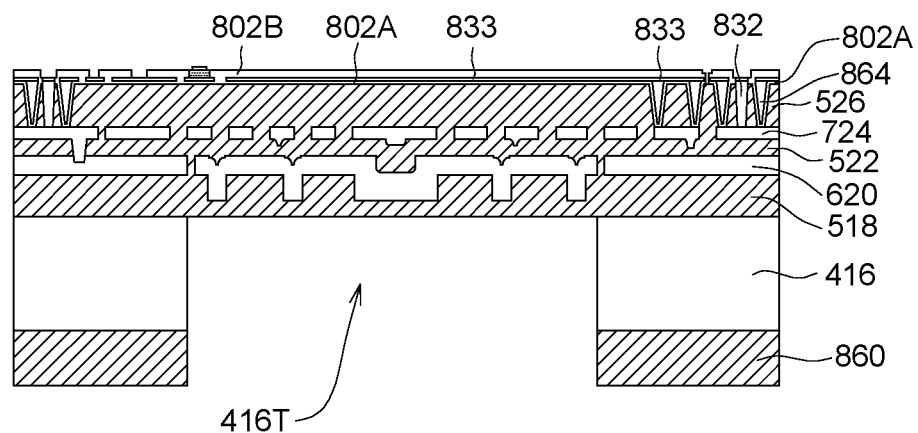
Figure 18Y:
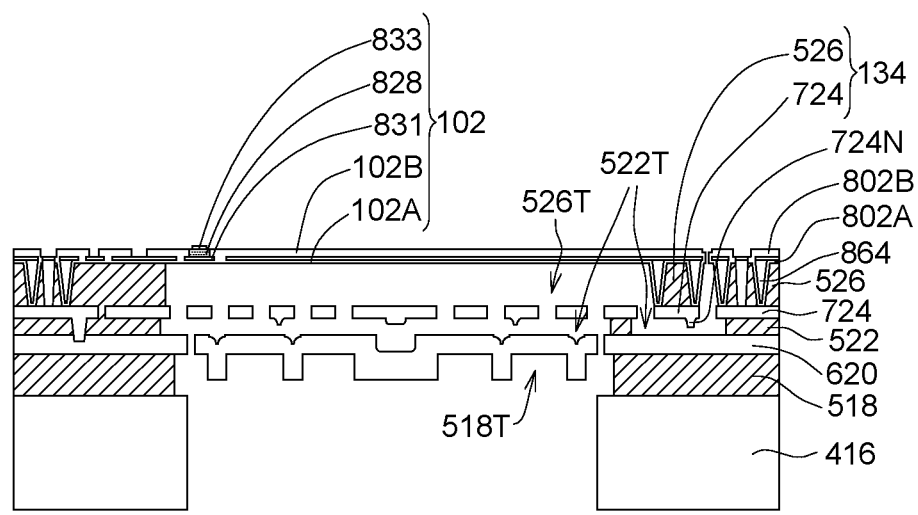
Figures 1, 18Y:
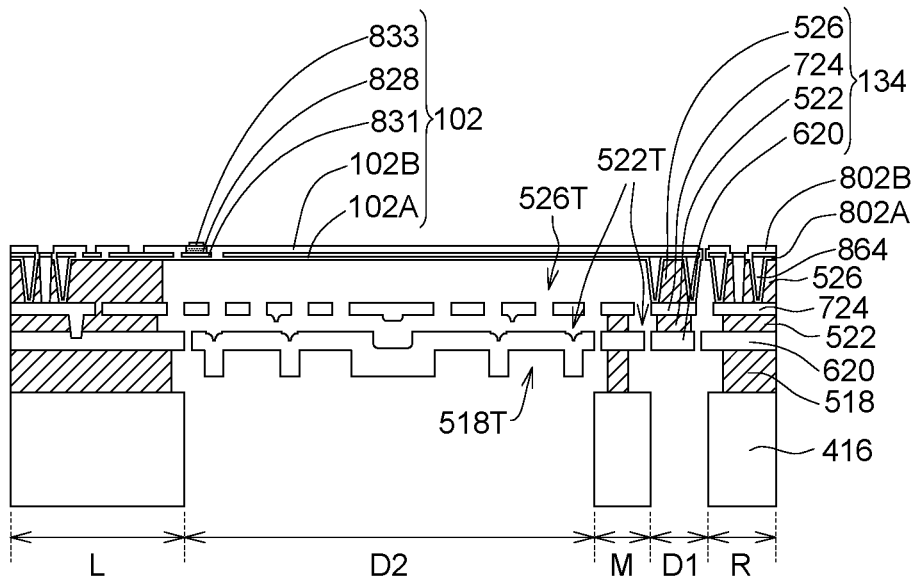
Figures 2, 18Y:
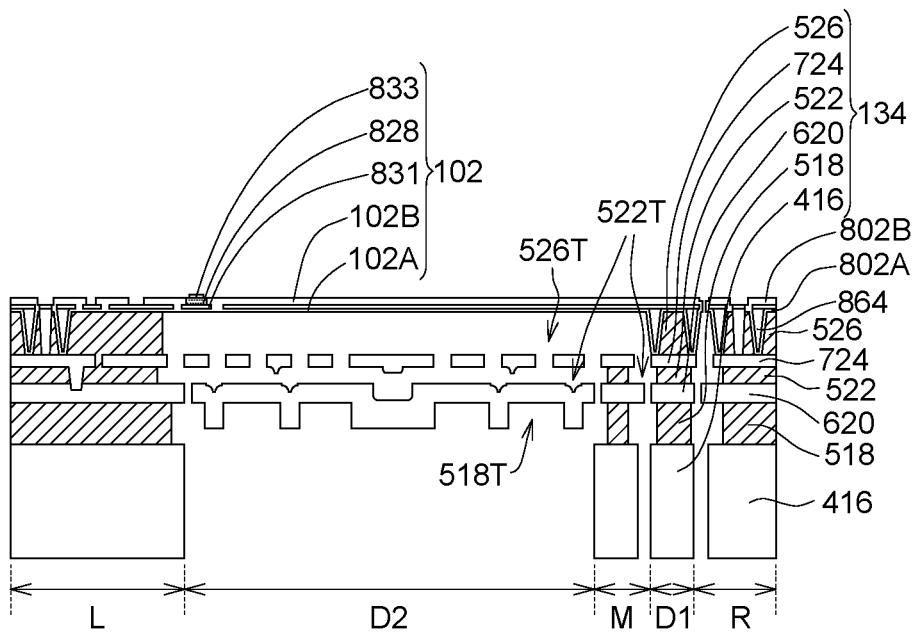
Figures 3, 18Y:
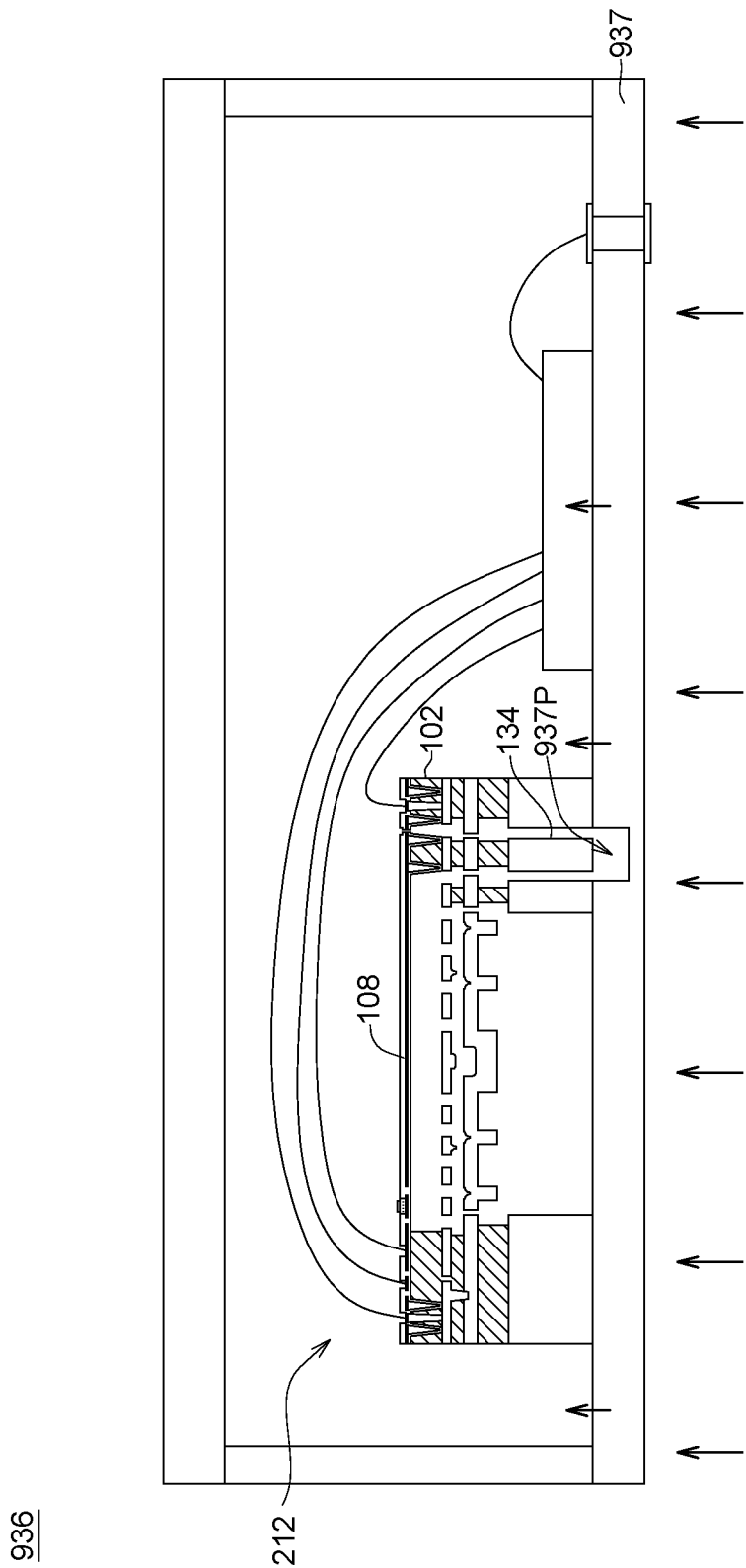

FIG. 18A to FIG. 18Y illustrates a manufacturing method for a micro-electro-mechanical system acoustic sensor according to an embodiment.

Referring to FIG. 18A, the substrate 416 is provided. In an embodiment, the substrate 416 comprises a silicon substrate. However, the present disclosure is not limited thereto. The substrate 416 may comprise other suitable semiconductor materials, such as a silicon on insulator (SOI), that may comprise single crystal silicon. A dielectric layer 519 (second dielectric layer) and a dielectric layer 819 (first dielectric layer) are respectively formed on an upper surface (or front surface) and a lower surface (or back surface) of the substrate 416. In an embodiment, the dielectric layer 519 and the dielectric layer 819 may comprise an oxide such as silicon oxide formed simultaneously by a deposition method, such as a plasma enhanced oxide (PECVD oxide), or an oxide formed by a thermal oxidation process. However, the present disclosure is not limited thereto.

Referring to FIG. 18B, the dielectric layer 519 may be patterned to form a through hole 519Q by using a photolithography etching process. In an embodiment, the through hole 519Q may be a patterned slit used to define a rib or a corrugation to a substance layer (such as the diaphragm film 620) formed thereon. The rib can strengthen stiffness of the diaphragm film 620. The corrugation can be used to abate a residual stress from a semiconductor process, and can increase an elasticity of the diaphragm film 620. However, the present disclosure is not limited thereto.

Referring to FIG. 18C, a dielectric layer 520 (third dielectric layer) is formed on the dielectric layer 519 and in the through hole 519Q to form the dielectric layer 518. The dielectric layer 518 comprises the dielectric layer 519 and the dielectric layer 520. The dielectric layer 518 may have a recess 518U corresponding to the through hole 519Q of the dielectric layer 519. The dielectric layer 520 may comprise an oxide such as silicon oxide, silicon dioxide, tetraethoxysilane (TEOS) silicon oxide formed by a deposition method. However, the present disclosure is not limited thereto.

Referring to FIG. 18D, the diaphragm film 620 is formed on the dielectric layer 518. The diaphragm film 620 has a recess 620U corresponding to the recess 518U of the dielectric layer 518. A sacrificial layer 820 is formed on the dielectric layer 819. The sacrificial layer 820 and the diaphragm film 620 may be formed simultaneously. In an embodiment, the sacrificial layer 820 and the diaphragm film 620 may comprise an identical material, for example comprising a semiconductor material of polysilicon, single crystal silicon, silicon carbide, and so on, formed simultaneously by a deposition method (such as a furnace high temperature process). However, the present disclosure is not limited thereto.

Referring to FIG. 18E, the patterned slit 620Q may be formed in the diaphragm film 620, and the sacrificial layer 820 may be removed by using a photolithography etching process. In a top view, the patterned slit 620Q may have any arbitrary required pattern of a line, a circular shape, a void, etc., which may be used to define a pattern design of the diaphragm film 620, for example, for forming a spring structure, or an air leaking hole pattern, or define an outside pattern of the diaphragm film 620.

Referring to FIG. 18F, a dielectric layer 523 (fourth dielectric layer) is formed on the diaphragm film 620, and to fill the patterned slit 620Q. The dielectric layer 523 may comprise an oxide such as silicon oxide, silicon dioxide, tetraethoxysilane (TEOS) silicon oxide formed by a deposition method, such as a plasma enhanced chemical vapor deposition (PECVD) method. The dielectric layer 523 may have a recess 523U corresponding to the recess 620U and the patterned slit 620Q of the diaphragm film 620. A dielectric layer 823 (fifth dielectric layer) is formed on the dielectric layer 819. The dielectric layer 823 may comprise an oxide such as silicon oxide, silicon dioxide, tetraethoxysilane (TEOS) silicon oxide formed by a deposition method, such as a plasma enhanced chemical vapor deposition (PECVD) method. In embodiments, the dielectric layer 523 and the dielectric layer 823 are formed on separately. However, the present disclosure is not limited thereto. The insulating layer 860 comprises the dielectric layer 819 and the dielectric layer 823.

Referring to FIG. 18G, a through hole 523Q may be formed in the dielectric layer 523 by using a photolithography etching so as to form a dimple to reduce a surface stiction force.

Referring to FIG. 18H, a dielectric layer 524 (sixth dielectric layer) is formed on the dielectric layer 523, and to fill the through hole 523Q. The dielectric layer 522 comprises the dielectric layer 523 and the dielectric layer 524. The dielectric layer 522 has a recess 522U corresponding to the through hole 523Q and the recess 523U of the dielectric layer 523. In an embodiment, the dielectric layer 524 may comprise an oxide such as silicon oxide, silicon dioxide, tetraethoxysilane (TEOS) silicon oxide formed by a deposition method. However, the present disclosure is not limited thereto.

Referring to FIG. 18I, a through hole 522Q may be formed in the dielectric layer 522 by using a photolithography etching process.

Referring to FIG. 18J, the element layer 850 is formed to fill the through hole 522Q (void) to form the via 832. The element layer 850 is formed on an upper surface of the dielectric layer 522 to form the back plate 724. A sacrificial layer 2850 is formed on the lower surface of the insulating layer 860. In an embodiment, the element layer 850 filling the through hole 522Q is a conductive material, and therefore the formed via 832 may be also referred to as conductive via. In another embodiment, the element layer 850 and the sacrificial layer 2850 may comprise a semiconductor material formed simultaneously by a deposition method (such as a furnace high temperature process), such as a semiconductor material of polysilicon, silicon carbide and so on, and may be treated by an ion implantation or doping process so as to make the material having a conductive property. However, the present disclosure is not limited thereto.

Referring to FIG. 18K, the acoustic hole 724Q is formed in the back plate 724.

Referring to FIG. 18L, the dielectric layer 526 (seventh dielectric layer) is formed to fill the acoustic hole 724Q of the back plate 724 and on the back plate 724. In an embodiment, the dielectric layer 526 may comprise an oxide such as silicon oxide, silicon dioxide, tetraethoxysilane (TEOS) silicon oxide formed by a deposition method, such as a plasma enhanced chemical vapor deposition (PECVD) method. However, the present disclosure is not limited thereto.

Referring to FIG. 18M, a through hole 526Q may be formed in the dielectric layer 526 by using a photolithography etching process. The through hole formed in the dielectric layer 526 comprises the through hole 526Q used for forming a conductive element 864 (such as a conductive element of FIG. 18O), and a patterned slit which may have an arbitrary possible required pattern such as a line, a circular shape etc. in a top view of which, which may be used to define a mass.

Referring to FIG. 18N, an element layer 802A (first element layer) is formed on an upper surface of the dielectric layer 526, a sidewall surface of the dielectric layer 526 exposed by through hole (comprising the through hole 526Q), and the upper surface of the back plate 724. The element layer 802A may comprise a dielectric material or an insulating material, such as a nitride, comprising silicon nitride, or silicon-rich silicon nitride formed by a deposition method.

Referring to FIG. 18O, the conductive element 864 (e.g. conductive plug) is formed in through hole (comprising the through hole 526Q). The conductive element 864 may comprise a metal or an alloy of which, such as tungsten. However, the present disclosure is not limited thereto.

Referring to FIG. 18P, the via 832 is formed in the through hole of the dielectric layer 526, and is electrically connected to the back plate 724. The via 832 may comprise a conductive material comprising a metal or an alloy of which, such as tungsten. The via 832 may be also replaced by another conductive element, such as a conductive plug. However, the present disclosure is not limited thereto.

Referring to FIG. 18Q, the electrode layer 831 (first electrode layer) is formed on the element layer 802A, the conductive element 864 and the via 832. The electrode layer 831 may comprise a conductive material, comprising a metal or an alloy of which, such as Cr/Pt or Ti/Pt, and so on. In an embodiment, the Cr may be used as an adhesion layer, adhesive between the Pt layer over the Cr, and the element layer 802A under the Cr. In an embodiment, the Ti may be used as an adhesion layer, adhesive between the Pt layer over the Ti, and the element layer 802A under the Ti. However, the present disclosure is not limited thereto.

Referring to FIG. 18R, the piezoelectric material layer 828 is formed on the electrode layer 831. The piezoelectric material layer 828 may comprise a piezoelectric material such as aluminum nitride (AlN), lead-zirconate-titanate (PZT), zinc oxide (ZnO), lithium niobate (LiNbO$_3$), polyvinylidene difluoride (PVDF), etc. However, the present disclosure is not limited thereto.

Referring to FIG. 18S, the electrode layer 831 may be patterned by using a photolithography etching process.

Referring to FIG. 18T, the electrode layer 833 (second electrode layer) is formed on the element layer 802A and the piezoelectric material layer 828. The electrode layer 833 may comprise a metal or an alloy of which, such as Cr/Au, Cr/AlCu, Ti/Au or Ti/AlCu, wherein Cr, Ti are adhesion layers for Au, AlCu. The electrode layer 833 on an upper surface of the piezoelectric material layer 828 may be used as a top electrode. The electrode layer 833 on the element layer 802A may comprise conductive wirings. The electrode layer 833 may be electrically connected to a bottom electrode metal pad of a bottom electrode through the conductive wiring, and electrically connected to a metal pad top electrode of a top electrode through the conductive wiring.

Referring to FIG. 18U, an element layer 802B (second element layer) is formed on the element layer 802A and the electrode layer 833. The element layer 802B may comprise a dielectric material or an insulating material, such as a nitride, comprising silicon nitride, or silicon-rich silicon nitride formed by a deposition method. The element layer 802B is patterned by a photolithography and etching process to expose an upper surface of the electrode layer 833 to define a metal pad.

Referring to FIG. 18V, the sacrificial layer 2850 may be removed by using an etching method.

Referring to FIG. 18W, a through opening 860T is formed in the insulating layer 860 by using a photolithography etching process.

Referring to FIG. 18X, a through opening 416T may be formed in the substrate 416 by performing an etching step with using the insulating layer 860 as etch mask.

Referring to FIG. 18Y, an etching step may be performed to form a through opening 518T in the dielectric layer 518, form a through opening 522T in the dielectric layer 522, and form a through opening 526T in the dielectric layer 526. The element layer 802A (first element layer) comprises a cantilever layer 102A (first cantilever layer) of the cantilever structure 102. The element layer 802B (second element layer) comprises a cantilever layer 102B (second cantilever layer) of the cantilever structure 102. The cantilever structure 102 comprises the electrode layer 831 and the electrode layer 833 between the cantilever layer 102A and the cantilever layer 102B. The through opening 522T is the first empty gap 76 (which may be also referred to as cavity) between the diaphragm film 620 and the back plate 724, and may be an air gap. The through opening 526T is the empty gap 71 (which may be also referred to as cavity) between the cantilever structure 102 and the back plate 724, and may be an air gap. An etching step may be performed to remove the insulating layer 860. In embodiments, the etching step (or referred to as release process) as shown by FIG. 18Y uses a selective etching method to hollow out the dielectric layer 518, the dielectric layer 522 and the dielectric layer 526 (such as an oxide) so as to form an air gap, and make the diaphragm film 620, the back plate 724, and the cantilever structure 102 being able to suspend/be released. The mass 134 of the cantilever structure 102 comprises portions of the back plate 724 and the dielectric layer 526 in the suspension region. A dimple 724N is between the cantilever structure 102 and the diaphragm film 620 of the diaphragm sensor 672.

Referring to FIG. 18Y-1, a micro-electro-mechanical system acoustic sensor 212 according to another embodiment is illustrated. Differences of the micro-electro-mechanical system acoustic sensors 212 of FIG. 18Y-1 and FIG. 18Y are described as below. The mass 134 of the free cantilever portion 108 of the cantilever structure 102 comprises the portions of the back plate 724, the dielectric layer 526, the dielectric layer 522 and the diaphragm film 620 in the suspension region D1, and the mass 134 does not have the dimple 724N.

Referring to FIG. 18Y-2, a micro-electro-mechanical system acoustic sensor 212 according to yet another embodiment is illustrated. Differences of the micro-electro-mechanical system acoustic sensors 212 of FIG. 18Y-2 and FIG. 18Y-1 are described as below. The mass 134 of the free cantilever portion 108 of the cantilever structure 102 comprises the portions of the back plate 724, the dielectric layer 526, the dielectric layer 522, the diaphragm film 620, the dielectric layer 518 and the substrate 416 in the suspension region D1.

FIG. 18Y-3 illustrates a cross-section view of a micro-electro-mechanical system package structure 936 according to an embodiment, which is different from the micro-electro-mechanical system package structure 936 shown in FIG. 9 with the following description. The micro-electro-mechanical system acoustic sensor 212 may be similar to the micro-electro-mechanical system acoustic sensor 212 as shown in FIG. 18Y-2. The carrier plate 937 has a trench 937P providing an empty space under the mass 134 of the cantilever structure 102, which can avoid touching the carrier plate 937 by the free cantilever portion 108 of the cantilever structure 102 during vibrating.

Figure 19A:
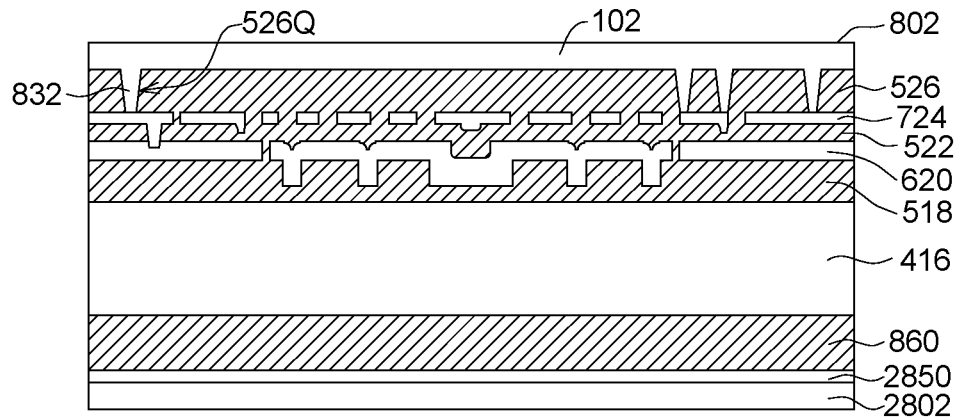
FIG. 19A to FIG. 19G illustrate a manufacturing process flow for a micro-electro-mechanical system acoustic sensor according to an embodiment.

FIG. 19A to FIG. 19G illustrate a manufacturing process flow for the micro-electro-mechanical system acoustic sensor 212 according to an embodiment. In an embodiment, the manufacturing step as shown in FIG. 19A may be performed after the manufacturing step similar to that illustrated with referring to FIG. 18M.

Referring to FIG. 19A, an element layer 802 is formed to fill the through hole 526Q (void) of the dielectric layer 526 to form the via 832. The element layer 802 is formed on the upper surface of the dielectric layer 526 to form the cantilever structure 102 (or cantilever layer). A sacrificial layer 2802 is formed on a lower surface of the sacrificial layer 2850. In an embodiment, the element layer 802 filling the through hole 526Q is a conductive material, and therefore the formed via 832 may be also referred to as conductive via. In another embodiment, the element layer 802 and the sacrificial layer 2802 may comprise a semiconductor material formed simultaneously, such as a semiconductor material of polysilicon, silicon carbide and so on, and may be treated by an ion implantation or doping process so as to make the material having a conductive property. However, the present disclosure is not limited thereto.

Figure 19B:
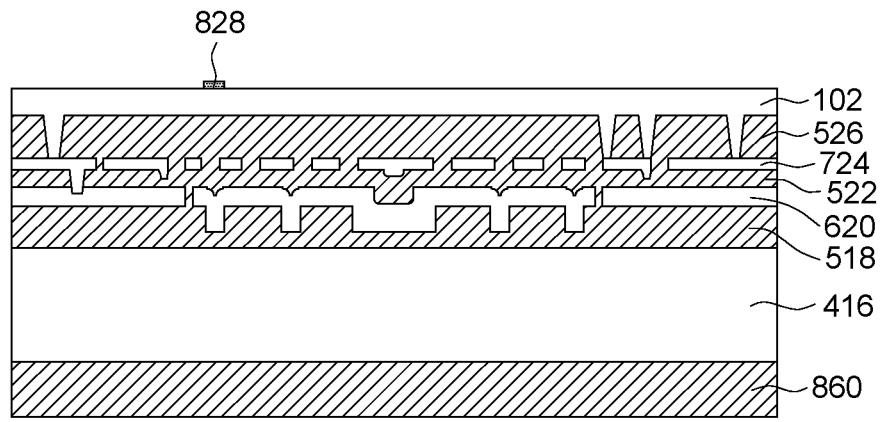

Referring to FIG. 19B, the piezoelectric material layer 828 is formed on the cantilever structure 102. In an embodiment, the piezoelectric material layer 828 is formed on the cantilever structure 102 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102. The sacrificial layer 2802 and the sacrificial layer 2850 are removed.

Figure 19C:
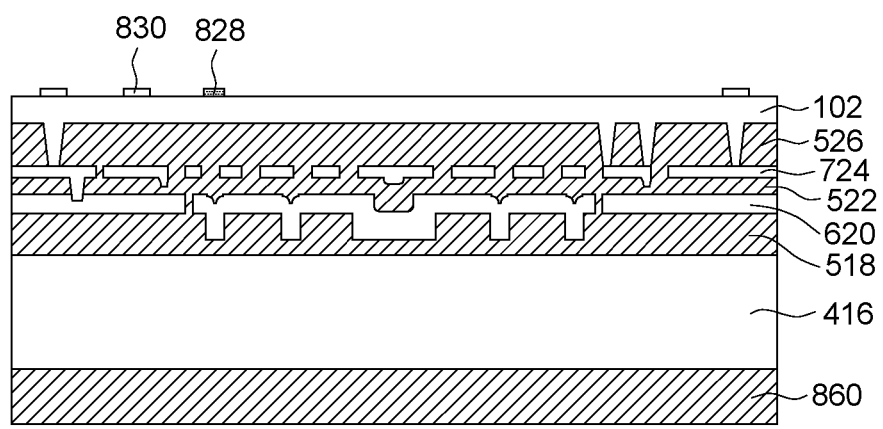

Referring to FIG. 19C, the electrode layer 830 is formed on the cantilever structure 102. The electrode layer 830 may comprise a metal or an alloy of which, such as Cr/Au, Cr/AlCu, Ti/Au or Ti/AlCu, wherein the Cr and the Ti are adhesion layers of the Au and the AlCu.

Figure 19D:
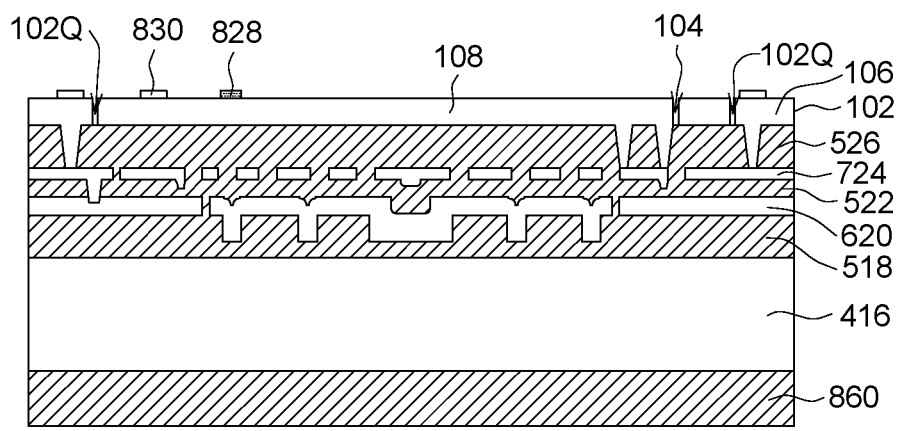

Referring to FIG. 19D, a through hole 102Q is formed in the cantilever structure 102. The through hole 102Q may be a patterned slit used for a pad isolation. The slit 104 is formed in the cantilever structure 102, defining the fixed portion 106 and the free cantilever portion 108 of the cantilever structure 102.

Figure 19E:
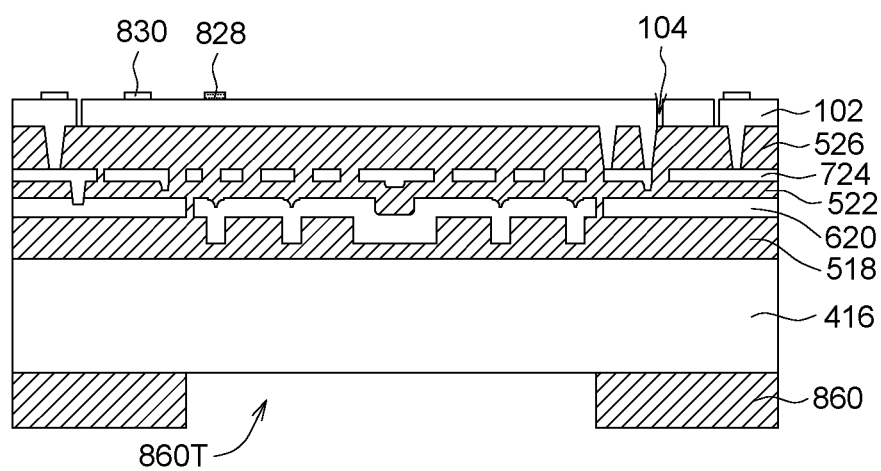

Referring to FIG. 19E, the through opening 860T is formed in the insulating layer 860.

Figure 19F:
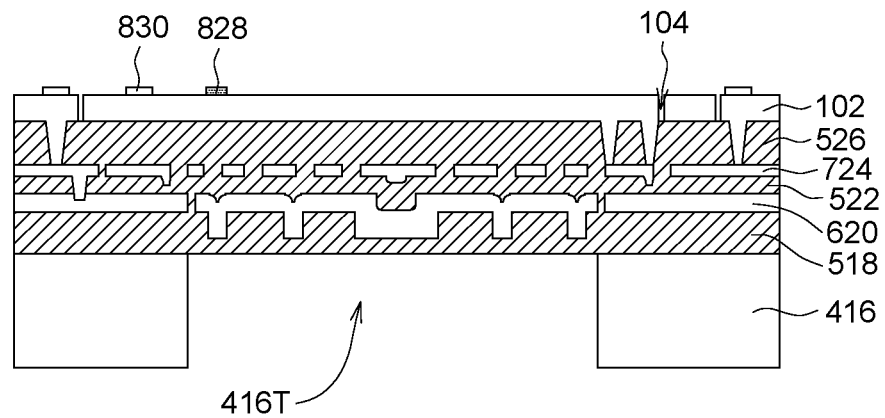

Referring to FIG. 19F, the through opening 416T is formed in the substrate 416. The insulating layer 860 is removed.

Figure 19G:
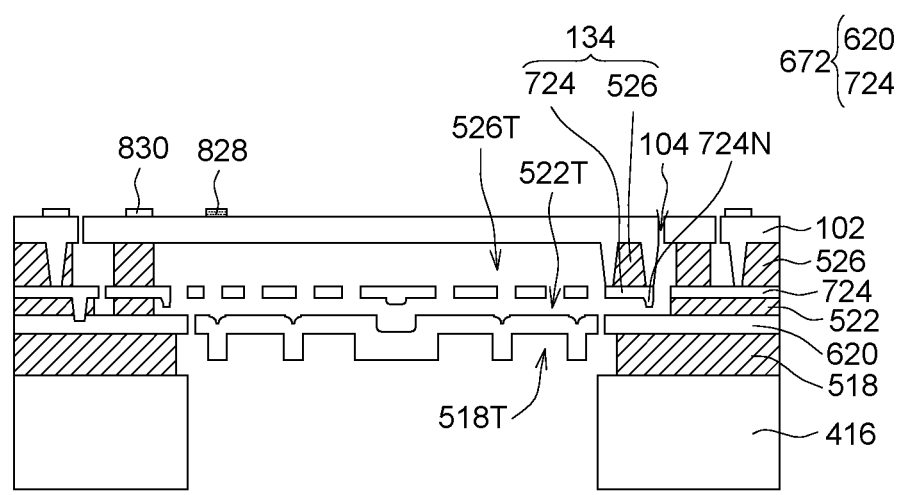

Referring to FIG. 19G, the through opening 518T may be formed in the dielectric layer 518. The through opening 522T may be formed in the dielectric layer 522 so as to expose the dimple 724N of the back plate to reduce the surface stiction force. The through opening 526T may be formed in the dielectric layer 526. The mass 134 of the cantilever structure 102 comprises portions of the back plate 724 and the dielectric layer 526 in the suspension region. The dimple 724N is between the cantilever structure 102 and the diaphragm film 620 of the diaphragm sensor 672.

Figure 20A:
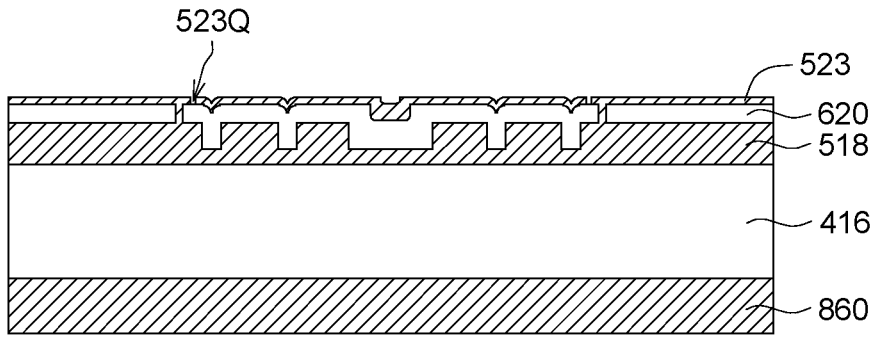
FIG. 20A to FIG. 20N illustrate a manufacturing process flow for a micro-electro-mechanical system acoustic sensor according to an embodiment.
Figure 20B:
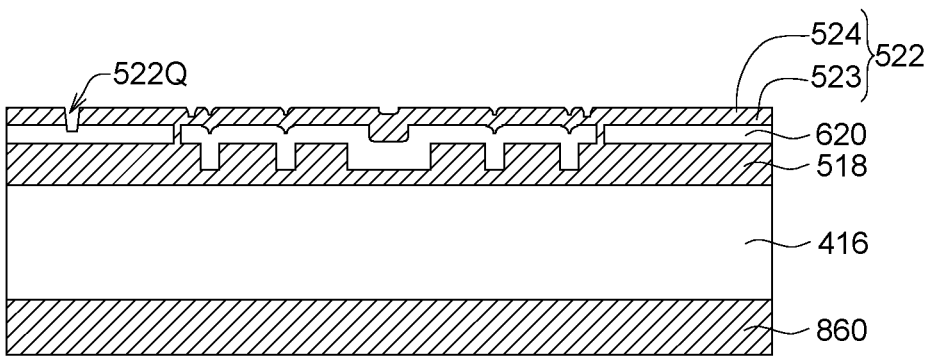
Figure 20C:
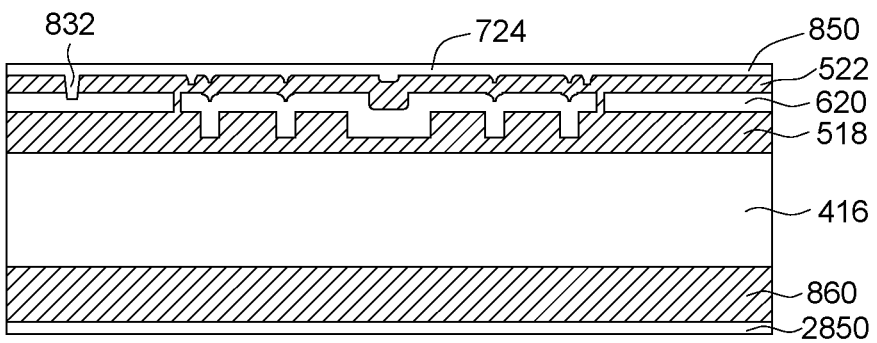
Figure 20D:
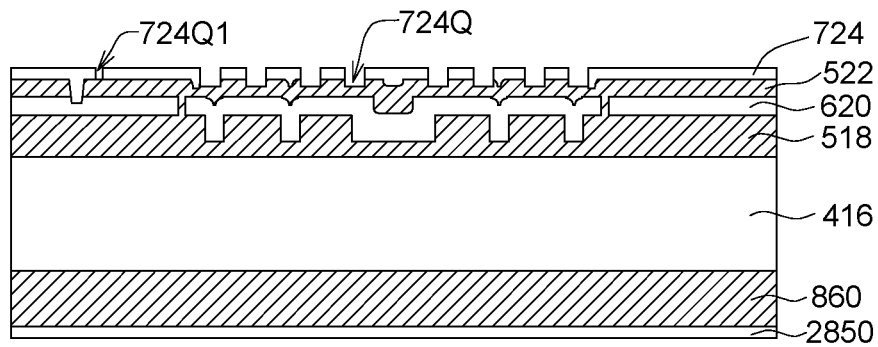
Figure 20E:
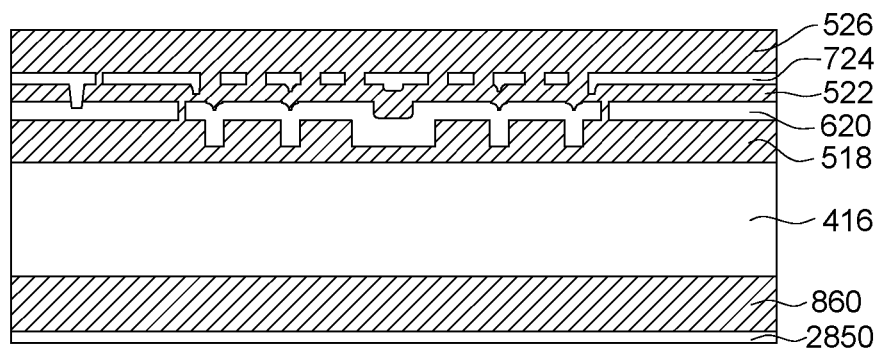
Figure 20F:
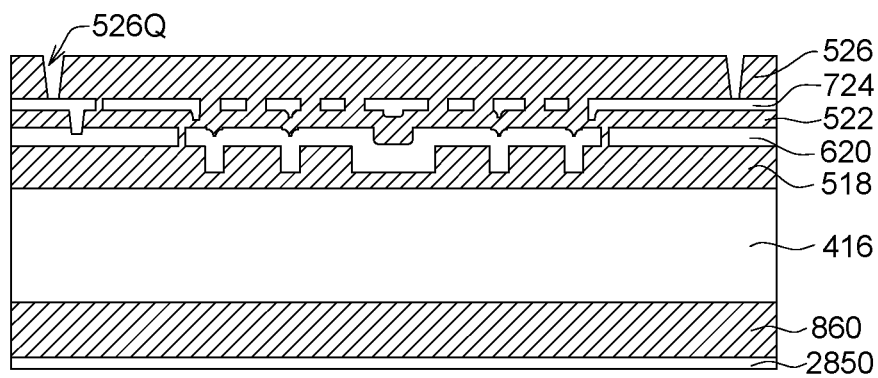
Figure 20G:
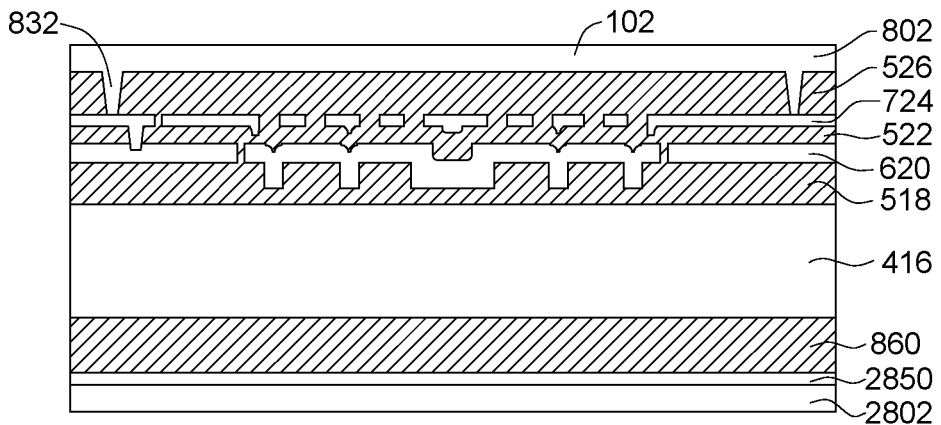
Figure 20H:
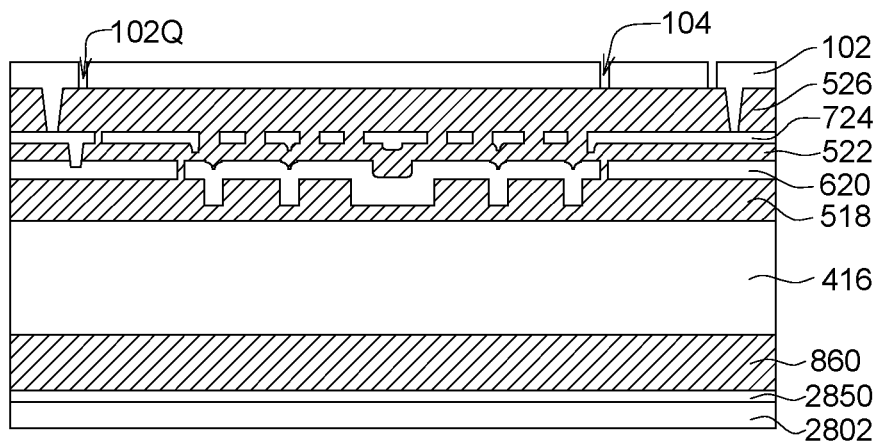
Figure 20I:
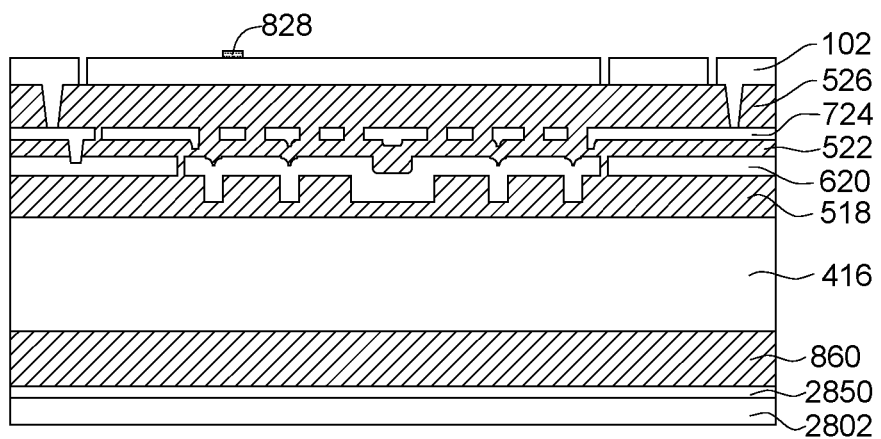
Figure 20J:
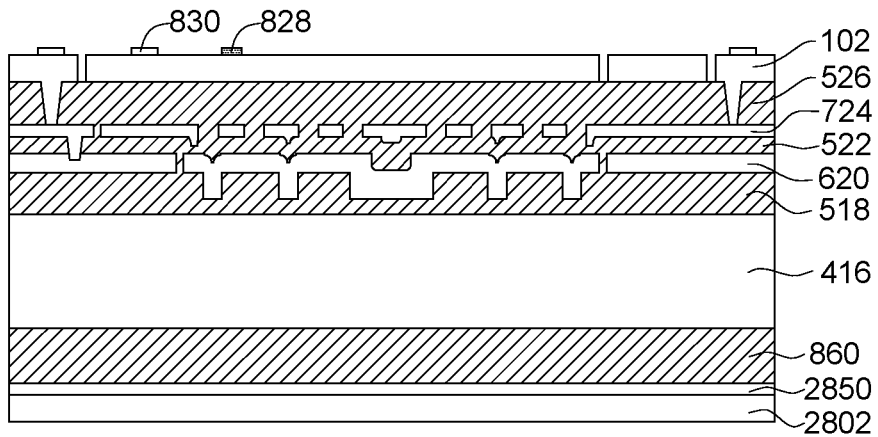
Figure 20K:
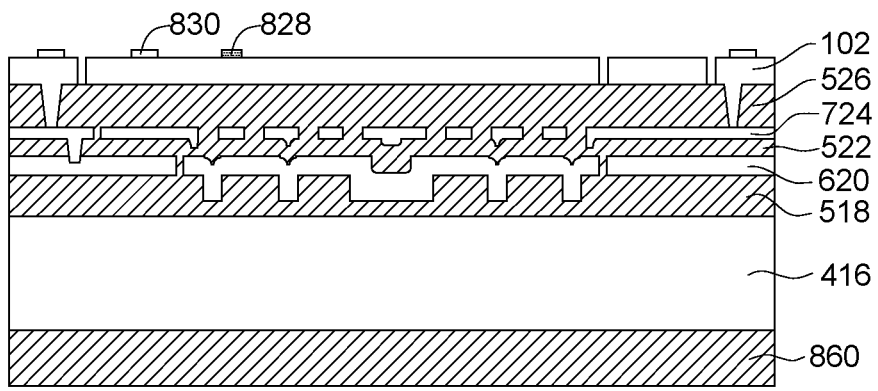
Figure 20L:
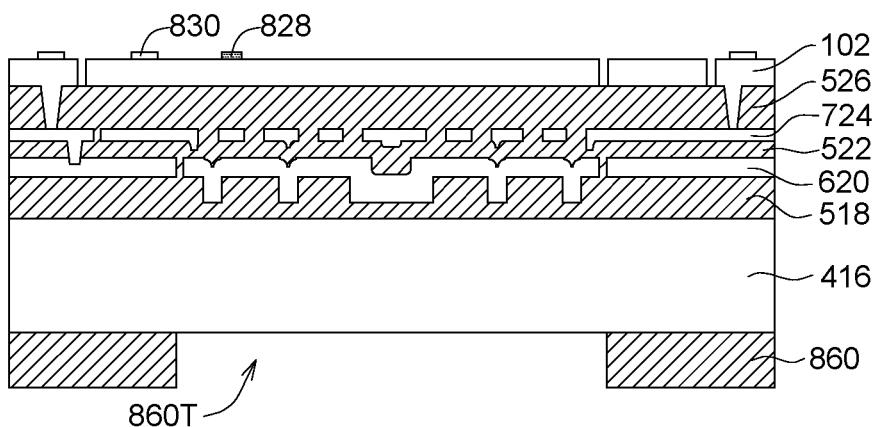
Figure 20M:
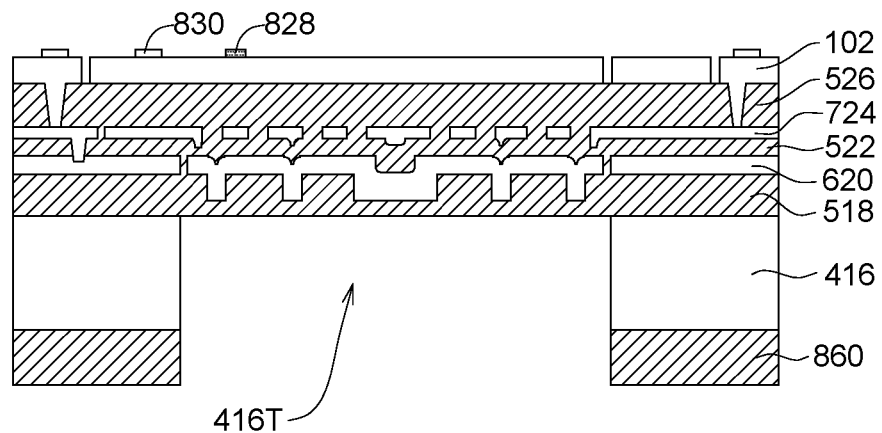
Figure 20N:
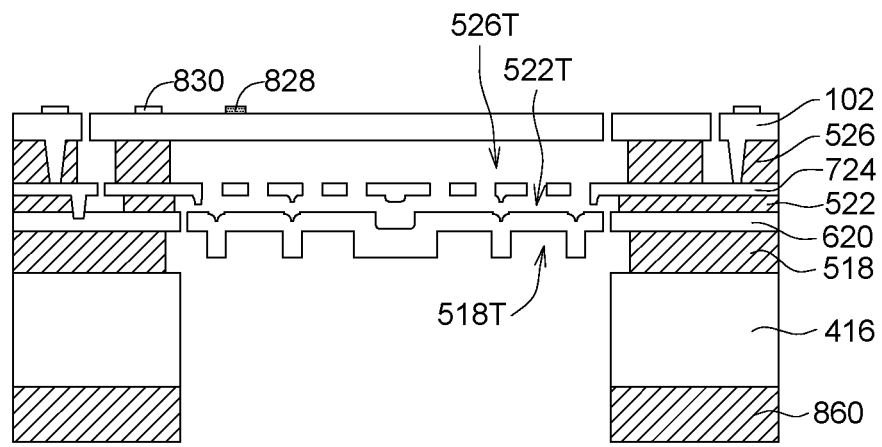

FIG. 20A to FIG. 20N illustrate a manufacturing process flow for the micro-electro-mechanical system acoustic sensor 212 according to an embodiment. In an embodiment, the manufacturing step as shown in FIG. may be performed after the manufacturing step similar to that illustrated with referring to FIG. 18F.

Referring to FIG. 20A, the through hole 523Q may be formed in the dielectric layer 523 so as to form the dimple to reduce the surface stiction force.

Referring to FIG. 20B, the dielectric layer 524 is formed on the dielectric layer 523 to form the dielectric layer 522. The through hole 522Q is formed in the dielectric layer 522.

Referring to FIG. 20C, the element layer 850 is formed to fill the through hole 522Q (void) to form the via 832. The element layer 850 is formed on the upper surface of the dielectric layer 522 to form the back plate 724. The sacrificial layer 2850 is formed on the lower surface of the insulating layer 860. In an embodiment, the element layer 850 filling the through hole 522Q is a conductive material, and therefore the formed via 832 may be also referred to as conductive via. In another embodiment, the element layer 850 and the sacrificial layer 2850 may comprise a semiconductor material formed simultaneously by a deposition method (such as a furnace high temperature process), such as a semiconductor material of polysilicon, silicon carbide and so on, and may be treated by an ion implantation or doping process so as to make the material having a conductive property. However, the present disclosure is not limited thereto.

Referring to FIG. 20D, the acoustic hole 724Q and a through hole 724Q1 are formed in the back plate 724. The through hole 724Q1 may be a patterned slit used for defining a pad (diaphragm pad) for electrically connecting to the diaphragm film 620.

Referring to FIG. 20E, the dielectric layer 526 is formed on the back plate 724 and to fill the acoustic hole 724Q and the through hole 724Q1.

Referring to FIG. 20F, the through hole 526Q is formed in the dielectric layer 526.

Referring to FIG. 20G, the element layer 802 is formed to fill the through hole 526Q (void) to form the via 832. The element layer 802 is formed on the upper surface of the dielectric layer 526 to form the cantilever structure 102 (or cantilever layer). The sacrificial layer 2802 is formed on the lower surface of the sacrificial layer 2850. In an embodiment, the element layer 802 and the sacrificial layer 2802 may comprise a semiconductor material formed simultaneously by using a deposition process (such as a furnace high temperature process), such as a semiconductor material of polysilicon, silicon carbide and so on, and may be treated by an ion implantation or doping process so as to make the material having a conductive property. However, the present disclosure is not limited thereto.

Referring to FIG. 20H, the through hole 102Q and the slit 104 are formed in the cantilever structure 102. The through hole 102Q may be a patterned slit used for a pad isolation.

Referring to FIG. 20I, the piezoelectric material layer 828 is formed on the cantilever structure 102. In an embodiment, the piezoelectric material layer 828 may be formed on the cantilever structure 102 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102.

Referring to FIG. 20J, the electrode layer 830 is formed on the cantilever structure 102.

Referring to FIG. 20K, the sacrificial layer 2802 and the sacrificial layer 2850 are removed.

Referring to FIG. 20L, the through opening 860T is formed in the insulating layer 860.

Referring to FIG. 20M, the through opening 416T is formed in the substrate 416.

Referring to FIG. 20N, the through opening 518T may be formed in the dielectric layer 518. The through opening 522T may be formed in the dielectric layer 522. The through opening 526T may be formed in the dielectric layer 526.

Figure 21A:
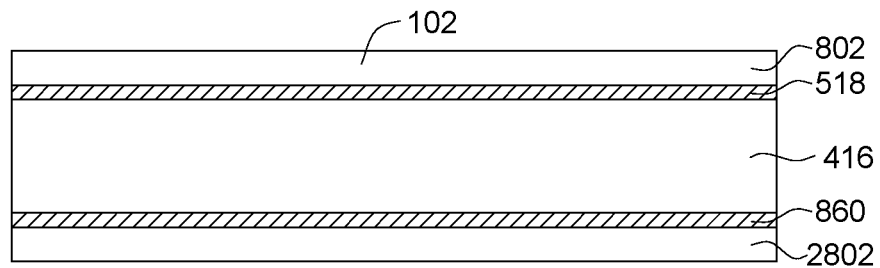
FIG. 21A to FIG. 21T illustrate a manufacturing process flow for a micro-electro-mechanical system acoustic sensor according to an embodiment.
Figure 21B:
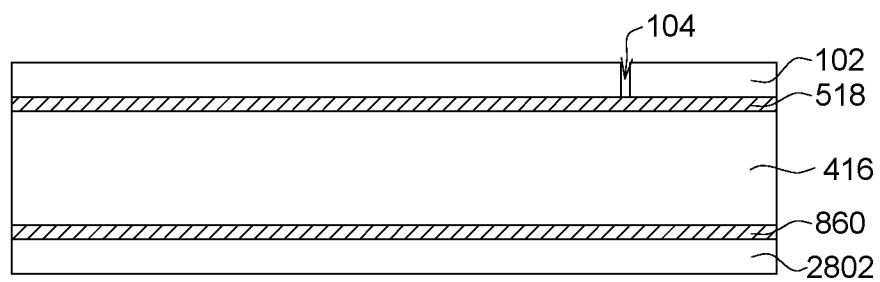
Figure 21C:
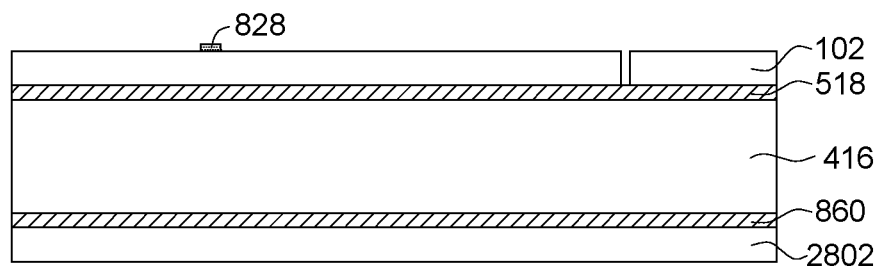
Figure 21D:
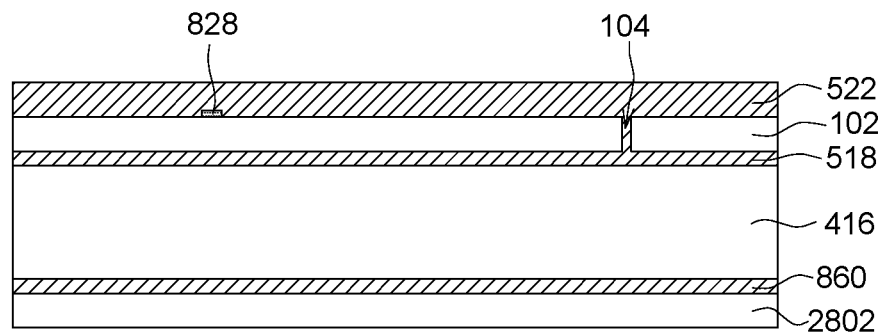
Figure 21E:
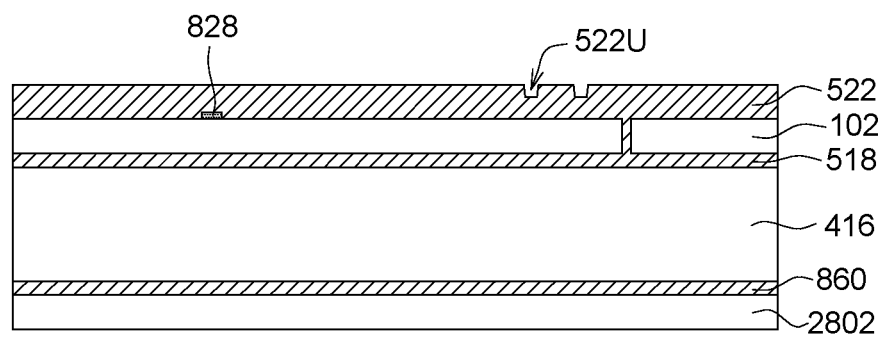
Figure 21F:
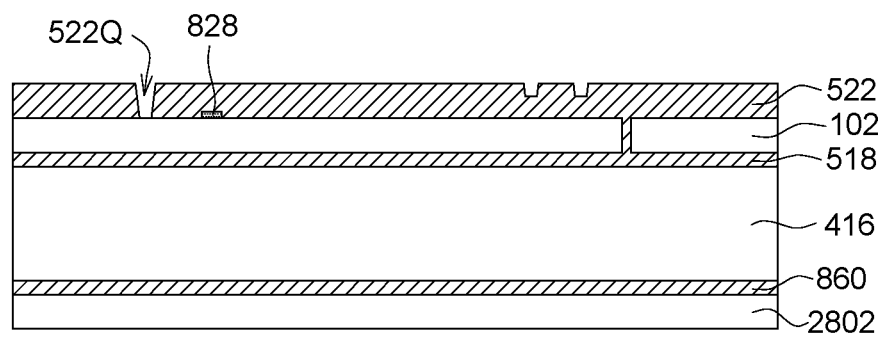
Figure 21G:
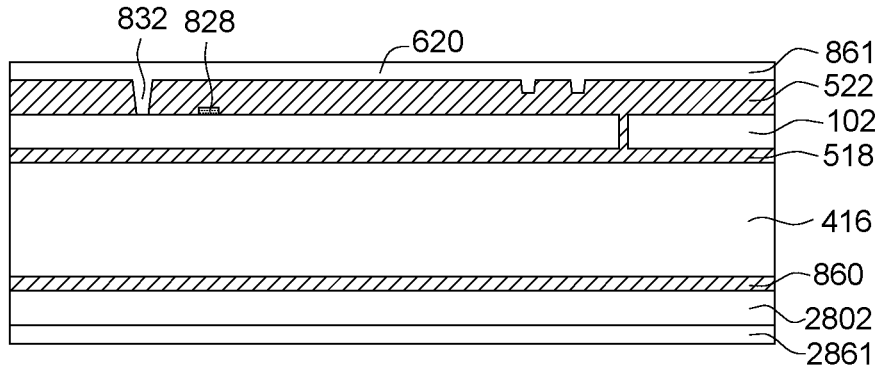
Figure 21H:
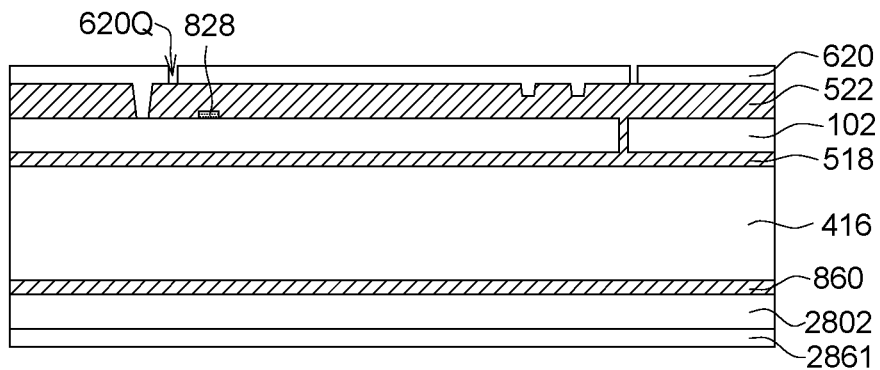
Figure 21I:
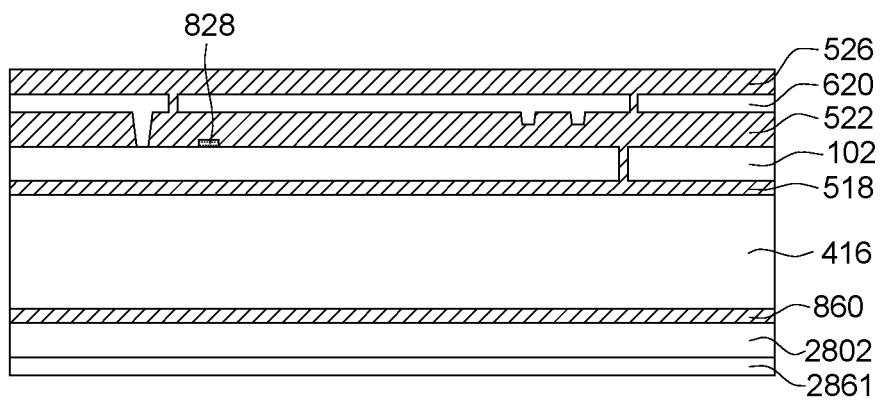
Figure 21J:
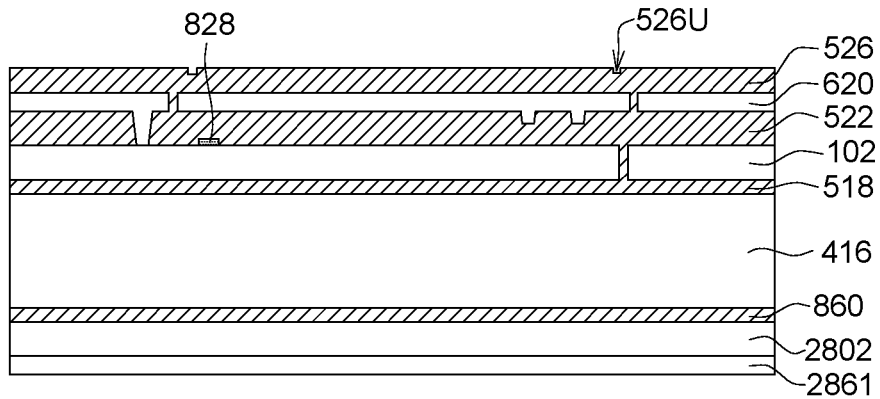
Figure 21K:
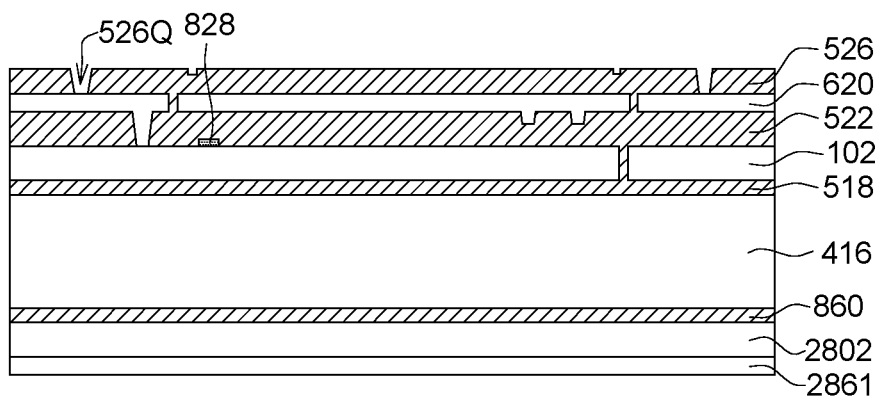
Figure 21L:
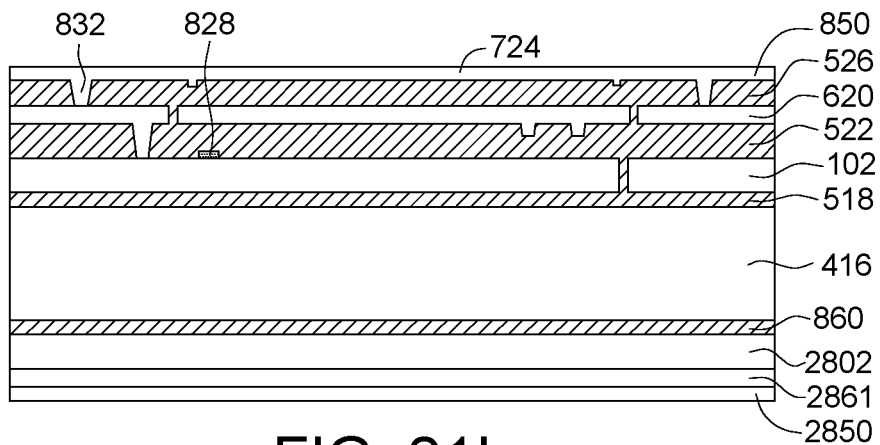
Figure 21M:
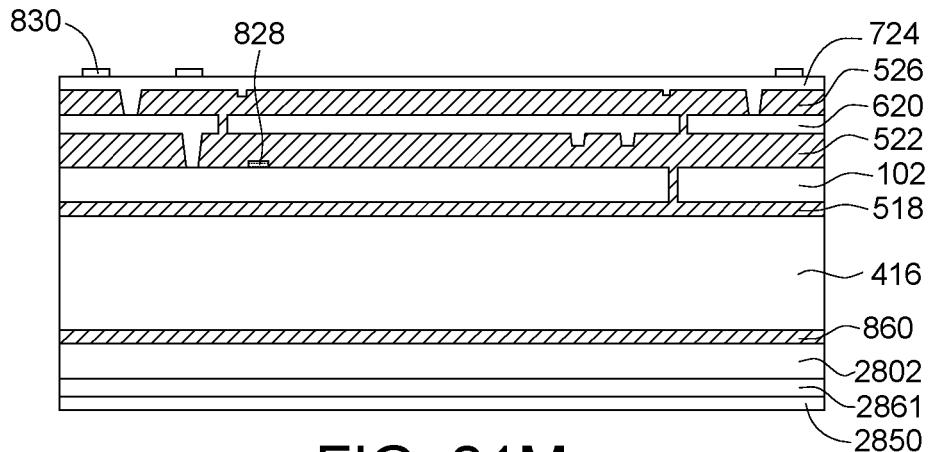
Figure 21N:
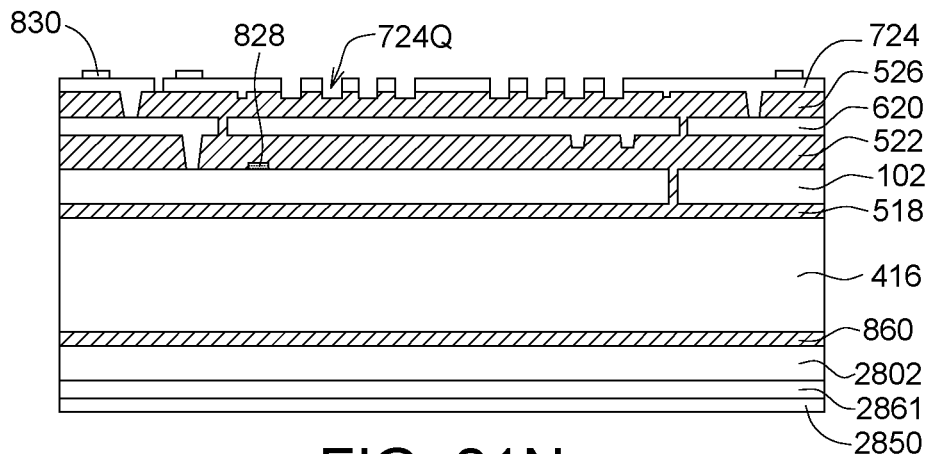
Figure 21O:
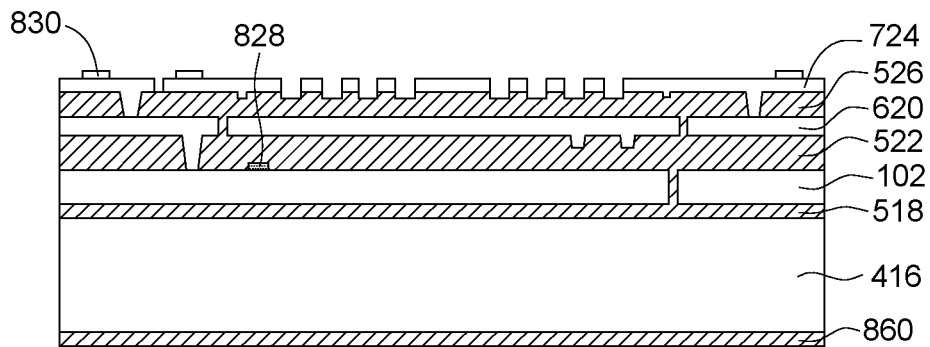
Figure 21P:
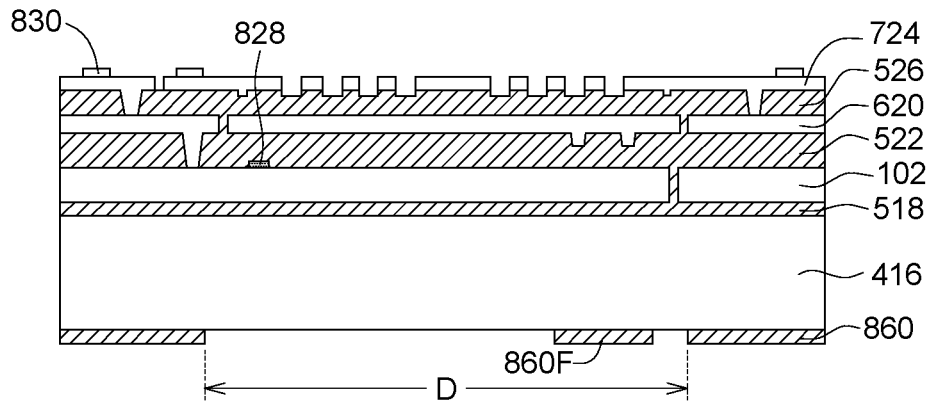
Figure 21Q:
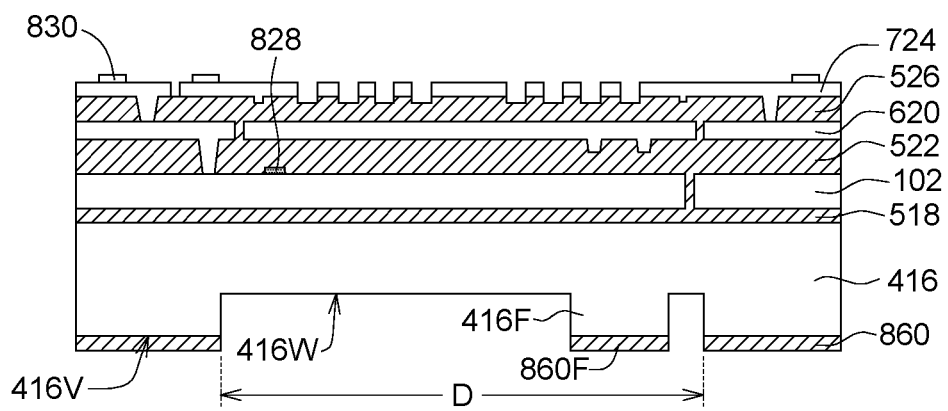
Figure 21R:
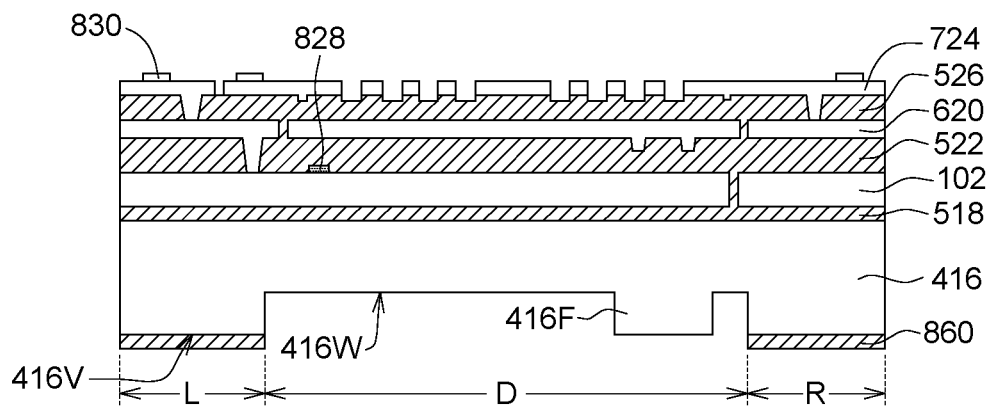
Figure 21S:
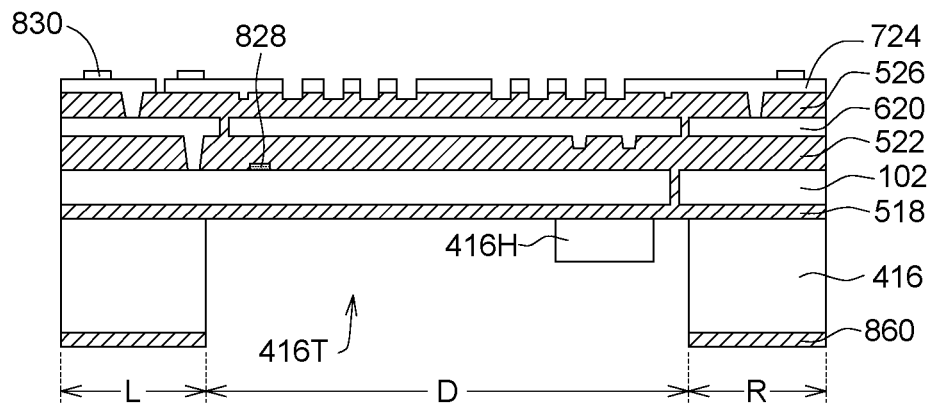
Figure 21T:
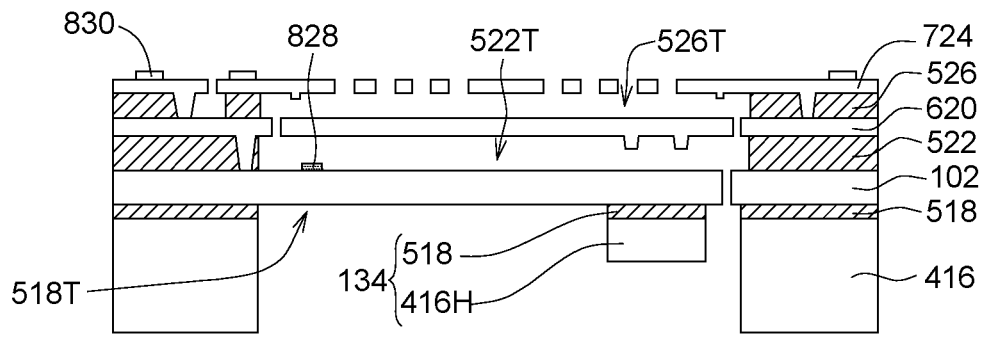
Figures 1, 21T:
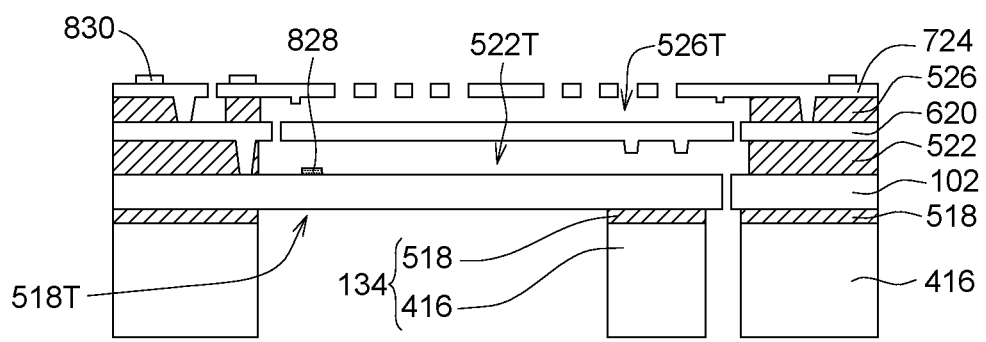
Figures 2, 21T:
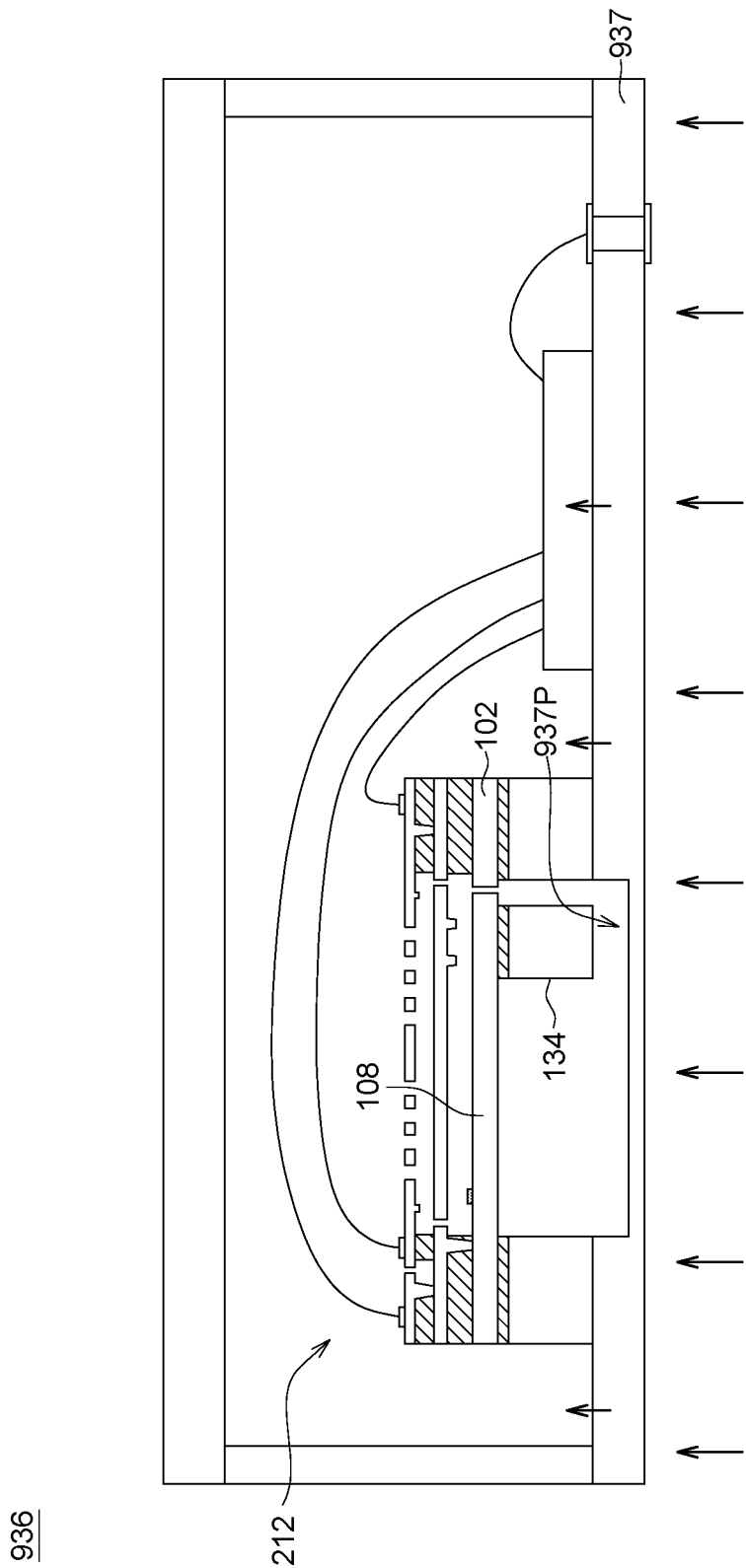

FIG. 21A to FIG. 21T illustrate a manufacturing process flow for the micro-electro-mechanical system acoustic sensor 212 according to an embodiment. In an embodiment, the manufacturing step as shown in FIG. 21A may be performed after the manufacturing step similar to that illustrated with referring to FIG. 18A.

Referring to FIG. 21A, the element layer 802 is formed on an upper surface of the dielectric layer 518 to form the cantilever structure 102 (or cantilever layer). The element layer 802 may comprise a semiconductor material of polysilicon, single crystal silicon, silicon carbide, and so on. The sacrificial layer 2802 is formed on the lower surface of the insulating layer 860.

Referring to FIG. 21B, the slit 104 is formed in the cantilever structure 102.

Referring to FIG. 21C, the piezoelectric material layer 828 is formed on the cantilever structure 102. In an embodiment, the piezoelectric material layer 828 may be formed on the cantilever structure 102 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102.

Referring to FIG. 21D, the dielectric layer 522 (third dielectric layer) is formed on the cantilever structure 102 and the piezoelectric material layer 828, and to fill the slit 104.

Referring to FIG. 21E, the recess 522U is formed on the dielectric layer 522. In an embodiment, the recess 522U may be used to define a rib, a corrugation, or a dimple to a substance layer (such as the diaphragm film 620) formed thereon. However, the present disclosure is not limited thereto.

Referring to FIG. 21F, the through hole 522Q is formed in the dielectric layer 522.

Referring to FIG. 21G, an element layer 861 is formed on the dielectric layer 522, and to fill the through hole 522Q. The element layer 861 may comprise a semiconductor material of polysilicon, silicon carbide and so on, and may be treated by an ion implantation or doping process so as to make the material having a conductive property. The element layer 861 formed in the through hole 522Q (void) may be used as the via 832. The element layer 861 formed on the upper surface of the dielectric layer 522 may be used as the diaphragm film 620. A sacrificial layer 2861 is formed on the sacrificial layer 2802.

Referring to FIG. 21H, the patterned slit 620Q is formed in the diaphragm film 620.

Referring to FIG. 21I, the dielectric layer 526 (fourth dielectric layer) is formed on the diaphragm film 620, and to fill the patterned slit 620Q.

Referring to FIG. 21J, a recess 526U is formed on the dielectric layer 526.

Referring to FIG. 21K, a through hole 526Q (second through hole) is formed in the dielectric layer 526.

Referring to FIG. 21L, the element layer 850 is formed on the dielectric layer 526 and filling the through hole 526Q. The element layer 850 formed in the through hole 526Q (void) may be used as the via 832. The element layer 850 formed on the upper surface of the dielectric layer 526 may be used as the back plate 724. The sacrificial layer 2850 is formed on a lower surface of the sacrificial layer 2861. The element layer 850 and the sacrificial layer 2850 may comprise a semiconductor material of polysilicon, silicon carbide and so on, formed simultaneously by a deposition method, and may be treated by an ion implantation or doping process so as to make the material having a conductive property. However, the present disclosure is not limited thereto.

Referring to FIG. 21M, the electrode layer 830 is formed on the back plate 724. The electrode layer 830 may comprise a metal pad.

Referring to FIG. 21N, the acoustic hole 724Q is formed in the back plate 724.

Referring to FIG. 21O, the sacrificial layer 2850, the sacrificial layer 2861 and the sacrificial layer 2802 are removed.

Referring to FIG. 21P, the insulating layer 860 is patterned. The patterned insulating layer 860 comprises a material pattern 860F in a suspension region D.

Referring to FIG. 21Q, the pattern of the insulating layer 860 is transferred into a region of a partial thickness of the substrate 416 from the lower surface of the substrate 416. The patterned substrate 416 comprises a substrate projection portion 416F formed by a portion of the substrate 416 not removed by being protected by the material pattern 860F in the suspension region D. The substrate projection portion 416F has an original lower surface 416V of the substrate 416, and a lower surface 416W formed by transferring the exposed substrate 416 through the etching.

Referring to FIG. 21R, the material pattern 860F of the insulating layer 860 the suspension region D is removed, and the insulating layer 860 in the support region L and the support region R is remained.

Referring to FIG. 21S, the portion of the substrate 416 in the suspension region D may be removed by an anisotropic etching method along the thickness direction (or the vertical direction), until a lower surface of the dielectric layer 518 is exposed, and the portion of the substrate 416 corresponding to the substrate projection portion 416F is remained to form a substrate section 416H on the lower surface of the dielectric layer 518, and the through opening 416T is formed.

Referring to FIG. 21T, the portion of the dielectric layer 518 not covered by the substrate 416 (comprising the substrate section 416H) may be removed to form the mass 134, and to form the through opening 518T. The mass 134 comprises the dielectric layer 518 and the substrate section 416H of the substrate 416. Portions of the dielectric layer 522 and the dielectric layer 526 are removed to form the through opening 522T and the through opening 526T respectively.

Referring to FIG. 21T-1, a micro-electro-mechanical system acoustic sensor 212 according to another embodiment is illustrated. Differences of the micro-electro-mechanical system acoustic sensors 212 of FIG. 21T-1 and FIG. 21T are described as below. The mass 134 comprises the dielectric layer 518 and the substrate 416.

FIG. 21T-2 illustrates a cross-section view of a micro-electro-mechanical system package structure 936 according to an embodiment, which is different from the micro-electro-mechanical system package structure 936 shown in FIG. 9 with the following description. The micro-electro-mechanical system acoustic sensor 212 may be similar to the micro-electro-mechanical system acoustic sensor 212 as shown in FIG. 21T-1. The carrier plate 937 has the trench 937P under the free cantilever portion 108 of the cantilever structure 102, providing the empty space, which can avoid touching the carrier plate 937 by the mass 134 during vibrating of the free cantilever portion 108.

Figure 22G:
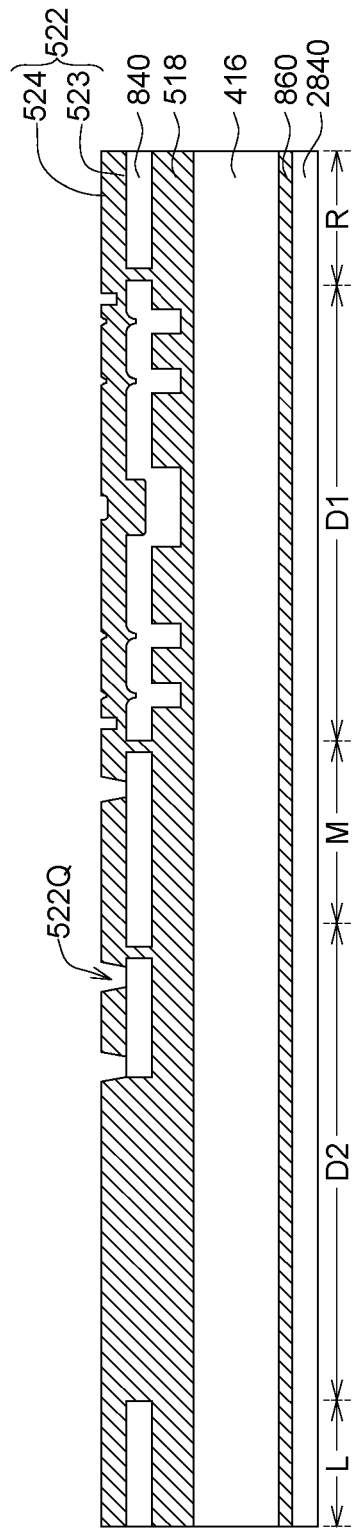
FIG. 22A to FIG. 22P illustrate a manufacturing process flow for a micro-electro-mechanical system acoustic sensor according to an embodiment.
Figure 22H:
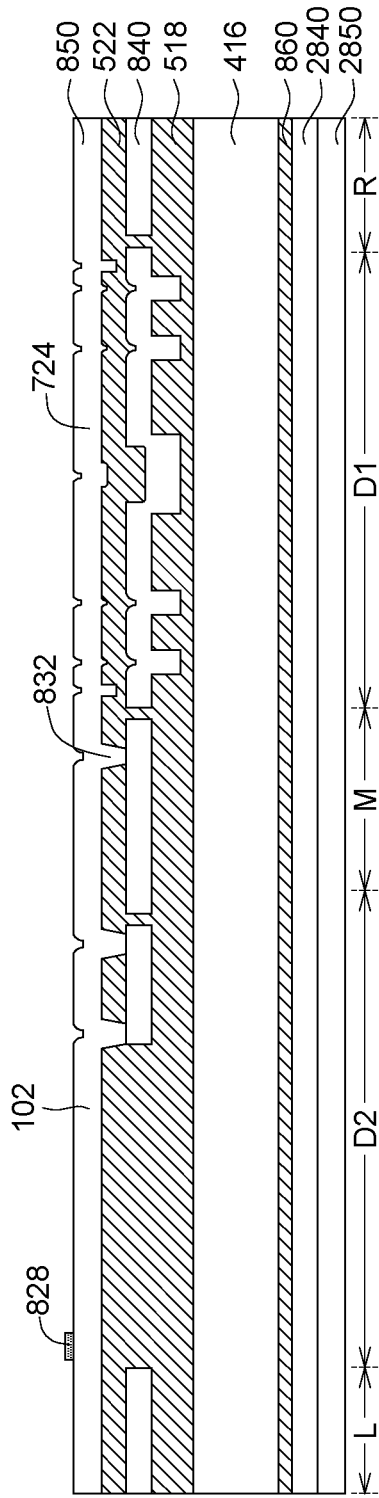
Figures 1, 22P:
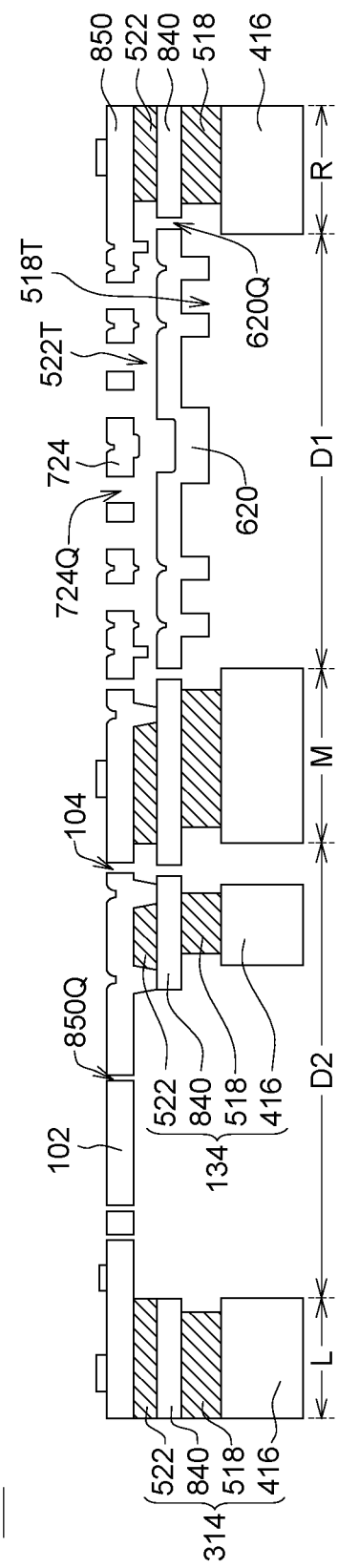
Figures 2, 22P:
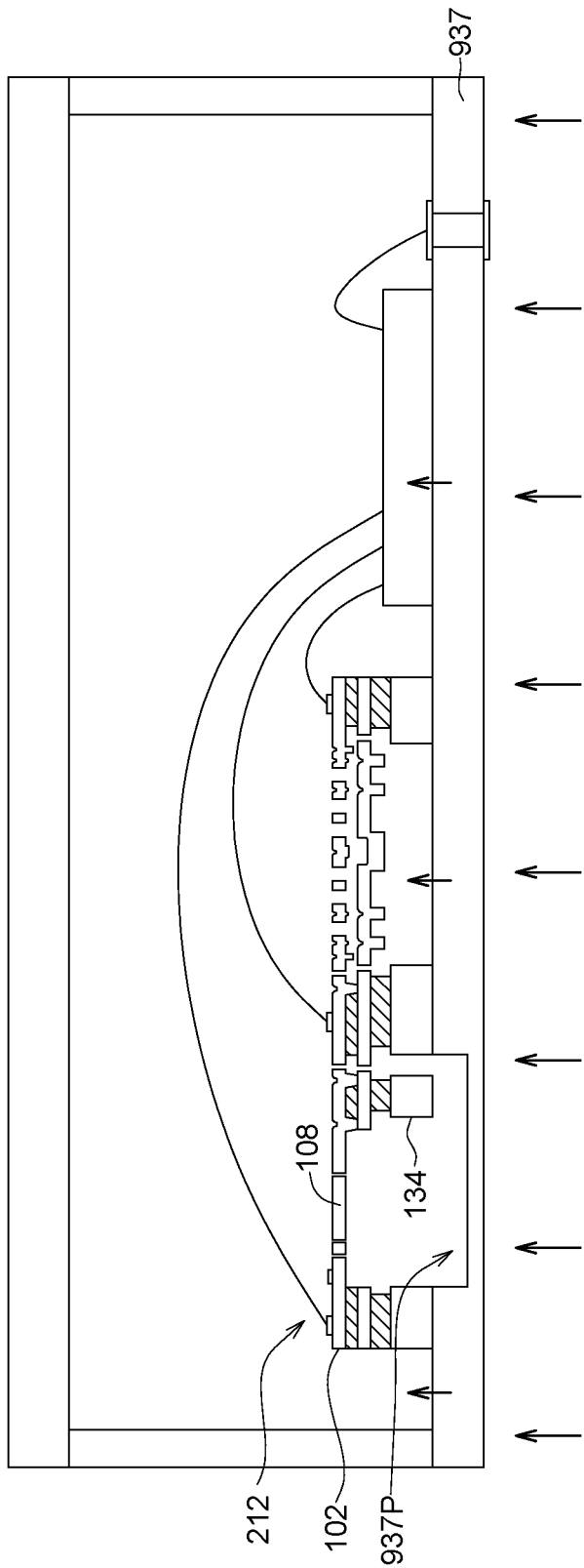

FIG. 22A to FIG. 22P illustrate a manufacturing process flow for the micro-electro-mechanical system acoustic sensor 212 according to an embodiment. In an embodiment, the manufacturing step as shown in FIG. 22A may be performed after the manufacturing step similar to that illustrated with referring to FIG. 18A.

Referring to FIG. 22A, the through hole 519Q is formed in the dielectric layer 519 (second dielectric layer) in the suspension region D1 (e.g. first suspension region). In an embodiment, the through hole 519Q may be a patterned slit used to define a rib or a corrugation to a substance layer (such as the diaphragm film 620) formed thereon. However, the present disclosure is not limited thereto.

Referring to FIG. 22B, the dielectric layer 520 (third dielectric layer) is formed on the dielectric layer 519. The dielectric layer 518 comprises the dielectric layer 519 and the dielectric layer 520.

Referring to FIG. 22C, the element layer 840 (first element layer) is formed on the dielectric layer 518. The element layer 840 comprises the diaphragm film 620 in the suspension region D1. The sacrificial layer 2840 is formed on a lower surface of the insulating layer 860 (or dielectric layer, or first dielectric layer).

Referring to FIG. 22D, the element layer 840 is patterned to form a through opening 840T and a through hole 840Q in the element layer 840, and form the patterned slit 620Q in the diaphragm film 620 of the element layer 840.

Referring to FIG. 22E, the dielectric layer 523 (fourth dielectric layer) is formed on the element layer 840 and filling the through opening 840T, the through hole 840Q and the patterned slit 620Q.

Referring to FIG. 22F, the through hole 523Q is formed in the dielectric layer 523. In an embodiment, a dimple may be formed by this step so as to reduce the surface stiction force.

Referring to FIG. 22G, the dielectric layer 524 (fifth dielectric layer) is formed on the dielectric layer 523. The dielectric layer 522 comprises the dielectric layer 523 and the dielectric layer 524. The through hole 522Q is formed in the dielectric layer 522.

Referring to FIG. 22H, the element layer 850 (second element layer) is formed on the dielectric layer 522 and filling the through hole 522Q. The portion of the element layer 850 in the through hole 522Q (void) forms the via 832. The portion of the element layer 850 on the upper surface of the dielectric layer 522 comprises the back plate 724 in the suspension region D1 (e.g. first suspension region) and the cantilever structure 102 (or cantilever layer) in the suspension region D2 (e.g. second suspension region). The sacrificial layer 2850 is formed on a lower surface of the sacrificial layer 2840. The piezoelectric material layer 828 is formed on the cantilever structure 102 in the suspension region D2. In an embodiment, the piezoelectric material layer 828 may be formed on the cantilever structure 102 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102.

Referring to FIG. 22I, the electrode layer 830 is formed on the element layer 850.

Referring to FIG. 22J, the element layer 850 is patterned to form the through hole in the element layer 850, and the slit 104 is formed in the cantilever structure 102 of the element layer 850. The element layer 850 formed in the through hole may comprise the acoustic hole 724Q of the back plate 724 in the suspension region D1, and a patterned slit 850Q of the cantilever structure 102 in the suspension region D2. The cantilever structure 102 may comprise a stiffness adjusting structure. The stiffness adjusting structure may comprise the patterned slit 850Q in the cantilever structure 102, used for adjusting the stiffness of the cantilever structure 102.

Referring to FIG. 22K, the sacrificial layer 2840 and the sacrificial layer 2850 are removed.

Referring to FIG. 22L, the sacrificial layer 2840 and the sacrificial layer 2850 are removed. The patterned insulating layer 860 comprises the material pattern 860F in the suspension region D2.

Referring to FIG. 22M, the pattern of the insulating layer 860 is transferred into a region of a partial thickness of the substrate 416 from the lower surface of the substrate 416. The patterned substrate 416 comprises the substrate projection portion 416F formed by the portion of substrate 416 not removed by being protected by the material pattern 860F in the suspension region D2.

Referring to FIG. 22N, the material pattern 860F of the insulating layer 860 is removed, and the insulating layer 860 in the support region L, the intermediate region M and the support region R is remained.

Referring to FIG. 22O, the portion of the substrate 416 not covered by the insulating layer 860 may be removed by an anisotropic etching method along the thickness direction (or the vertical direction), until the lower surface of the dielectric layer 518 is exposed, and the portion of the substrate 416 corresponding to the substrate projection portion 416F is remained to form the substrate section 416H on the lower surface of the dielectric layer 518.

Referring to FIG. 22P, the portions of the dielectric layer 518 and the dielectric layer 522 not covered by the substrate 416 may be removed by using a selective etching method so as to form the through opening 518T and the through opening 522T in the dielectric layer 518 and the dielectric layer 522 respectively, and remove the insulating layer 860. The mass 134 comprises the substrate section 416H of the substrate 416, the dielectric layer 518, the element layer 840 and the dielectric layer 522. Each of the portions of the support structure 314 respectively in the intermediate region M (e.g. intermediate support region), the support region R (e.g. first support region) and the support region L (e.g. second support region) comprises the substrate 416, the dielectric layer 518, the element layer 840 and the dielectric layer 522. The element layer 840 comprises the diaphragm film 620 in the suspension region D1. The element layer 850 comprises the back plate 724 in the suspension region D1, and the cantilever structure 102 in the suspension region D2.

Referring to FIG. 22P-1, a micro-electro-mechanical system acoustic sensor 212 according to another embodiment is illustrated. Differences of the micro-electro-mechanical system acoustic sensors 212 of FIG. 22P-1 and FIG. 22P are described as below. The mass 134 comprises the substrate 416, the dielectric layer 518, the element layer 840 and the dielectric layer 522.

FIG. 22P-2 illustrates a cross-section view of a micro-electro-mechanical system package structure 936 according to an embodiment, which is different from the micro-electro-mechanical system package structure 936 shown in FIG. 9 with the following description. The micro-electro-mechanical system acoustic sensor 212 may be similar to the micro-electro-mechanical system acoustic sensor 212 as shown in FIG. 22P-1. The carrier plate 937 has the trench 937P under the free cantilever portion 108 of the cantilever structure 102, providing the empty space, which can avoid touching the carrier plate 937 by the mass 134 during vibrating of the free cantilever portion 108.

Figure 23A:
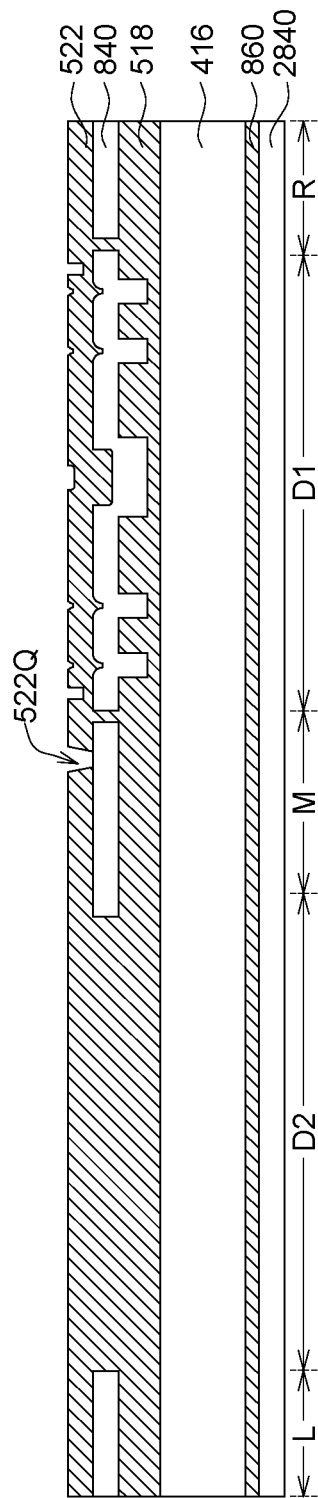
FIG. 23A to FIG. 23H illustrate a manufacturing process flow for a micro-electro-mechanical system acoustic sensor according to an embodiment.

FIG. 23A to FIG. 23H illustrate a manufacturing process flow for the micro-electro-mechanical system acoustic sensor 212 according to an embodiment. In an embodiment, the manufacturing step as shown in FIG. 23A may be performed after the manufacturing step similar to that illustrated with referring to FIG. 22F.

Referring to FIG. 23A, the dielectric layer 522 is formed on the element layer 840. The through hole 522Q is formed in the dielectric layer 522.

Figure 23B:
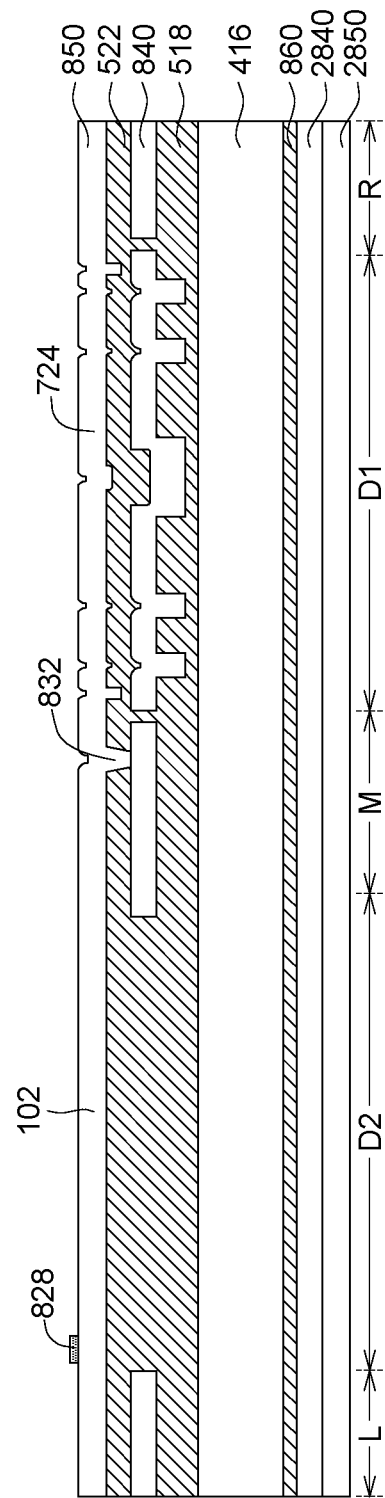

Referring to FIG. 23B, the element layer 850 is formed on the dielectric layer 522 and filling the through hole 522Q. The element layer 850 in the through hole 522Q (void) forms the via 832. The element layer 850 on the upper surface of the dielectric layer 522 comprises the back plate 724 in the suspension region D1, and the cantilever structure 102 (cantilever layer) in the suspension region D2. The sacrificial layer 2850 is formed on the lower surface of the sacrificial layer 2840. The piezoelectric material layer 828 is formed on the cantilever structure 102. In an embodiment, the piezoelectric material layer 828 may be formed on the cantilever structure 102 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102.

Figure 23C:
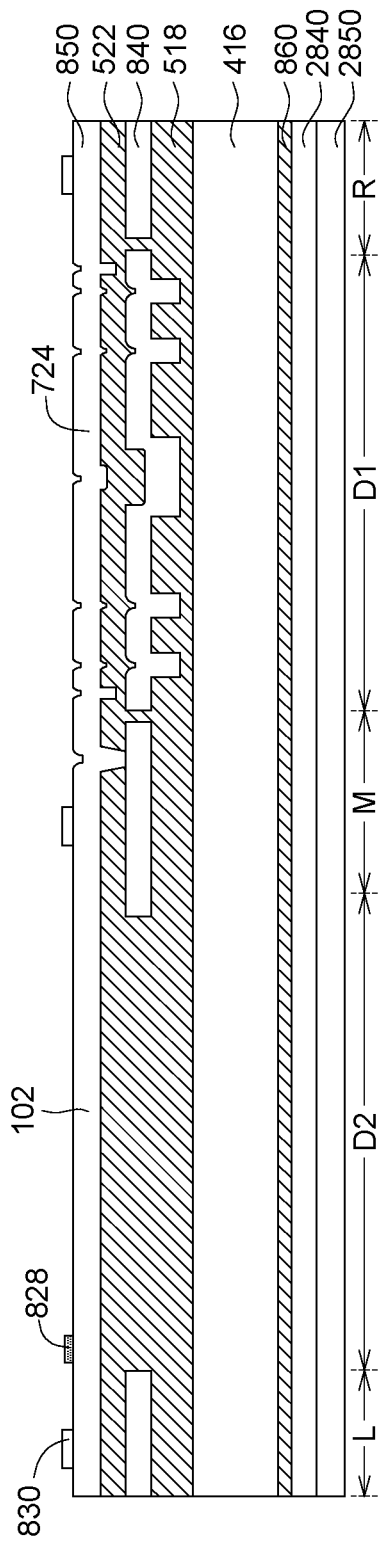

Referring to FIG. 23C, the electrode layer 830 is formed on the element layer 850.

Figure 23D:
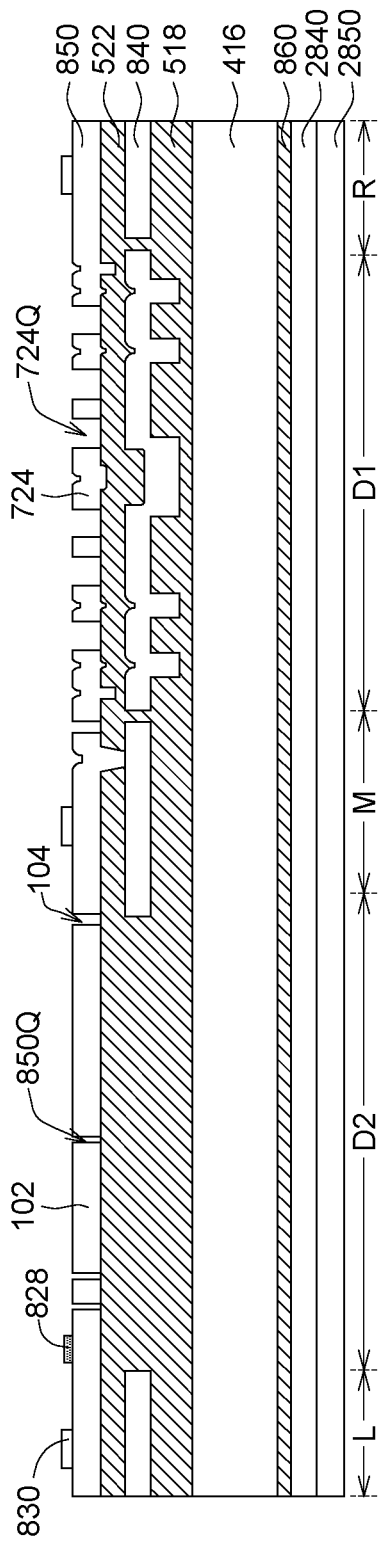

Referring to FIG. 23D, the element layer 850 is patterned to form the patterned slit 850Q in the element layer 850, and the slit 104 is formed in the cantilever structure 102 of the element layer 850. The element layer 850 formed in the through hole may comprise the acoustic hole 724Q of the back plate 724 in the suspension region D1, and the patterned slit 850Q in the cantilever structure 102 in the suspension region D2. The cantilever structure 102 may comprise a stiffness adjusting structure. The stiffness adjusting structure may comprise the patterned slit 850Q in the cantilever structure 102, used for adjusting the stiffness of the cantilever structure 102.

Figure 23E:
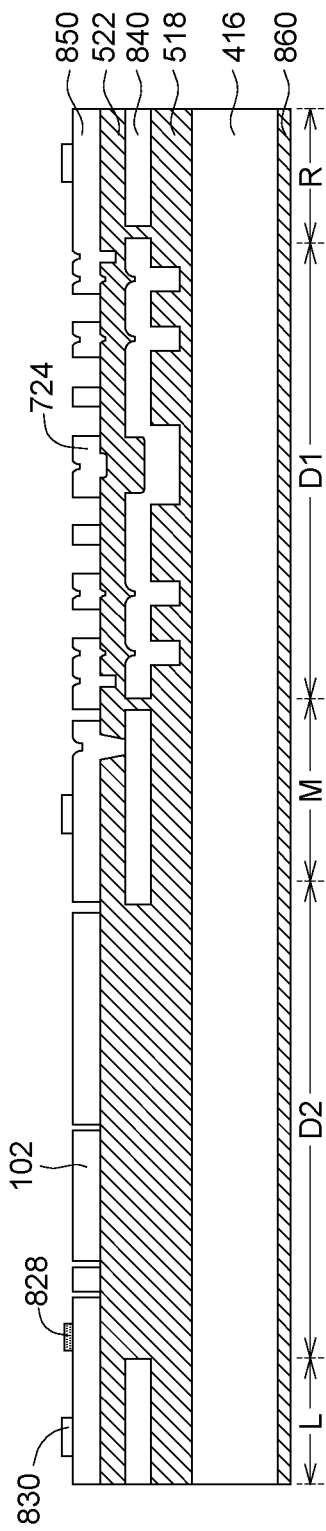

Referring to FIG. 23E, the sacrificial layer 2840 and the sacrificial layer 2850 are removed.

Figure 23F:
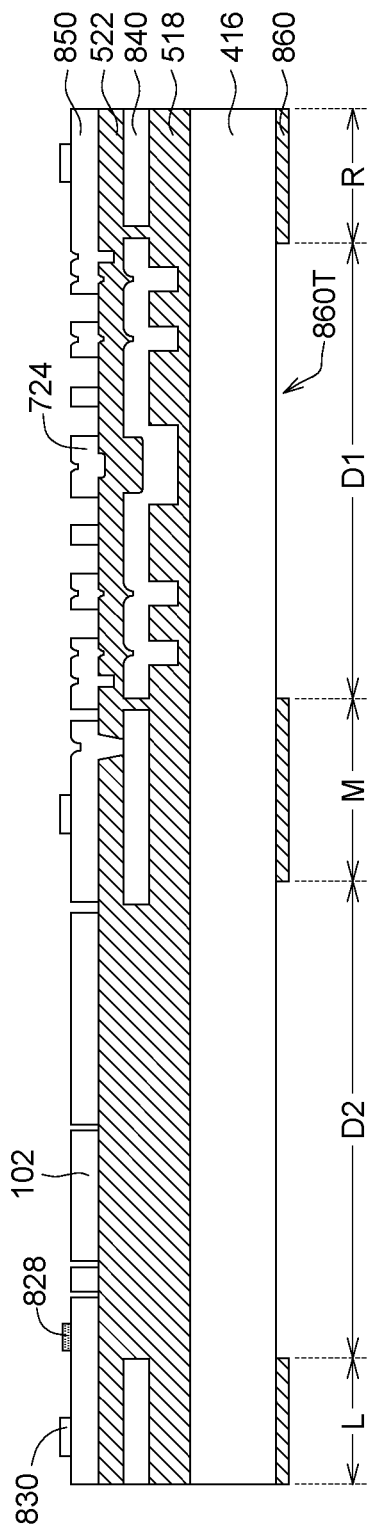

Referring to FIG. 23F, the insulating layer 860 is patterned to form the through opening 860T.

Figure 23G:
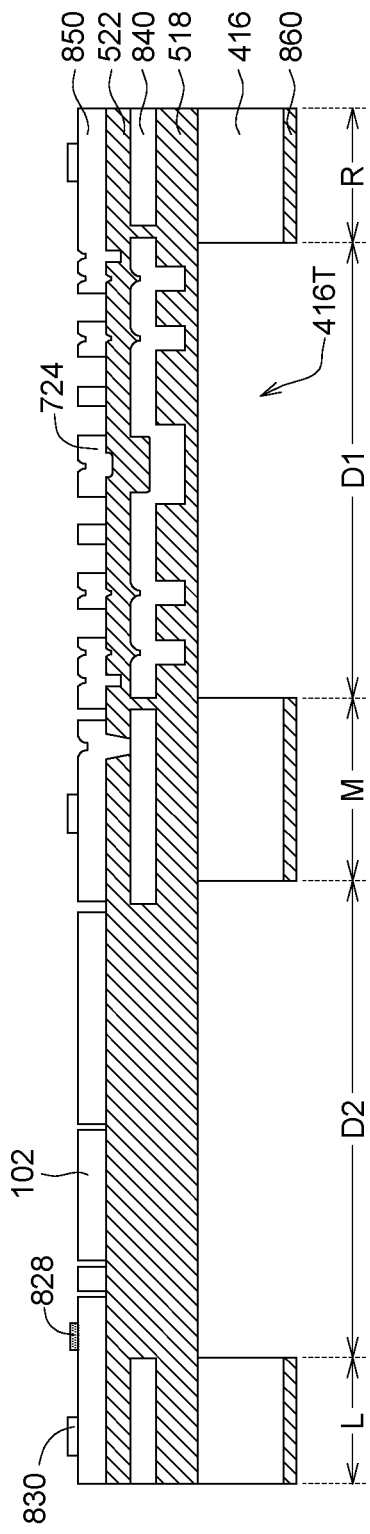

Referring to FIG. 23G, the portion of the substrate 416 not covered by the insulating layer 860 is removed to form the through opening 416T in the substrate 416.

Figure 23H:
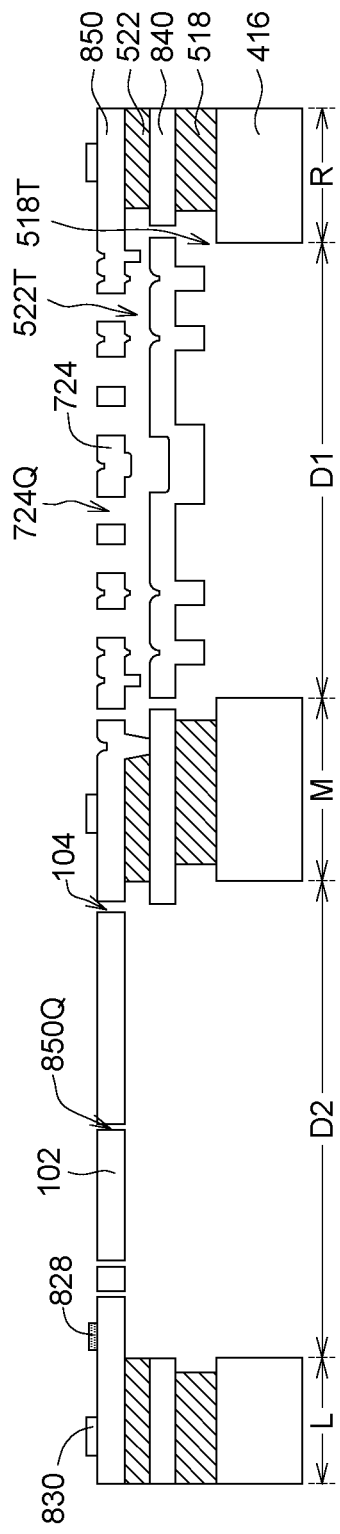

Referring to FIG. 23H, the portions of the dielectric layer 518 and the dielectric layer 522 not covered by the substrate 416 are removed so as to form the through opening 518T and the through opening 522T in the dielectric layer 518 and the dielectric layer 522 respectively.

Figure 24A:
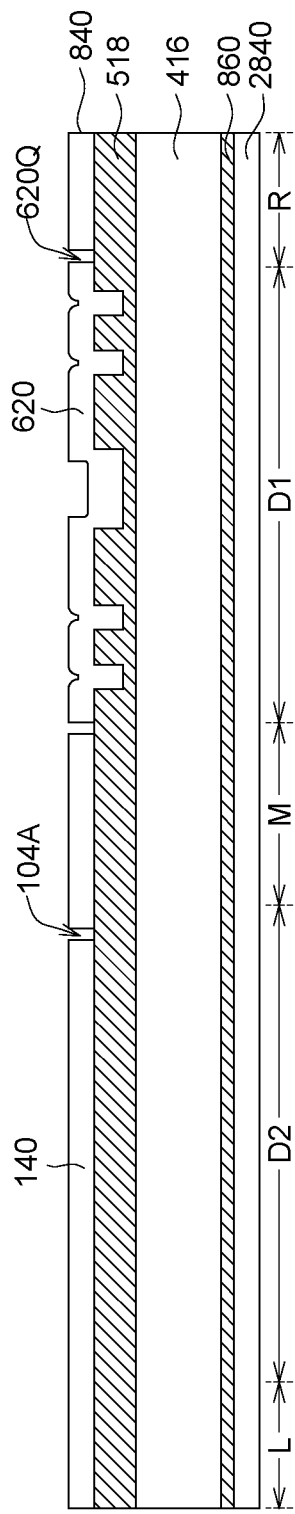
FIG. 24A to FIG. 24K illustrate a manufacturing process flow for a micro-electro-mechanical system acoustic sensor according to an embodiment.

FIG. 24A to FIG. 24K illustrate a manufacturing process flow for the micro-electro-mechanical system acoustic sensor 212 according to an embodiment. In an embodiment, the manufacturing step as shown in FIG. 24A may be performed after the manufacturing step similar to that illustrated with referring to FIG. 22C.

Referring to FIG. 24A, the element layer 840 (first element layer) is patterned to form the through hole in the element layer 840 (comprising the patterned slit 620Q in the diaphragm film 620 of the element layer 840 in the suspension region D1), and form the slit 104A in the cantilever layer 140 of the element layer 840 in the suspension region D2.

Figure 24B:
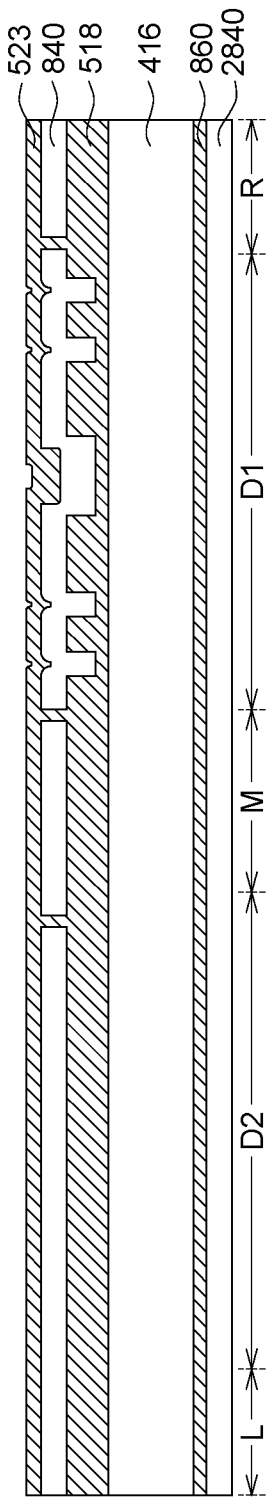

Referring to FIG. 24B, the dielectric layer 523 is formed on the element layer 840 and filling the through hole (comprising the patterned slit 620Q) in the element layer 840 and the slit 104A.

Figure 24C:
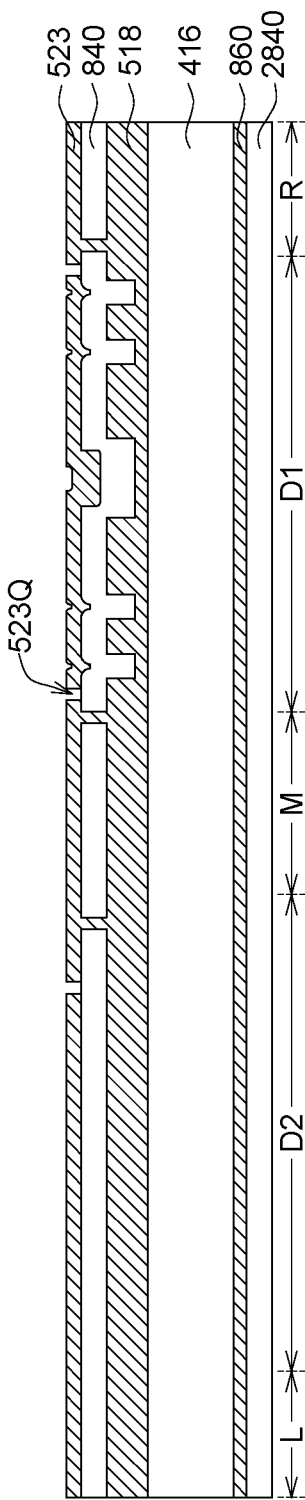

Referring to FIG. 24C, the through hole 523Q is formed in the dielectric layer 523. In an embodiment, a dimple may be formed by this step so as to reduce the surface stiction force.

Figure 24D:
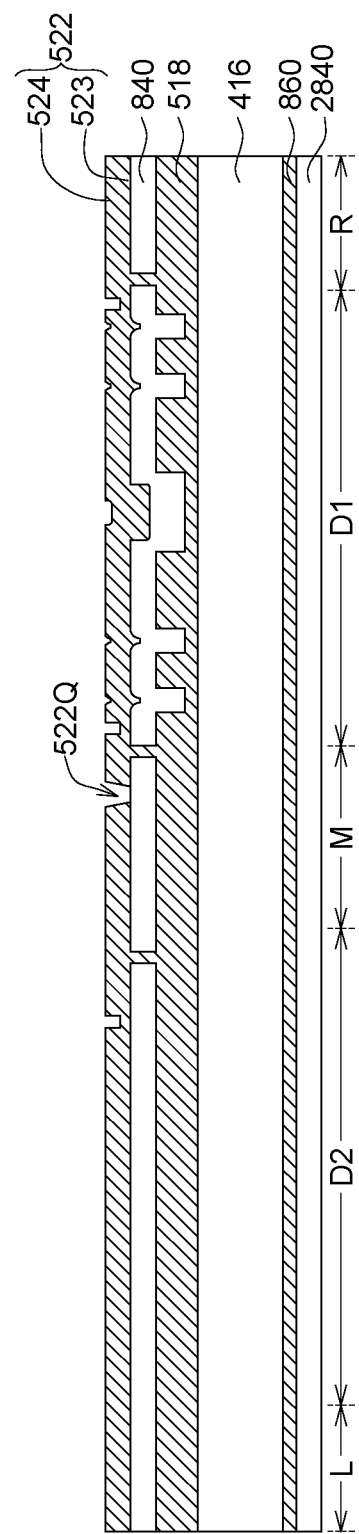

Referring to FIG. 24D, the dielectric layer 524 is formed on the dielectric layer 523. The dielectric layer 522 comprises the dielectric layer 523 and the dielectric layer 524. The through hole 522Q is formed in the dielectric layer 522.

Figure 24E:
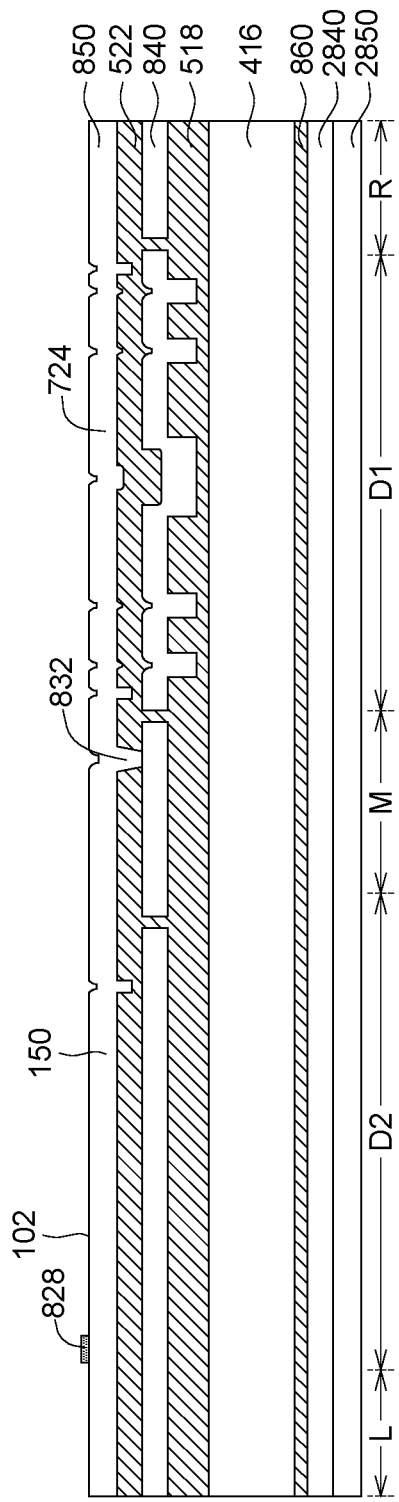

Referring to FIG. 24E, the element layer 850 is formed on the dielectric layer 522 and filling the through hole 522Q. The element layer 850 in the through hole 522Q (void) forms the via 832. The element layer 850 on the upper surface of the dielectric layer 522 comprises the back plate 724 in the suspension region D1, and the cantilever layer 150 of the cantilever structure 102 in the suspension region D2. The sacrificial layer 2850 is formed on the lower surface of the sacrificial layer 2840. The piezoelectric material layer 828 is formed on the cantilever layer 150. In an embodiment, the piezoelectric material layer 828 may be formed on the cantilever layer 150 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the cantilever structure 102.

Figure 24F:
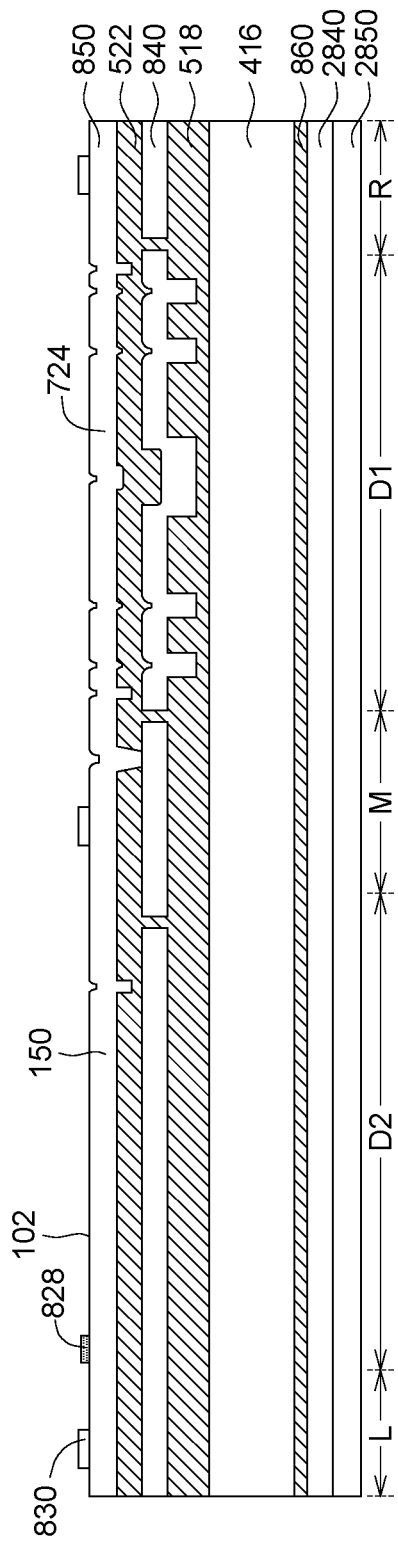

Referring to FIG. 24F, the electrode layer 830 is formed on the element layer 850.

Figure 24G:
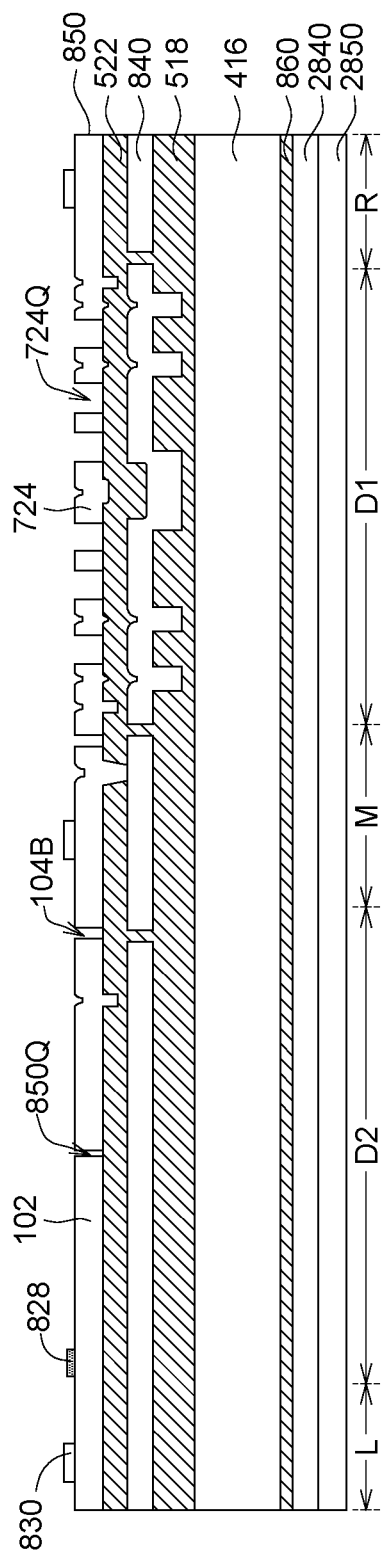

Referring to FIG. 24G, the element layer 850 is patterned to form the through hole in the element layer 850, and form the slit 104B in the cantilever layer 150 of the element layer 850 in the suspension region D2. The element layer 850 formed in the through hole may comprise the acoustic hole 724Q of the back plate 724 in the suspension region D1, and the patterned slit 850Q in the cantilever layer 150 in the suspension region D2.

Figure 24H:
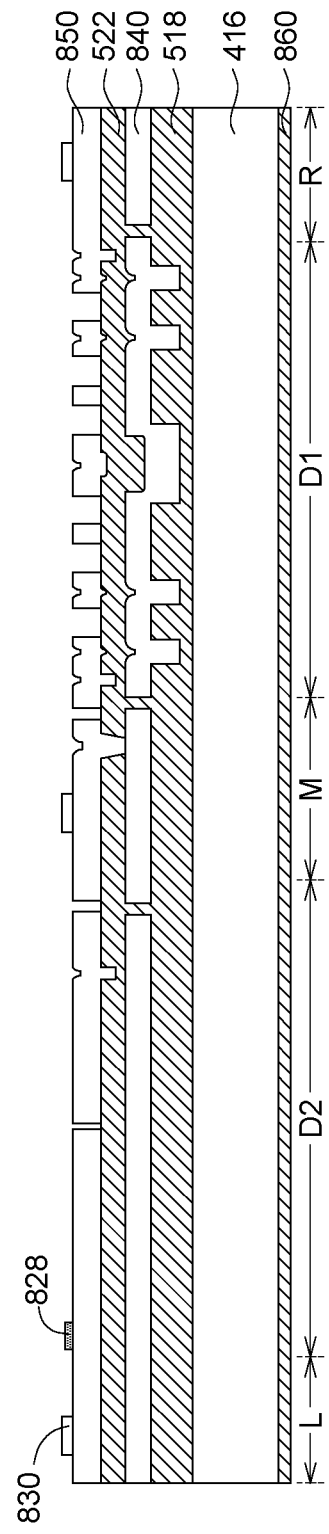

Referring to FIG. 24H, the sacrificial layer 2850 and the sacrificial layer 2840 are removed.

Figure 24I:
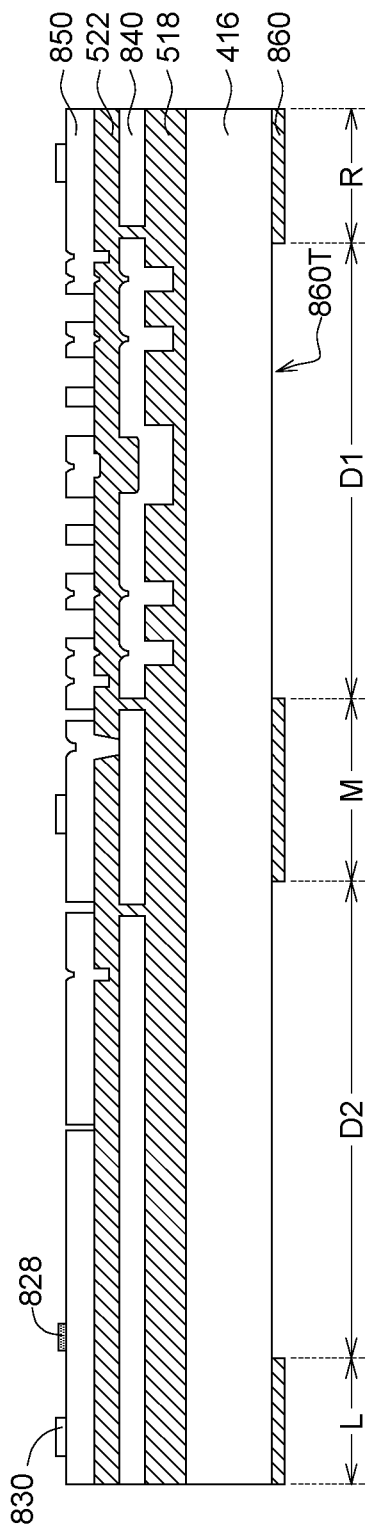

Referring to FIG. 24I, the insulating layer 860 is patterned to form the through opening 860T.

Figure 24J:
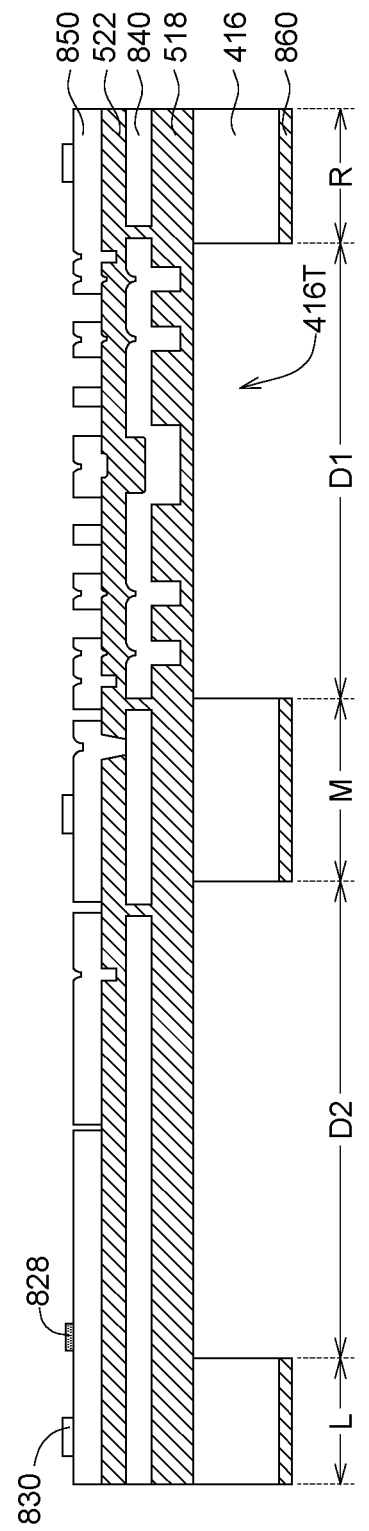

Referring to FIG. 24J, the portion of the substrate 416 not covered by the insulating layer 860 is removed to form the through opening 416T in the substrate 416.

Figure 24K:
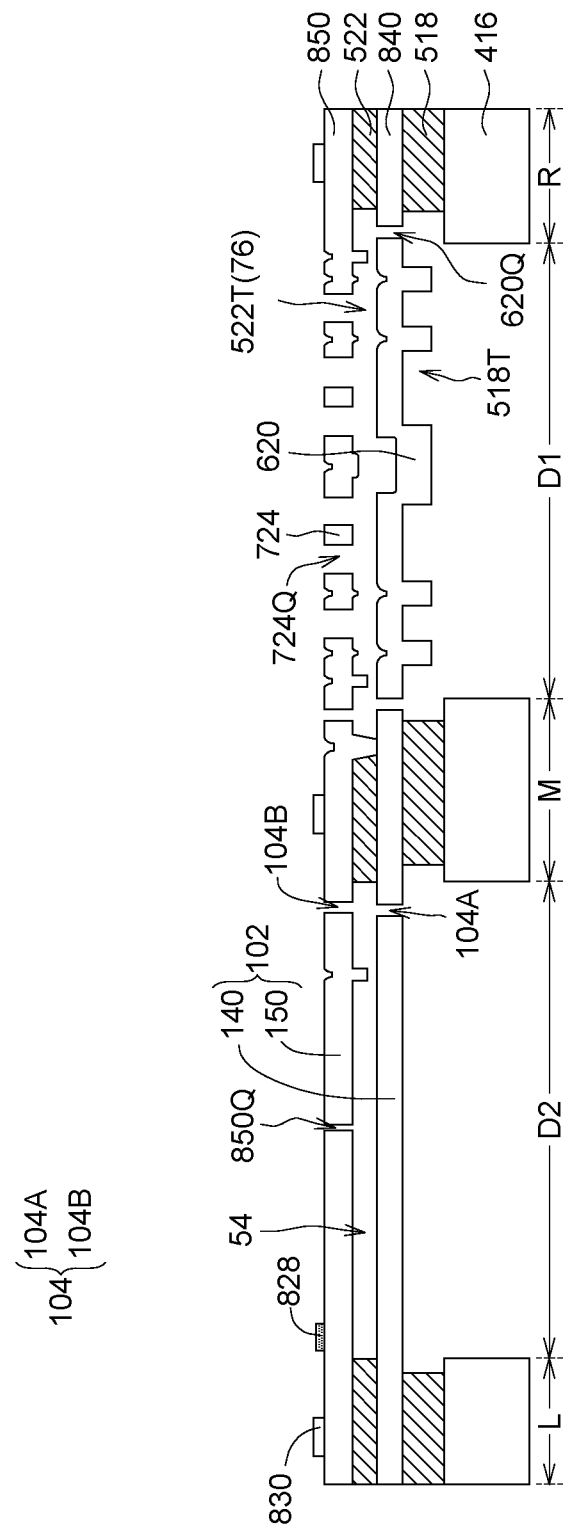

Referring to FIG. 24K, the portions of the dielectric layer 518 and the dielectric layer 522 not covered by the substrate 416 are removed to pattern the dielectric layer 518 and the dielectric layer 522 so as to form the through opening 518T and the through opening 522T in the dielectric layer 518 and the dielectric layer 522 respectively. The element layer 840 comprises the diaphragm film 620 in the suspension region D1, and the cantilever layer 140 (first cantilever layer) of the cantilever structure 102 in the suspension region D2. The element layer 850 comprises the back plate 724 in the suspension region D1, and the cantilever layer 150 (second cantilever layer) of the cantilever structure 102 in the suspension region D2. The first empty gap 76 (or air gap) between the diaphragm film 620 and the back plate 724 comprises the through opening 522T of the dielectric layer 522 in the suspension region D1. The empty gap 54 (or air gap) between the cantilever layer 140 and the cantilever layer 150 comprises the through opening 522T of the dielectric layer 522 in the suspension region D2. The slit 104 of the cantilever structure 102 comprises the slit 104A of the cantilever layer 140 and the slit 104B of the cantilever layer 150. The cantilever structure 102 may comprise a stiffness adjusting structure. The stiffness adjusting structure may comprise the patterned slit 850Q in the cantilever layer 150, used for adjusting the stiffness of the cantilever structure 102.

FIG. 25A to FIG. 25N illustrate a manufacturing process flow for the micro-electro-mechanical system acoustic sensor 212 according to an embodiment. In an embodiment, the manufacturing step as shown in FIG. FIG. 25A may be performed after the manufacturing step similar to that illustrated with referring to FIG. FIG. 22B.

Referring to FIG. 25A, the element layer 840 is formed on the dielectric layer 518. The sacrificial layer 2840 is formed on the lower surface of the insulating layer 860. The piezoelectric material layer 828 is formed on the element layer 840. In an embodiment, he piezoelectric material layer 828 may be formed on the element layer 840 by using a method similar to that as shown in FIG. 17A to FIG. 17C. For example, the method similar to that as shown in FIG. 17A to FIG. 17C may be used to form the electrode layer 831, the piezoelectric material layer 828 and the electrode layer 833 on the element layer 840.

Referring to FIG. 25B, the element layer 840 is patterned to form the through hole in the element layer 840 (comprising the patterned slit 620Q in the diaphragm film 620 of the element layer 840 in the suspension region D1), and form the slit 104 in the cantilever structure 102 of the element layer 840.

Referring to FIG. 25C, the dielectric layer 523 is formed on the element layer 840 and filling the through hole (comprising the patterned slit 620Q) and the slit 104 in the element layer 840.

Referring to FIG. 25D, the through hole 523Q is formed in the dielectric layer 523. In an embodiment, a dimple may be formed by this step so as to reduce the surface stiction force.

Figure 25E:
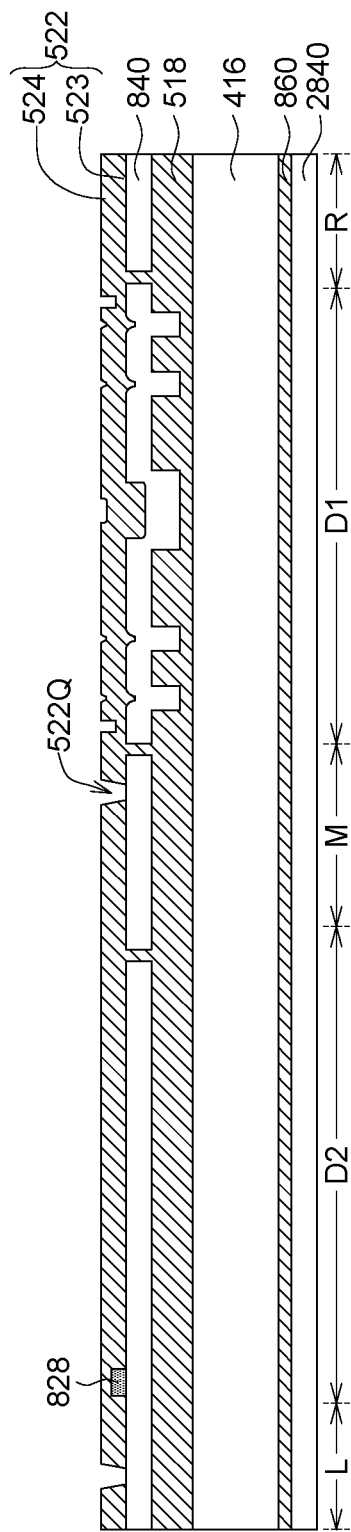
FIG. 25A to FIG. 25N illustrate a manufacturing process flow for a micro-electro-mechanical system acoustic sensor according to an embodiment.

Referring to FIG. 25E, the dielectric layer 524 is formed on the dielectric layer 523. The dielectric layer 522 comprises the dielectric layer 523 and the dielectric layer 524. The through hole 522Q is formed in the dielectric layer 522.

Figure 25F:
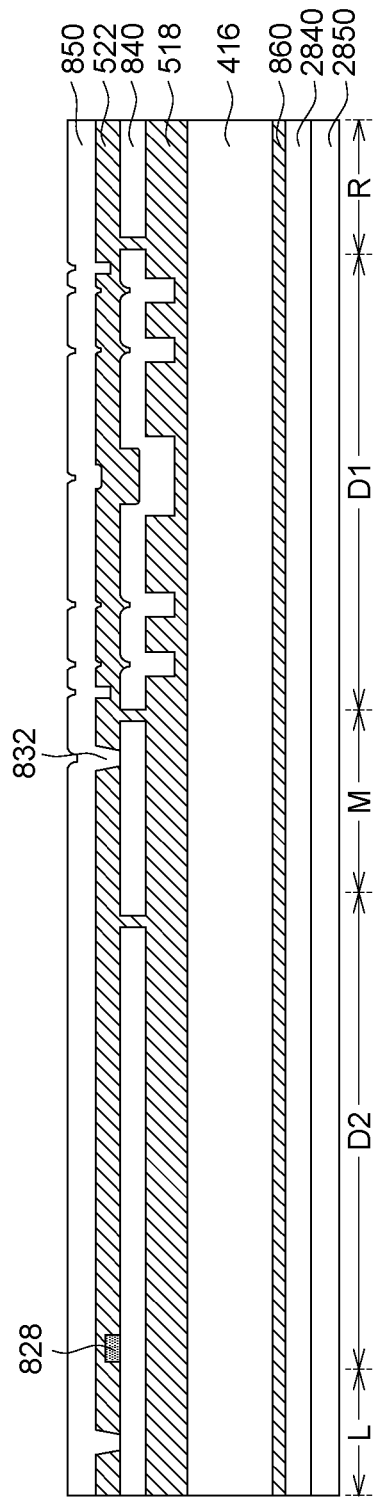

Referring to FIG. 25F, the element layer 850 is formed on the dielectric layer 522 and filling the through hole 522Q. The element layer 850 in the through hole 522Q (void) forms the via 832. The sacrificial layer 2850 is formed on the lower surface of the sacrificial layer 2840.

Referring to FIG. 25G, the electrode layer 830 is formed on the element layer 850.

Referring to FIG. 25H, the element layer 850 is patterned to remove the portion of the element layer 850 in the suspension region D2, and form the acoustic hole 724Q in the back plate 724 of the element layer 850 in the suspension region D1.

Figure 25I:
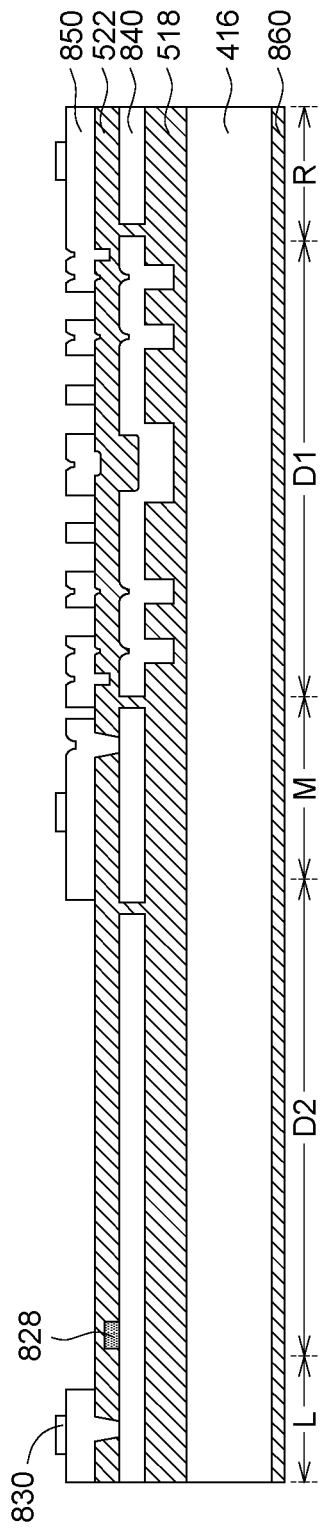

Referring to FIG. 25I, the sacrificial layer 2850 and the sacrificial layer 2840 are removed.

Figure 25J:
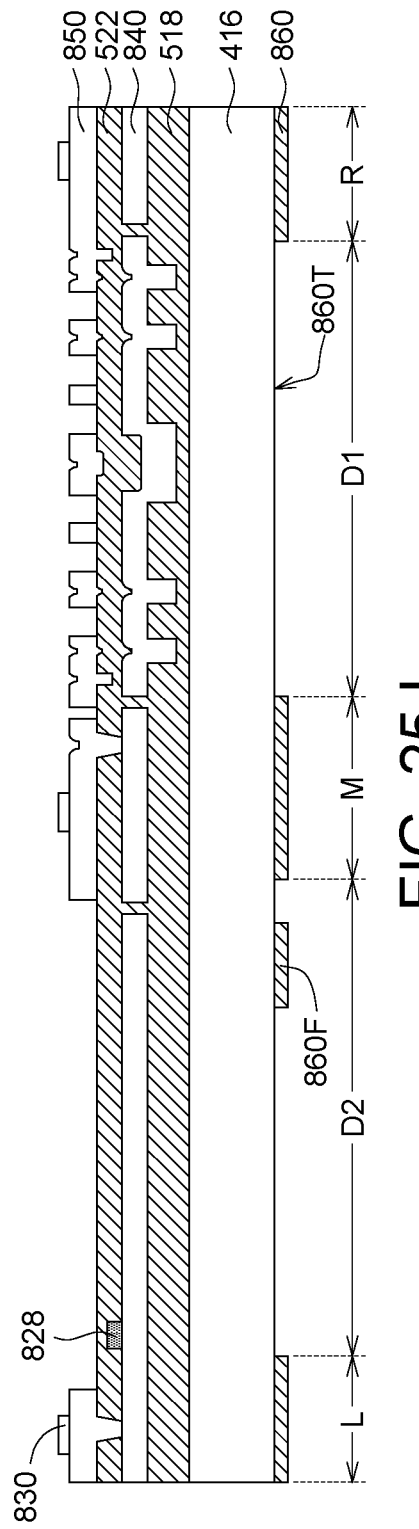

Referring to FIG. 25J, the insulating layer 860 is patterned to form the through opening 860T. The patterned insulating layer 860 comprises the material pattern 860F in the suspension region D2.

Referring to FIG. 25K, the pattern of the insulating layer 860 is transferred into a region of a partial thickness of the substrate 416 from the lower surface of the substrate 416. The patterned substrate 416 comprises the substrate projection portion 416F formed by the portion of substrate 416 not removed by being protected by the material pattern 860F in the suspension region D2.

Referring to FIG. 25L, the material pattern 860F of the insulating layer 860 in the suspension region D2 is removed, and the insulating layer 860 in the support region R (first support region), the intermediate region M (intermediate support region) and the support region L (second support region) is remained.

Referring to FIG. 25M, the portion of the substrate 416 not covered by the insulating layer 860 may be removed by an anisotropic etching method along the thickness direction (or the vertical direction), until the lower surface of the dielectric layer 518 is exposed, while the portion of the substrate 416 corresponding to the substrate projection portion 416F is remained to form the substrate section 416H on the lower surface of the dielectric layer 518.

Referring to FIG. 25N, a selective etching method may be used to remove the portions of the dielectric layer 518 and the dielectric layer 522 not covered by the substrate 416, remove the insulating layer 860. The mass 134 comprises the substrate section 416H of the substrate 416 and the dielectric layer 518. The element layer 840 comprises the diaphragm film 620 in the suspension region D1, and the cantilever structure 102 (cantilever layer) in the suspension region D2. The element layer 850 comprises the back plate 724 in the suspension region D1.

Figure 26C:
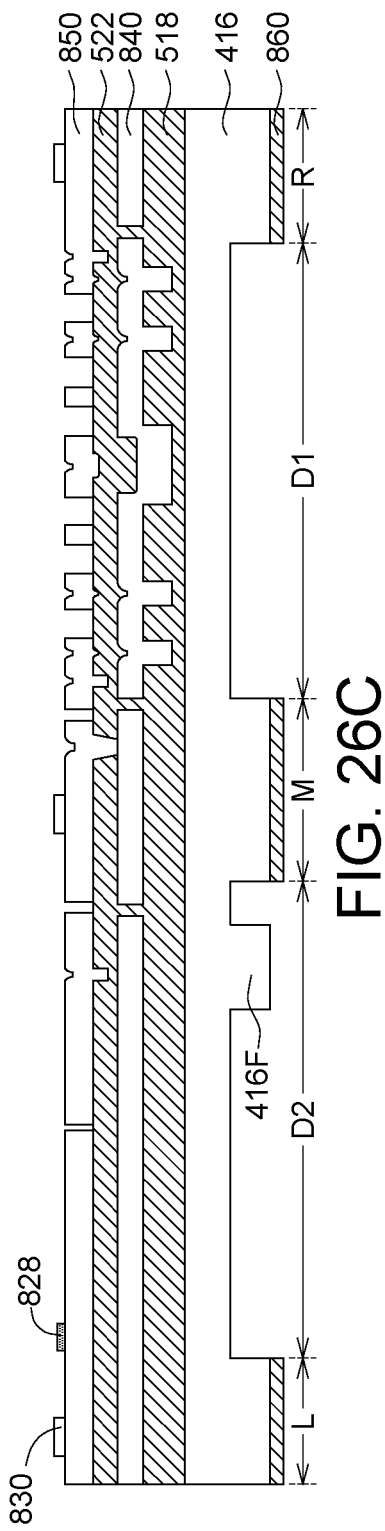

FIG. 26A to FIG. 26E illustrate a manufacturing process flow for the micro-electro-mechanical system acoustic sensor 212 according to an embodiment. In an embodiment, the manufacturing step as shown in FIG. 26A may be performed after the manufacturing step similar to that illustrated with referring to FIG. 24H.

Referring to FIG. 26A, the insulating layer 860 is patterned to form the through opening 860T. The patterned insulating layer 860 comprises the material pattern 860F in the suspension region D2.

Referring to FIG. 26B, the pattern of the insulating layer 860 is transferred into a region of a partial thickness of the substrate 416 from the lower surface of the substrate 416. The patterned substrate 416 comprises the substrate projection portion 416F formed by the portion of substrate 416 not removed by being protected by the material pattern 860F in the suspension region D2.

Referring to FIG. 26C, the material pattern 860F is removed, and the insulating layer 860 in the intermediate region M, the support region R, and the support region L is remained.

Figure 26D:
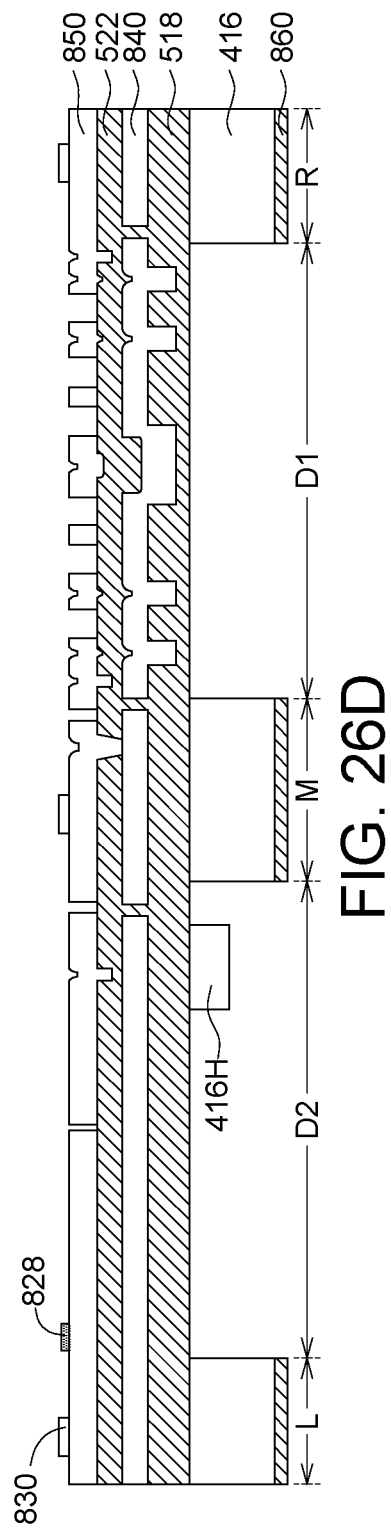

Referring to FIG. 26D, the portion of the substrate 416 not covered by the insulating layer 860 may be removed by an anisotropic etching method along the thickness direction (or the vertical direction), until the lower surface of the dielectric layer 518 is exposed, and the substrate section 416H on the lower surface of the dielectric layer 518 is remained.

Figure 26E:
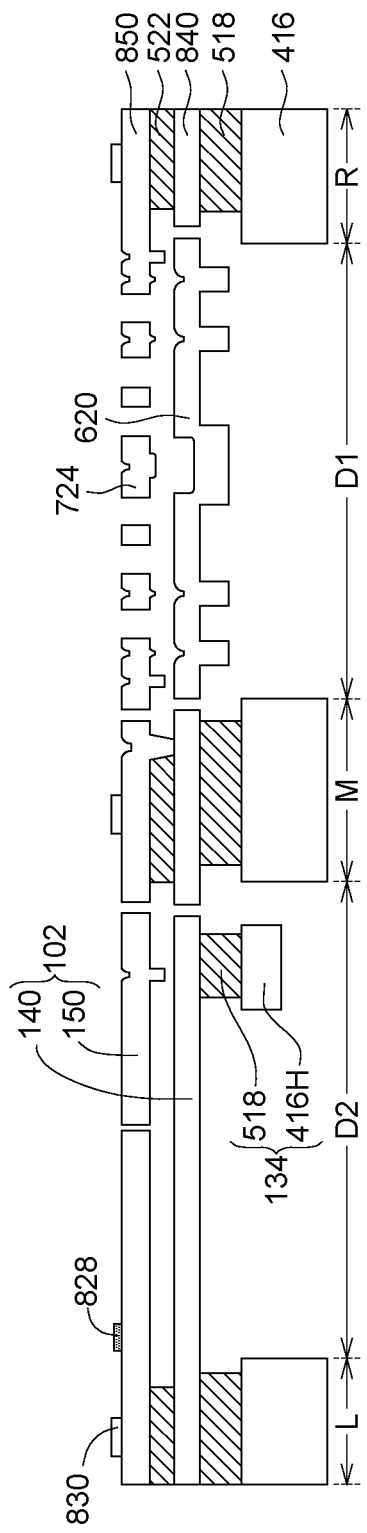

Referring to FIG. 26E, a patterning step may be performed by using a selective etching method to remove the portions of the dielectric layer 518 and the dielectric layer 522 not covered by the substrate 416, and remove the insulating layer 860. The mass 134 comprises the substrate section 416H and the dielectric layer 518. The element layer 840 comprises the diaphragm film 620 in the suspension region D1, and the cantilever layer 140 (first cantilever layer) of the cantilever structure 102 in the suspension region D2. The element layer 850 comprises the back plate 724 in the suspension region D1, and the cantilever layer 150 (second cantilever layer) of the cantilever structure 102 in the suspension region D2.

FIG. 27A to FIG. 27M illustrate a manufacturing process flow for the micro-electro-mechanical system acoustic sensor 212 according to an embodiment. In an embodiment, the manufacturing step as shown in FIG. 27A may be performed after the manufacturing step similar to that illustrated with referring to FIG. 22C.

Figure 27A:
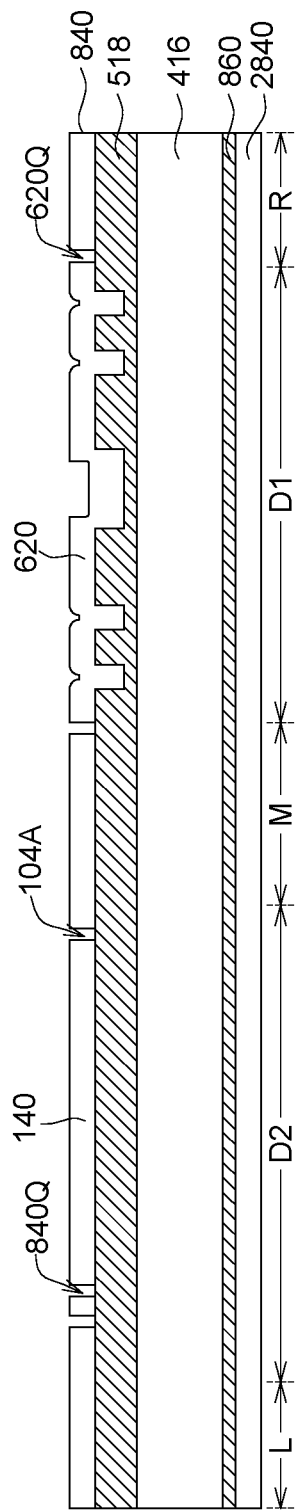

Referring to FIG. 27A, the element layer 840 is patterned to form the slit 104A in the cantilever layer 140 of the element layer 840 in the suspension region D2, and form the through hole in the element layer 840 (comprising the patterned slit 620Q in the diaphragm film 620 of the element layer 840 in the suspension region D1, and the through hole 840Q for adjusting the stiffness of the cantilever layer 140).

Figure 27B:
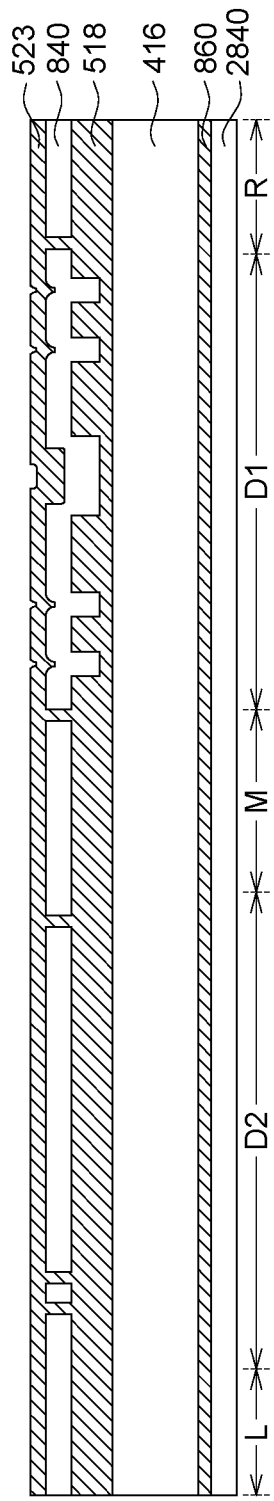

Referring to FIG. 27B, the dielectric layer 523 is formed on the element layer 840, and to fill the through hole (comprising the patterned slit 620Q and the through hole 840Q) of the element layer 840 and the slit 104.

Figure 27C:
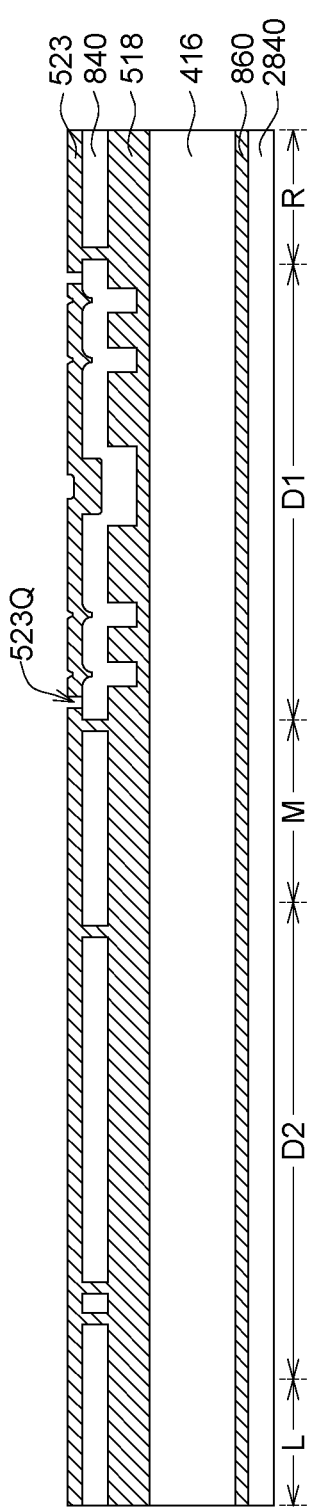

Referring to FIG. 27C, the through hole 523Q is formed in the dielectric layer 523. In an embodiment, a dimple may be formed by this step so as to reduce the surface stiction force.

Figure 27D:
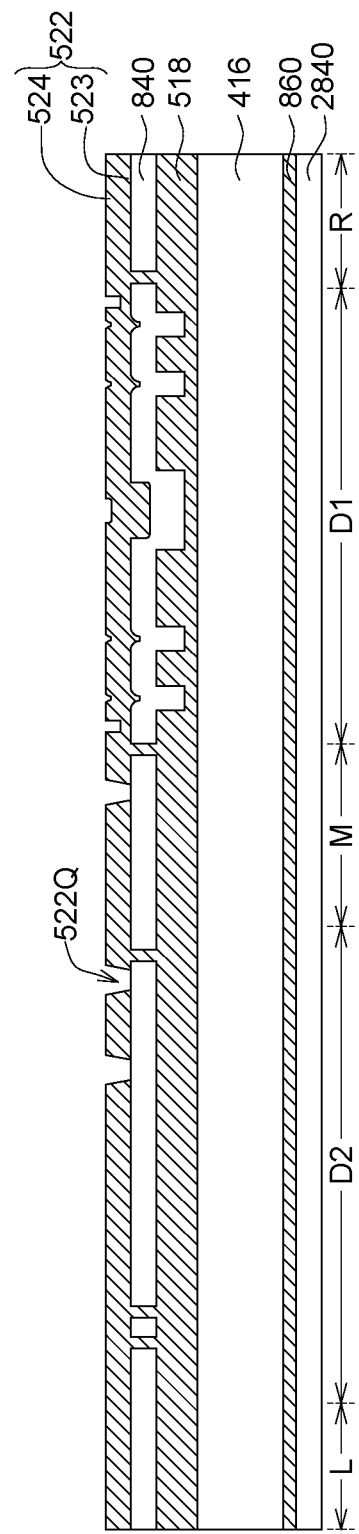

Referring to FIG. 27D, the dielectric layer 524 is formed on the dielectric layer 523. The dielectric layer 522 comprises the dielectric layer 523 and the dielectric layer 524. The through hole 522Q is formed in the dielectric layer 522.

Referring to FIG. 27E, the element layer 850 is formed on the dielectric layer 522 and filling the through hole 522Q. The element layer 850 in the through hole 522Q forms the via 832. The sacrificial layer 2850 is formed on the lower surface of the sacrificial layer 2840. The piezoelectric material layer 828 is formed on the element layer 850. In an embodiment, a method similar to that as shown in FIG. 17A to FIG. 17C may be used to form the piezoelectric material layer 828 on the cantilever layer 150 of the element layer 850. For example, the method similar to that as shown in FIG. 17A to FIG. 17C may be used to form the electrode layer 831, the piezoelectric material layer 828 and the electrode layer 833 on the cantilever layer 150antilever layer 150.

Referring to FIG. 27F, the electrode layer 830 is formed on the element layer 850.

Figure 27G:
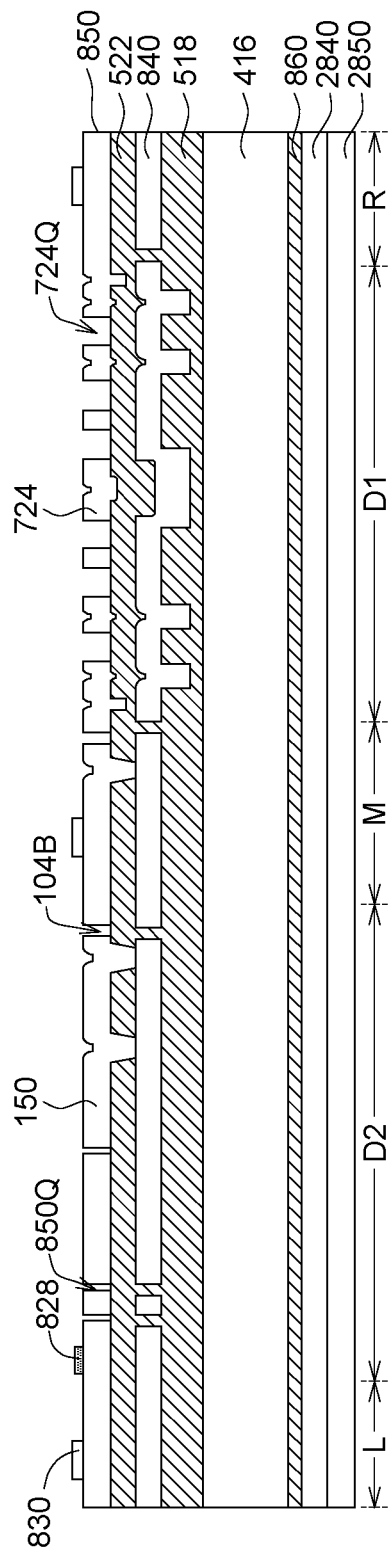

Referring to FIG. 27G, the element layer 850 is patterned to form the through hole in the element layer 850, and form the slit 104B in the cantilever layer 150 of the element layer 850 in the suspension region D2. The element layer 850 formed in the through hole may comprise the acoustic hole 724Q of the back plate 724 in the suspension region D1, and the patterned slit 850Q in the cantilever layer 150 in the suspension region D2.

Figure 27H:
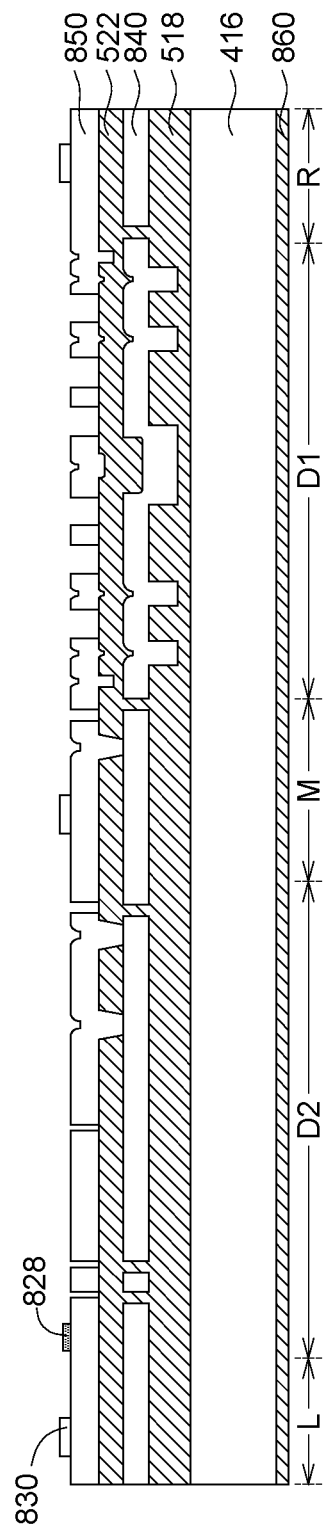

Referring to FIG. 27H, the sacrificial layer 2850 and the sacrificial layer 2840 are removed.

Figure 27I:
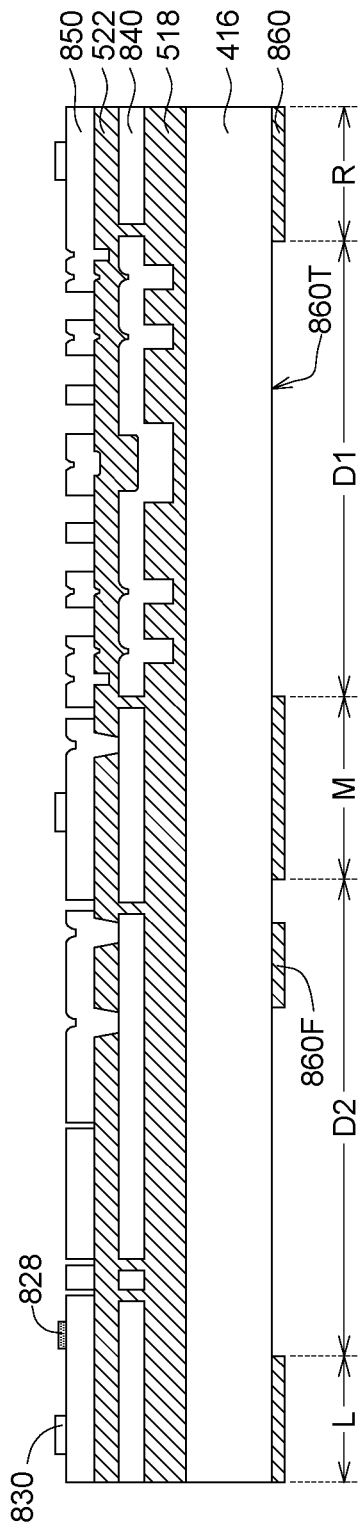

Referring to FIG. 27I, the insulating layer 860 is patterned to form the through opening 860T. The patterned insulating layer 860 comprises the material pattern 860F in the suspension region D2.

Figure 27J:
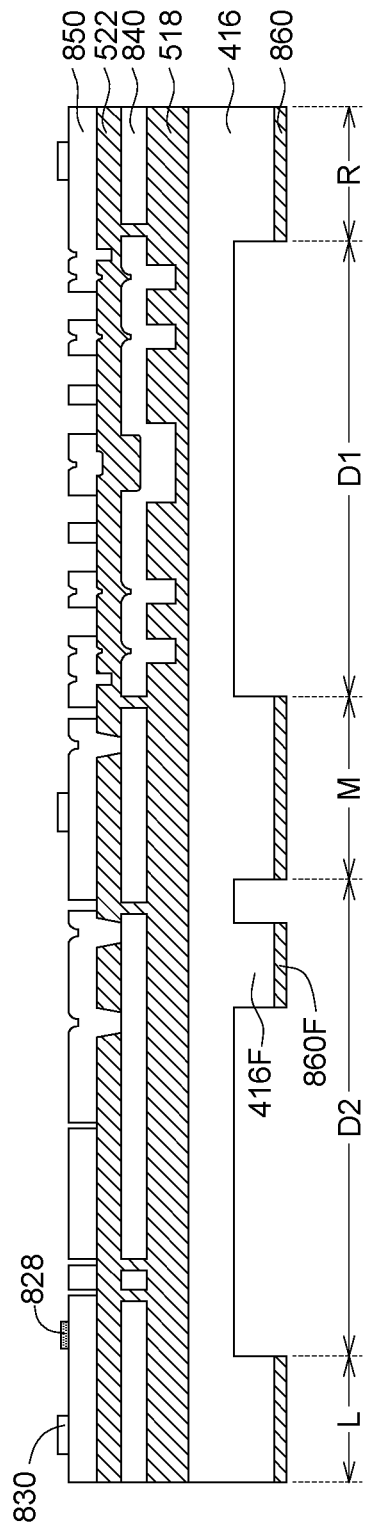

Referring to FIG. 27J, the pattern of the insulating layer 860 is transferred into a region of a partial thickness of the substrate 416 from the lower surface of the substrate 416. The patterned substrate 416 comprises the substrate projection portion 416F in the suspension region D2.

Referring to FIG. 27K, an etching step may be performed to remove the material pattern 860F, while the insulating layer 860 in the intermediate region M, the support region R, and the support region L is remained.

Referring to FIG. 27L, the portion of the substrate 416 not covered by the insulating layer 860 may be removed by an anisotropic etching method along the thickness direction (or the vertical direction), while the substrate section 416H of the substrate 416 on the lower surface of the dielectric layer 518 is remained.

Figure 27M:
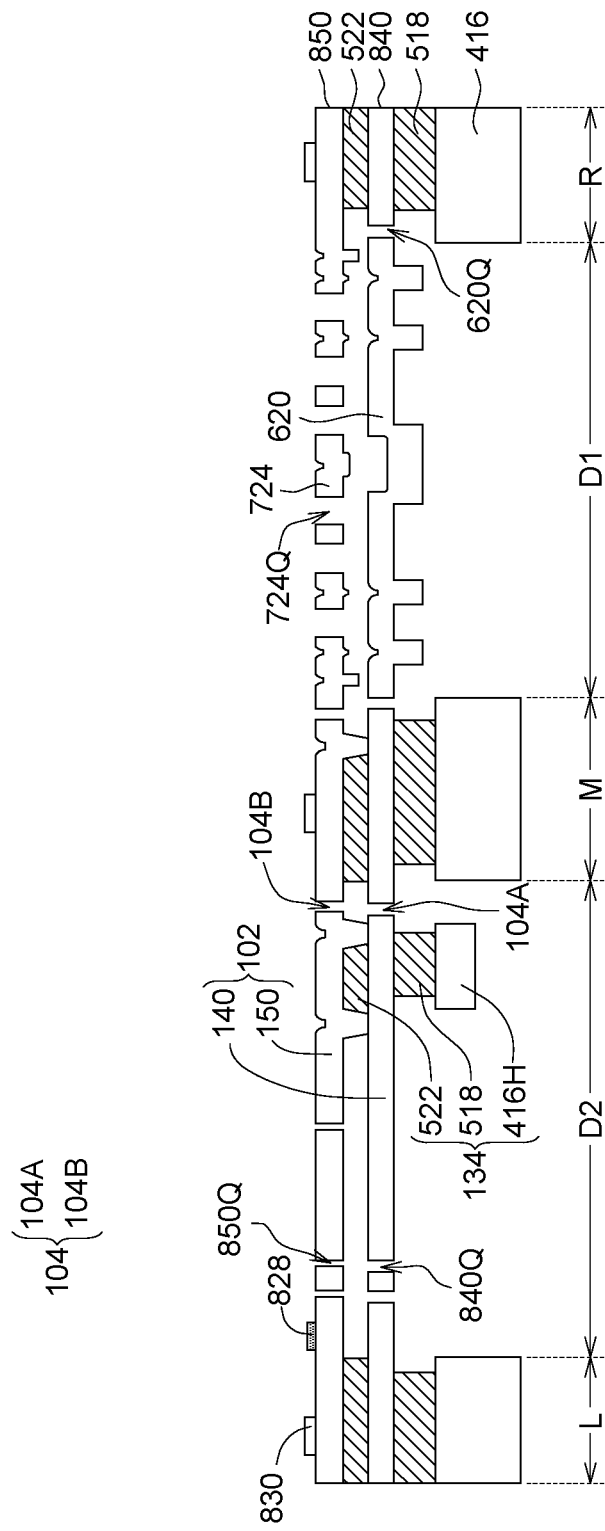

Referring to FIG. 27M, a patterning step may be performed by using a selective etching method to remove the portions of the dielectric layer 518 and the dielectric layer 522 not covered by the substrate 416, and remove the insulating layer 860. The element layer 840 comprises the diaphragm film 620 in the suspension region D1, and the cantilever layer 140 (first cantilever layer) of the cantilever structure 102 in the suspension region D2. The element layer 850 comprises the back plate 724 in the suspension region D1, and the cantilever layer 150 (second cantilever layer) of the cantilever structure 102 in the suspension region D2. The mass 134 comprises the substrate section 416H of the substrate 416 and the dielectric layer 518 on the lower surface of the cantilever layer 140 (first cantilever layer), and the dielectric layer 522 between an upper surface of the cantilever layer 140 (first cantilever layer) and a lower surface of the cantilever layer 150 (second cantilever layer). The cantilever structure 102 comprises a stiffness adjusting structure. The stiffness adjusting structure comprises the through hole 840Q in the cantilever layer 140 and the patterned slit 850Q in the cantilever layer 150, which can be used for adjusting the stiffness of the cantilever structure 102.

Figure 28A:
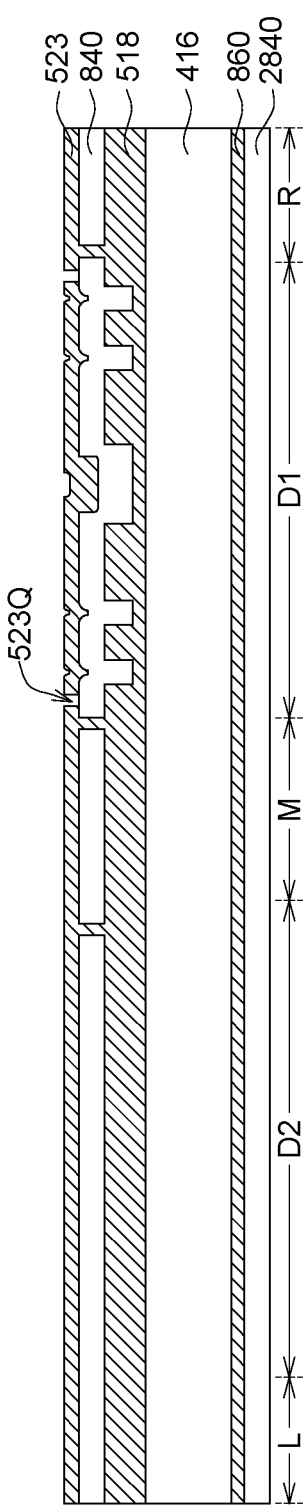

FIG. 28A to FIG. 28K illustrate a manufacturing process flow for the micro-electro-mechanical system acoustic sensor 212 according to an embodiment. In an embodiment, the manufacturing step as shown in FIG. 28A may be performed after the manufacturing step similar to that illustrated with referring to FIG. 24B.

Referring to FIG. 28A, the through hole 523Q is formed in the dielectric layer 523. In an embodiment, a dimple may be formed by this step so as to reduce the surface stiction force.

Figure 28B:
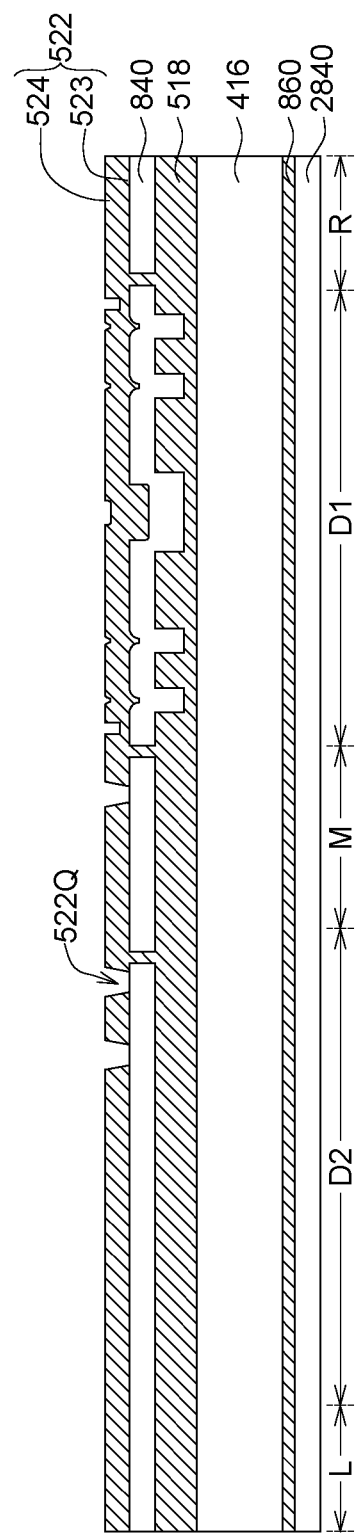

Referring to FIG. 28B, the dielectric layer 524 is formed on the dielectric layer 523. The dielectric layer 522 comprises the dielectric layer 523 and the dielectric layer 524. The through hole 522Q is formed in the dielectric layer 522.

Figure 28C:
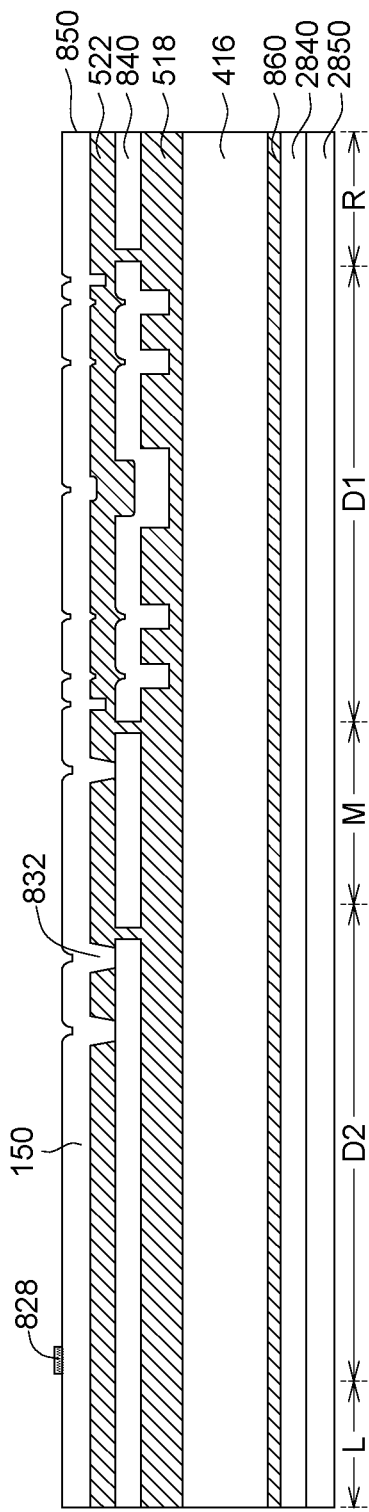

Referring to FIG. 28C, the element layer 850 is formed on the dielectric layer 522 and filling the through hole 522Q. The element layer 850 in the through hole 522Q (void) forms the via 832. The sacrificial layer 2850 is formed on the lower surface of the sacrificial layer 2840. The piezoelectric material layer 828 is formed on the element layer 850. In an embodiment, a method similar to that as shown in FIG. 17A to FIG. 17C may be used to form the piezoelectric material layer 828 on the cantilever layer 150 of the element layer 850. For example, the method similar to that as shown in FIG. 17A to FIG. 17C may be used to form the electrode layer 831, the piezoelectric material layer 828 and the electrode layer 833 on the cantilever layer 150antilever layer 150.

Figure 28D:
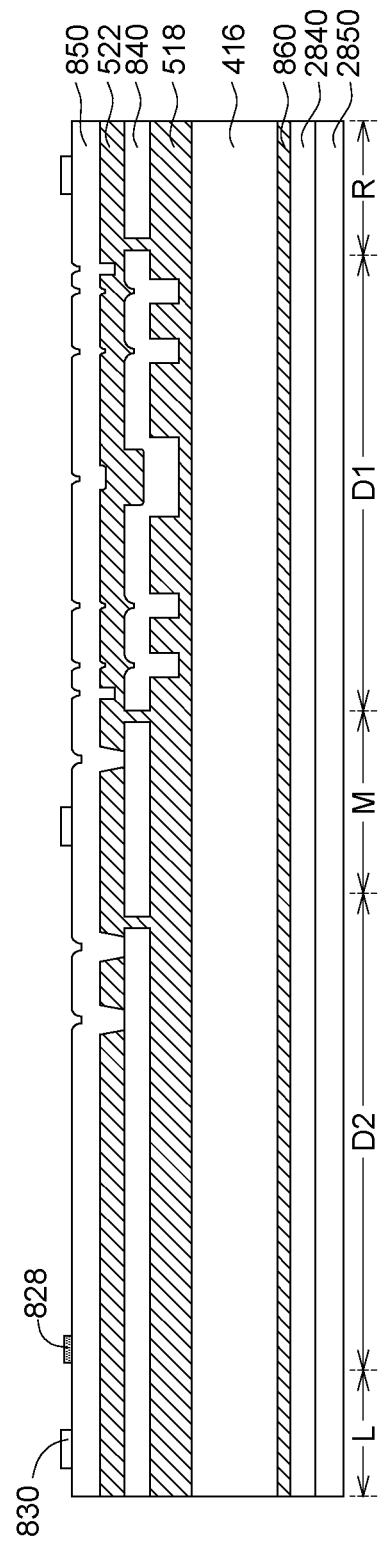

Referring to FIG. 28D, the electrode layer 830 is formed on the element layer 850.

Referring to FIG. 28E, the element layer 850 is patterned to form the through hole in the element layer 850, and form the slit 104B in the cantilever layer 150 of the element layer 850 in the suspension region D2. The element layer 850 formed in the through hole may comprise the acoustic hole 724Q of the back plate 724 in the suspension region Dl.

Referring to FIG. 28F, the sacrificial layer 2850 and the sacrificial layer 2840 are removed.

Referring to FIG. 28G, the insulating layer 860 is patterned to form the through opening 860T. The patterned insulating layer 860 comprises the material pattern 860F in the suspension region D2.

Referring to FIG. 28H, the pattern of the insulating layer 860 is transferred into a region of a partial thickness of the substrate 416 from the lower surface of the substrate 416. The patterned substrate 416 comprises the substrate projection portion 416F.

Referring to FIG. 28I, the material pattern 860F is removed, and the insulating layer 860 in the intermediate region M, the support region R, and the support region L is remained.

Referring to FIG. 28J, the portion of the substrate 416 not covered by the insulating layer 860 may be removed by an anisotropic etching method along the thickness direction (or the vertical direction), while the substrate section 416H of the substrate 416 is remained.

Referring to FIG. 28K, a patterning step may be performed by using a selective etching method to remove the portions of the dielectric layer 518 and the dielectric layer 522 not covered by the substrate 416, and remove the insulating layer 860. The element layer 840 comprises the diaphragm film 620 in the suspension region D1, and the cantilever layer 140 (first cantilever layer) of the cantilever structure 102 in the suspension region D2. The element layer 850 comprises the back plate 724 in the suspension region D1, and the cantilever layer 150 (second cantilever layer) of the cantilever structure 102 in the suspension region D2. The cantilever structure 102 further comprises a dielectric cantilever layer formed by the dielectric layer 522 between the cantilever layer 140 (first cantilever layer) and the cantilever layer 150 (second cantilever layer) in the suspension region D2. The mass 134 comprises the substrate section 416H and the dielectric layer 518 on the lower surface of the cantilever layer 140 (first cantilever layer).

Figure 29A:
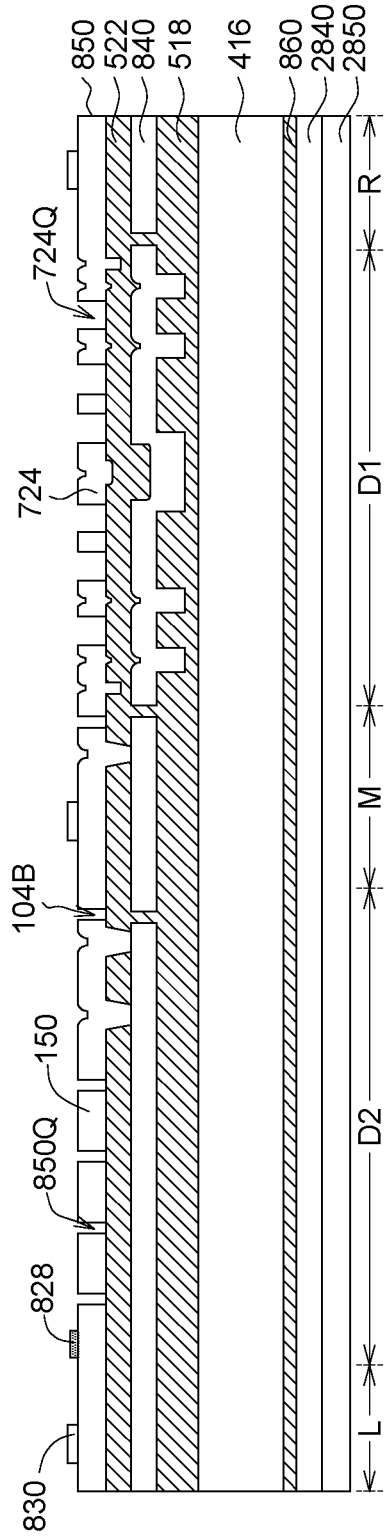

FIG. 29A to FIG. 29G illustrate a manufacturing process flow for the micro-electro-mechanical system acoustic sensor 212 according to an embodiment. In an embodiment, the manufacturing step as shown in FIG. 29A may be performed after the manufacturing step similar to that illustrated with referring to FIG. 28D.

Referring to FIG. 29A, the element layer 850 is patterned to form the through hole in the element layer 850, and form the slit 104B in the cantilever layer 150 of the element layer 850 in the suspension region D2. The element layer 850 formed in the through hole may comprise the acoustic hole 724Q of the back plate 724 in the suspension region D1, and the patterned slit 850Q in the cantilever layer 150 in the suspension region D2.

Figure 29B:
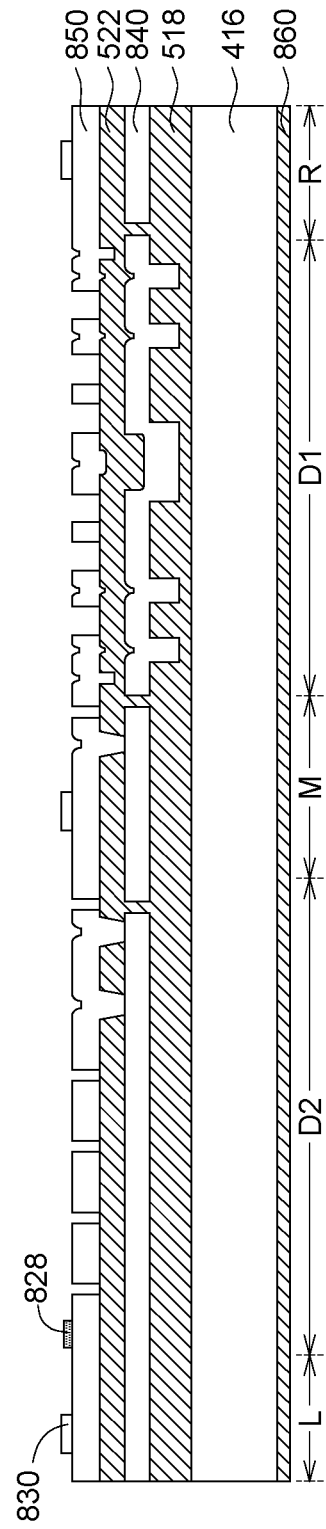

Referring to FIG. 29B, the sacrificial layer 2850 and the sacrificial layer 2840 are removed.

Referring to FIG. 29C, the insulating layer 860 is patterned to form the through opening 860T. The patterned insulating layer 860 comprises the material pattern 860F in the suspension region D2.

Referring to FIG. 29D, the pattern of the insulating layer 860 is transferred into a region of a partial thickness of the substrate 416 from the lower surface of the substrate 416. The patterned substrate 416 comprises the substrate projection portion 416F.

Referring to FIG. 29E, the material pattern 860F is removed, while the insulating layer 860 in the intermediate region M, the support region R and the support region L is remained.

Referring to FIG. 29F, the portion of the substrate 416 not covered by the insulating layer 860 may be removed by an anisotropic etching method along the thickness direction (or the vertical direction), while the substrate section 416H is remained.

Figure 29G:
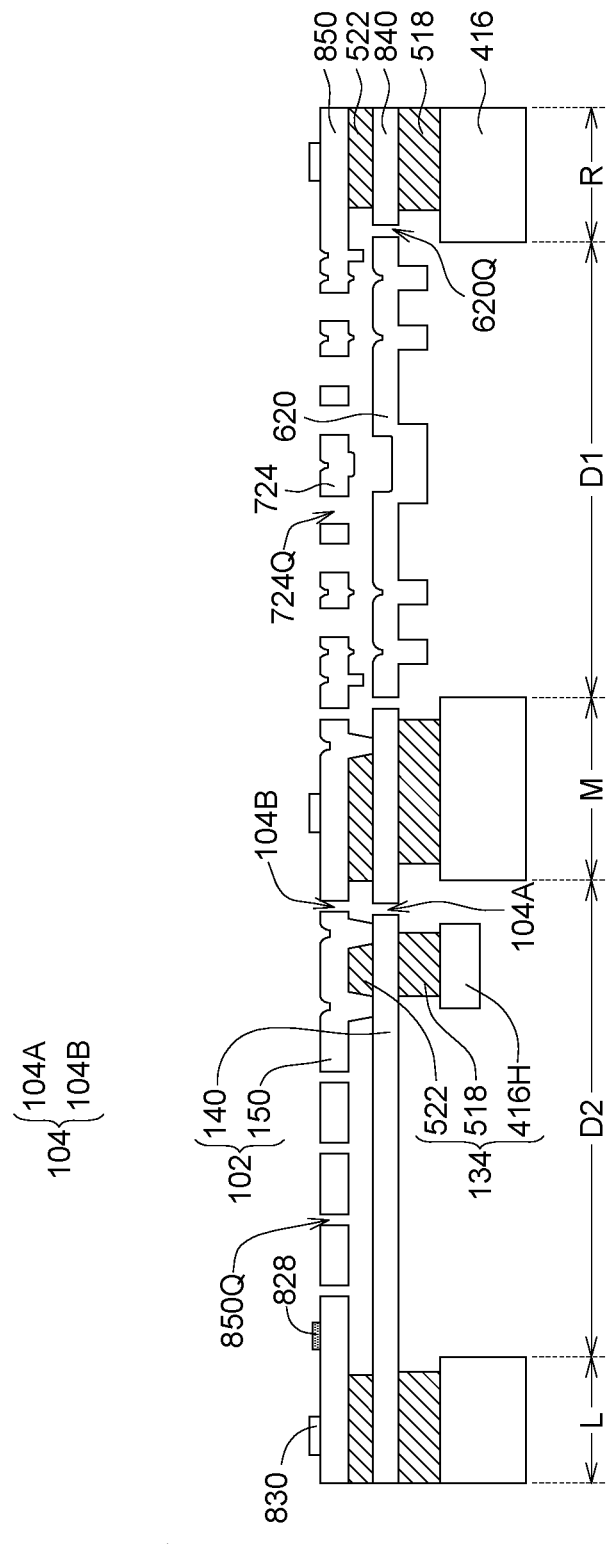

Referring to FIG. 29G, a patterning step may be performed by using a selective etching method to remove the portions of the dielectric layer 518 and the dielectric layer 522 not covered by the substrate 416, and remove the insulating layer 860. The element layer 840 comprises the diaphragm film 620 in the suspension region D1, and the cantilever layer 140 (first cantilever layer) of the cantilever structure 102 in the suspension region D2. The element layer 850 comprises the back plate 724 in the suspension region D1, and the cantilever layer 150 (second cantilever layer) of the cantilever structure 102 in the suspension region D2. The mass 134 comprises the substrate section 416H and the dielectric layer 518 on the lower surface of the cantilever layer 140, and the dielectric layer 522 between the upper surface of the cantilever layer 140 and the lower surface of the cantilever layer 150. The cantilever structure 102 comprises a stiffness adjusting structure. The stiffness adjusting structure comprises the patterned slit 850Q in the cantilever layer 150, which can be used for adjusting the stiffness of the cantilever structure 102.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A micro-electro-mechanical system acoustic sensor, comprising:
   a substrate;
   a cantilever structure formed on the substrate, and comprising a fixed end and a free cantilever portion extended from the fixed end, wherein the free cantilever portion comprises a free end, the free end and the fixed end are at opposing sides of the free cantilever portion, the free cantilever portion is capable of generating a vibration wave in an empty space; and
   a diaphragm sensor formed on the substrate, and comprising:
      a diaphragm film;
      a back plate, wherein the back plate and the diaphragm film have a first empty gap therebetween, wherein the empty space and the first empty gap are communicated to each other, the diaphragm film is adapted to receive the vibration wave generated by the free cantilever portion; and
      at least one electrical contact point electrically connected to the back plate.

2. The micro-electro-mechanical system acoustic sensor according to claim 1, wherein the cantilever structure comprises a fixed portion connected with the free cantilever portion, the cantilever structure has a slit exposed by an outer sidewall surface of the free cantilever portion.

3. The micro-electro-mechanical system acoustic sensor according to claim 2, wherein the slit has an U shape, a ⊓ shape, an arc shape, a geometric shape or a cross shape.

4. The micro-electro-mechanical system acoustic sensor according to claim 1, further comprising a piezoelectric material layer formed on the cantilever structure.

5. The micro-electro-mechanical system acoustic sensor according to claim 1, wherein the cantilever structure further comprises a mass formed above or under the free cantilever portion.

6. The micro-electro-mechanical system acoustic sensor according to claim 1, wherein the cantilever structure further comprises a stiffness adjusting structure.

7. The micro-electro-mechanical system acoustic sensor according to claim 6, wherein the stiffness adjusting structure comprises a through hole and/or an empty gap, the through hole comprises a void, a patterned slit, or a combination thereof.

8. The micro-electro-mechanical system acoustic sensor according to claim 1, wherein the cantilever structure comprises:
   a cantilever layer;
   a first electrode layer on the cantilever layer;
   a piezoelectric material layer on the first electrode layer; and a second electrode layer on the piezoelectric material layer.

9. The micro-electro-mechanical system acoustic sensor according to claim 8, wherein the cantilever layer comprises a dielectric material.

10. The micro-electro-mechanical system acoustic sensor according to claim 1, wherein the cantilever structure comprises:
 a first cantilever layer; and
 a second cantilever layer.

11. The micro-electro-mechanical system acoustic sensor according to claim 10, wherein the cantilever structure comprises an electrode layer formed between the first cantilever layer and the second cantilever layer.

12. The micro-electro-mechanical system acoustic sensor according to claim 10, further comprising:
 a mass on a lower surface of the first cantilever layer; and
 a piezoelectric material layer on an upper surface of the second cantilever layer.

13. The micro-electro-mechanical system acoustic sensor according to claim 12, wherein the cantilever structure comprises a second empty gap formed between the first cantilever layer and the second cantilever layer.

14. The micro-electro-mechanical system acoustic sensor according to claim 1, wherein the cantilever structure and the diaphragm sensor are stacked vertically.

15. The micro-electro-mechanical system acoustic sensor according to claim 14, wherein the micro-electro-mechanical system acoustic sensor further comprises a dimple formed between the cantilever structure and the diaphragm sensor.

16. The micro-electro-mechanical system acoustic sensor according to claim 14, further comprising conductive vias, wherein the cantilever structure, the diaphragm film and the back plate electrically connected to each other by the conductive vias.

17. The micro-electro-mechanical system acoustic sensor according to claim 1, wherein the cantilever structure and the diaphragm sensor are formed on a identical substrate surface.

18. The micro-electro-mechanical system acoustic sensor according to claim 1, further comprising dielectric layers, wherein the cantilever structure, the diaphragm film and the back plate are separated from each other by the dielectric layers.

19. A micro-electro-mechanical system package structure, comprising:
 a carrier plate comprising first electrical contact points and second electrical contact points electrically connected to the first electrical contact points;
 an acoustic sensor control chip electrically connected to the first electrical contact points; and
 the micro-electro-mechanical system acoustic sensor according to claim 1 disposed on the carrier plate, and electrically connected to the acoustic sensor control chip.

20. A manufacturing method for a micro-electro-mechanical system acoustic sensor, comprising:
 forming a cantilever structure on a substrate, wherein the cantilever structure comprises a fixed end and a free cantilever portion extended from the fixed end, wherein the free cantilever portion comprises a free end, the free end and the fixed end are at opposing sides of the free cantilever portion, the free cantilever portion is capable of generating a vibration wave in an empty space; and
 forming a diaphragm sensor on the substrate, wherein the diaphragm sensor comprises:
 a diaphragm film;
 a back plate, wherein the back plate and the diaphragm film have a first empty gap therebetween, wherein the empty space and the first empty gap are communicated to each other, the diaphragm film is adapted to receive the vibration wave generated by the free cantilever portion; and
 at least one electrical contact point electrically connected to the back plate.

\* \* \* \* \*